(12) United States Patent
Matsuura et al.

(10) Patent No.: US 9,459,529 B2
(45) Date of Patent: Oct. 4, 2016

(54) NEGATIVE PHOTOSENSITIVE RESIN COMPOSITION, CURED RESIN FILM, PARTITION WALLS AND OPTICAL ELEMENT

(71) Applicant: ASAHI GLASS COMPANY, LIMITED, Tokyo (JP)

(72) Inventors: Keigo Matsuura, Tokyo (JP); Hideyuki Takahashi, Tokyo (JP); Masayuki Kawashima, Tokyo (JP); Daisuke Kobayashi, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 14/688,366

(22) Filed: Apr. 16, 2015

(65) Prior Publication Data
US 2015/0219992 A1 Aug. 6, 2015

Related U.S. Application Data

(63) Continuation of application No. PCT/JP2013/079310, filed on Oct. 29, 2013.

(30) Foreign Application Priority Data

Oct. 31, 2012 (JP) ................. 2012-239880

(51) Int. Cl.
| | |
|---|---|
| *G03F 7/038* | (2006.01) |
| *G03F 7/075* | (2006.01) |
| *G03F 7/028* | (2006.01) |
| *G03F 7/027* | (2006.01) |
| *G03F 7/004* | (2006.01) |
| *B32B 27/16* | (2006.01) |
| *B32B 27/24* | (2006.01) |
| *B32B 27/26* | (2006.01) |
| *B32B 27/20* | (2006.01) |
| *C08F 290/06* | (2006.01) |
| *G02F 1/1335* | (2006.01) |

(52) U.S. Cl.
CPC ............. *G03F 7/0385* (2013.01); *B32B 27/16* (2013.01); *B32B 27/20* (2013.01); *B32B 27/24* (2013.01); *B32B 27/26* (2013.01); *C08F 290/06* (2013.01); *G02F 1/133516* (2013.01); *G03F 7/0046* (2013.01); *G03F 7/027* (2013.01); *G03F 7/028* (2013.01); *G03F 7/038* (2013.01); *G03F 7/0755* (2013.01); *B32B 2457/20* (2013.01)

(58) Field of Classification Search
None
See application file for complete search history.

(56) References Cited

U.S. PATENT DOCUMENTS

2011/0117333 A1* 5/2011 Furukawa ............. G03F 7/0007
428/195.1

FOREIGN PATENT DOCUMENTS

| JP | 2009-53445 | 3/2009 |
|---|---|---|
| JP | 2010-237545 | 10/2010 |
| WO | WO 2010/013816 A1 | 2/2010 |
| WO | WO 2012/077770 A1 | 6/2012 |
| WO | WO 2012/132755 A1 | 10/2012 |

OTHER PUBLICATIONS

International Search Report issued Feb. 4, 2014 in PCT/JP2013/079310 filed Oct. 29, 2013.
U.S. Appl. No. 14/702,929, filed May 4, 2015, Matsuura et al.

\* cited by examiner

*Primary Examiner* — Sin Lee
(74) *Attorney, Agent, or Firm* — Oblon, McClelland, Maier & Neustadt, L.L.P.

(57) ABSTRACT

To provide a negative photosensitive resin composition which is capable of imparting good ink repellency to a cured film, particularly to the upper surface of partition walls, and which has characteristics such that an ink repellent agent is less likely to remain in opening sections defined by the partition walls even without UV/$O_3$ irradiation treatment, and the ink is permitted to uniformly wet-spread without unevenness. A negative photosensitive resin composition characterized by comprising (A) an alkali-soluble resin or alkali-soluble monomer, which has a photo-curability, (B) a photopolymerization initiator, (C) an ink repellent agent having fluorine atoms, and (D) a compound which is a partially hydrolyzed condensate of a hydrolysable silane compound mixture containing a hydrolysable silane compound having a mercapto group and a hydrolysable group and/or a hydrolysable silane compound having a group with an ethylenic double bond and a hydrolysable group, and which has no fluorine atom.

12 Claims, 6 Drawing Sheets

NEGATIVE PHOTOSENSITIVE RESIN COMPOSITION, CURED RESIN FILM, PARTITION WALLS AND OPTICAL ELEMENT

TECHNICAL FIELD

The present invention relates to a negative photosensitive resin composition, a cured resin film, partition walls and an optical element.

BACKGROUND ART

In the production of an optical element such as an organic EL (Electro-Luminescence) element, a method of pattern printing an organic layer such as a luminescent layer in the form of dots by an ink jet (IJ) method, may be employed. In such a method, partition walls are formed along the profiles of dots to be formed, and an ink containing the material for an organic layer is injected into compartments (hereinafter referred to also as opening sections) defined by the partition walls, followed by e.g. drying and/or heating, to form dots in a desired pattern.

In the above method, in order to prevent mixing of the ink between the adjacent dots and in order to uniformly apply the ink in forming the dots, the upper surface of the partition walls is required to have ink repellency, while the opening sections for forming dots as defined by the partition walls including the side surfaces of the partition walls are required to have ink-philicity. In order to obtain partition walls having ink repellency on the upper surface, for example, a method has been known to form partition walls corresponding to the pattern of dots by photolithography employing a photosensitive composition containing an ink repellent agent which migrates to the upper surface during the production.

In this method, a residue of the photosensitive resin composition containing the ink repellent agent tends to remain in the opening sections after development, and a problem remains such that by such a residue, the ink-philicity of the opening sections cannot be secured. Therefore, usually, removal of the development residue from the opening sections is carried out, for example, by applying UV (ultraviolet ray)/$O_3$ (ozone) irradiation treatment to the entire surface of the substrate before injection of the ink. However, in the UV/$O_3$ irradiation treatment, at the same time as removal of the development residue from the opening sections, the upper surface of the partition walls is likely to be removed, whereby it has been difficult to satisfy both the ink-philicity of the opening sections and the ink repellency on the upper surface of the partition walls.

Therefore, in order to satisfy both of such requirements, Patent Document 1 discloses a negative photosensitive resin composition containing a silicone-type ink repellent agent made of a hydrolyzed condensate of a fluorinated hydrolysable silane compound, which has a sufficiently small surface free energy and whereby partition walls to be formed will have sufficient ink repellency on the upper surface and the ink repellency will be well maintained even via the UV/$O_3$ irradiation treatment.

PRIOR ART DOCUMENT

Patent Document

Patent Document 1: WO2010/013816

DISCLOSURE OF INVENTION

Technical Problem

However, with the photosensitive resin composition disclosed in Patent Document 1, UV/$O_3$ irradiation treatment is prerequisite, and in order to simplify the production process, a photosensitive composition has been desired which is capable of forming opening sections having excellent ink-philicity even without UV/$O_3$ irradiation treatment.

The present invention has an object to provide a negative photosensitive resin composition which is capable of imparting good ink repellency to a cured resin film, particularly to the upper surface of partition walls, and whereby an ink repellent agent is less likely to remain in opening sections defined by the partition walls even without UV/$O_3$ irradiation treatment, and it is possible to let the ink uniformly wet-spread without unevenness and to secure good adhesion to the substrate on which such a cured resin film or partition walls are formed.

The present invention has an object to provide a cured resin film and partition walls which have good ink repellency on the upper surface and which are excellent in adhesion to the substrate.

The present invention has an object to provide an optical element having dots which are formed with good precision, since the ink is permitted to uniformly wet-spread without unevenness in opening sections partitioned by partition walls excellent in adhesion to the substrate.

Solution to Problem

The present invention provides a cured resin film, a negative photosensitive resin composition, partition walls and an optical element, having the following constructions [1] to [12].

[1] A cured resin film formed on a substrate and characterized in that in a composition analysis by an X-ray photoelectron spectroscopy (XPS), the ratio of the concentration of fluorine atoms to the concentration of carbon atoms at the surface of the cured resin film i.e. [F/C] is at least 0.1, in a mass analysis in the thickness direction of the cured resin film by a time-of-flight secondary ion mass spectrometry (TOF-SIMS) using Ar cluster as sputtering ions, the intensity profile of $Si_2O_5H^-$ has the maximum value in intensity in the interfacial region to the substrate as defined in the following (2) in the thickness range excluding the surface region of the cured resin film as defined in the following (1), and the ratio of the above maximum value in intensity to the minimum value in intensity in the thickness range excluding the above surface region and the above interfacial region i.e.

[maximum value of $Si_2O_5H^-$/minimum value of $Si_2O_5H^-$] is more than 1 and at most 10, and in the above mass analysis, the ratio of the average value in intensity of $Si_2O_5H^-$ to the average value in intensity of $C^-$ in the thickness range excluding the surface region of the above cured resin film and the interfacial region to the above substrate i.e.

[average value of $Si_2O_5H^-$/average value of $C^-$] is at least 0.001:

(1) the surface region of the above cured resin film is a region beginning at the surface of the above cured resin film and extending to a 100 nm position towards the substrate side from said surface, (2) the interfacial region of the above cured resin film to the above substrate is a region beginning at the position from the above cured resin film surface, of the rising start point of intensity of secondary ions of the main component or a specific component of the above substrate and extending to the position from the above cured resin film surface, of the rising terminal point of intensity of secondary ions of the main component or a specific component of the above substrate, in the mass analysis in the thickness direction in TOF-SIMS.

[2] A negative photosensitive resin composition characterized by comprising (A) an alkali-soluble resin or alkali-soluble monomer, which has a photo-curability, (B) a photopolymerization initiator, (C) an ink repellent agent having fluorine atoms, and (D) a compound which is a partially hydrolyzed condensate of a hydrolysable silane compound mixture (M1) containing a hydrolysable silane compound having a mercapto group and a hydrolysable group and/or a hydrolysable silane compound having a group with an ethylenic double bond and a hydrolysable group, and which contains no fluorine atom.

[3] The negative photosensitive resin composition according to [2], wherein the content of fluorine atoms in the ink repellent agent (C) is from 1 to 40 mass %.

[4] The negative photosensitive resin composition according to [2] or [3], wherein the ink repellent agent (C) is a partially hydrolyzed condensate of a hydrolysable silane compound mixture (M2) containing a hydrolysable silane compound having a fluoroalkylene group and/or a fluoroalkyl group and a hydrolysable group.

[5] The negative photosensitive resin composition according to [4], wherein the hydrolysable silane compound mixture (M2) contains a hydrolysable silane compound having four hydrolysable groups bonded to silicon atoms.

[6] The negative photosensitive resin composition according to any one of [2] to [5], which further contains a cross-linking agent (E) having at least 2 ethylenic double bonds per molecule and having no acidic group.

[7] The negative photosensitive resin composition according to any one of [2] to [6], which further contains a solvent (F).

[8] A cured resin film characterized in that it is formed by using the negative photosensitive resin composition as defined in any one of [2] to [7].

[9] The cured resin film according to [8] formed on a substrate and characterized in that in a composition analysis by an X-ray photoelectron spectroscopy (XPS), the ratio of the concentration of fluorine atoms to the concentration of carbon atoms at the surface of the cured resin film i.e. [F/C] is at least 0.1, in a mass analysis in the thickness direction of the cured resin film by a time-of-flight secondary ion mass spectrometry (TOF-SIMS) using Ar cluster as sputtering ions, the intensity profile of $Si_2O_5H^-$ has the maximum value in intensity in the interfacial region to the substrate as defined in the following (2) in the thickness range excluding the surface region of the cured resin film as defined in the following (1), and the ratio of the above maximum value in intensity to the minimum value in intensity in the thickness range excluding the above surface region and the above interfacial region i.e. [maximum value of $Si_2O_5H^-$/minimum value of $Si_2O_5H^-$] is more than 1 and at most 10, and in the above mass analysis, the ratio of the average value in intensity of $Si_2O_5H^-$ to the average value in intensity of $C^-$ in the thickness range excluding the surface region of the above cured resin film and the interfacial region to the above substrate i.e. [average value of $Si_2O_5H^-$/average value of $C^-$] is at least 0.001:

(1) the surface region of the above cured resin film is a region beginning at the surface of the above cured resin film and extending to a 100 nm position towards the substrate side from said surface, (2) the interfacial region of the above cured resin film to the above substrate is a region beginning at the position from the above cured resin film surface, of the rising start point of intensity of secondary ions of the main component or a specific component of the above substrate and extending to the position from the above cured resin film surface, of the rising terminal point of intensity of secondary ions of the main component or a specific component of the above substrate, in the mass analysis in the thickness direction in TOF-SIMS.

[10] Partition walls formed to partition a substrate surface into a plurality of compartments for forming dots and characterized by being made of the cured resin film as defined in [1], [8] or [9].

[11] An optical element having partition walls located between a plurality of dots and their adjacent dots on a substrate surface and characterized in that said partition walls are formed of the partition walls as defined in [10].

[12] The optical element according to [11], wherein the dots are formed by an ink jet method.

Advantageous Effects of Invention

The negative photosensitive resin composition of the present invention is capable of imparting good ink repellency to a cured resin film, particularly to the upper surface of partition walls, and capable of making an ink repellent agent less likely to remain in opening sections defined by the partition walls even without $UV/O_3$ irradiation treatment, and letting the ink uniformly wet-spread without unevenness. Further, it is capable of imparting, to the obtainable cured resin film, particularly to partition walls, good adhesion to the substrate on which such a cured resin film or partition walls are formed.

The cured resin film and partition walls of the present invention have good ink repellency on the upper surface and are excellent in adhesion to the substrate.

The optical element of the present invention is an optical element having dots which are formed with good precision, since the ink is permitted to uniformly wet-spread without unevenness in opening sections partitioned by partition walls excellent in adhesion to the substrate.

DESCRIPTION OF EMBODIMENTS

Figure 1:
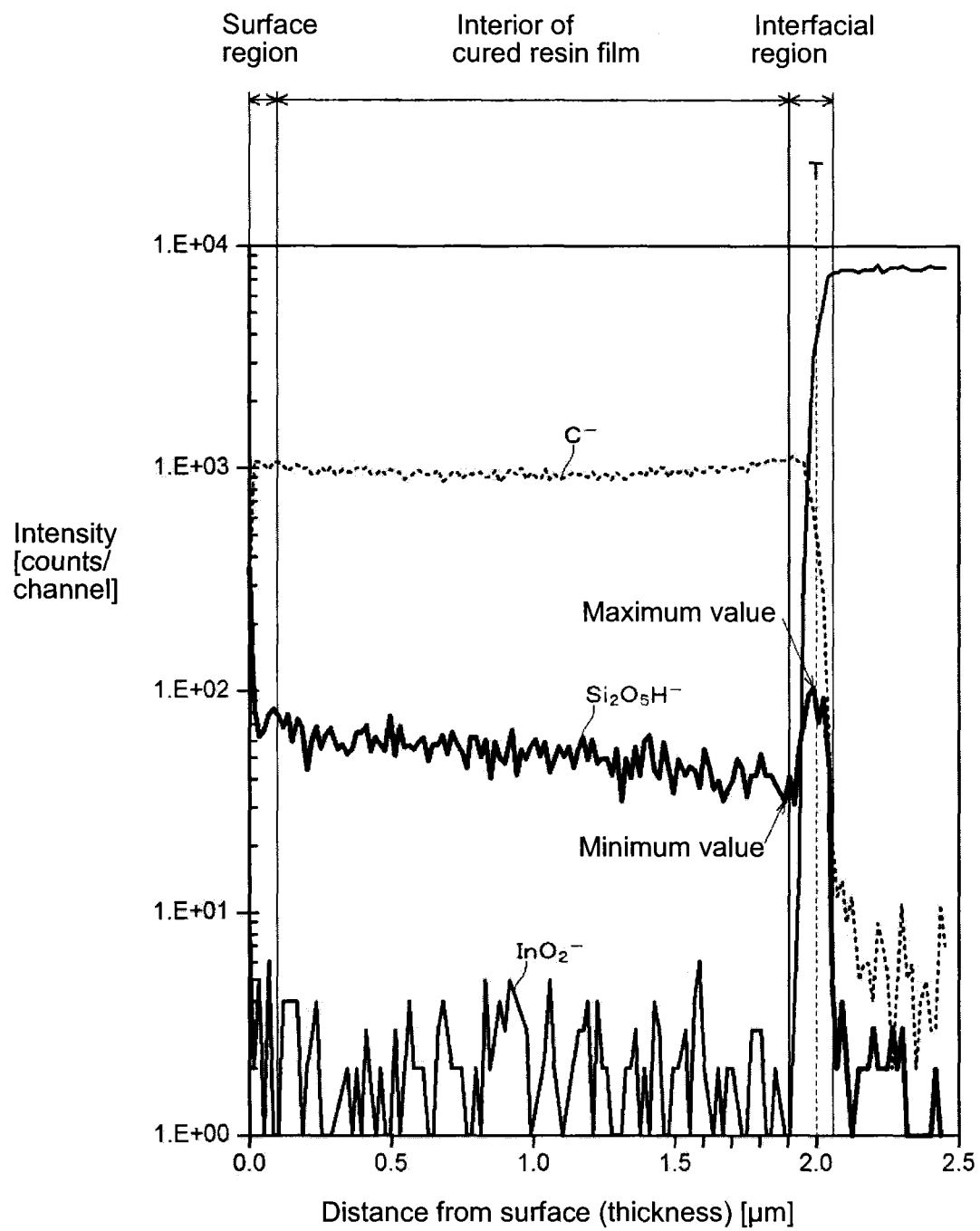
FIG. 1 is a chart showing the results of a mass analysis in the thickness direction by TOF-SIMS, of a cured resin film in an Example of the present invention.

In this specification, a "(meth)acryloyl group" is a general term for a "methacyloyl group" and an "acryloyl group". The same applies to a (meth)acryloyloxy group, (meth) acrylic acid, a (meth)acrylate, a (meth)acrylamide and a (meth)acrylic resin.

In this specification, a group represented by the formula (x) may sometimes be referred to simply as a group (x).

In this specification, a compound represented by the formula (y) may sometimes be referred to simply as a compound (y).

Here, the formula (x) and the formula (y) represent optional formulae.

In this specification, a "side chain" is a group other than a hydrogen or halogen atom, bonded to a carbon atom constituting a main chain in a polymer wherein repeating units constitute the main chain.

In this specification, "the total solid content in the photosensitive resin composition" is meant for components to form a cured film described later, among components contained in the photosensitive resin composition and is obtained from a residue remaining after heating the photosensitive resin composition at 140° C. for 24 hours to remove any solvent. Here, the total solid content amount may also be calculated from the charged amounts.

In this specification, a film made of a cured product of a composition containing a resin as the main component, is referred to as a "cured resin film".

In this specification, a film formed by coating with a photosensitive resin composition is referred to as a "coating film" and a film formed by drying it, is referred to as a "dried film". A film obtainable by curing such a "dried film" is a "cured resin film". Further, in this specification, a "cured resin film" may sometimes be referred to simply as a "cured film".

The cured resin film may be in the form of partition walls formed to partition a prescribed region into a plurality of compartments. Into the compartments partitioned by the partition walls i.e. opening sections surrounded by the partition walls, for example, the following "ink" is injected to form "dots".

In this specification, an "ink" is a general term for a liquid having optical and/or electrical functions after being dried, cured, etc.

In optical elements such as an organic EL element, a color filter for liquid crystal element and an organic TFT (Thin Film Transistor) array, dots as various constituent elements may be pattern-printed by an ink jet (IJ) method using inks to form such dots. The "ink" in this specification includes inks to be used in such applications.

In this specification, "ink repellency" is a nature to repel such an ink and has both water repellency and oil repellency. The ink repellency may be evaluated, for example, by a contact angle when an ink is dropped. Whereas, "ink-philicity" is a nature opposite to ink repellency and may be evaluated by a contact angle when an ink is dropped, in the same manner as in the case of ink repellency. Otherwise, ink-philicity may be evaluated by evaluating, by prescribed standards, the degree of wet spreading of ink (wet spreadability of ink) when the ink is dropped.

In this specification, a "dot" represents an optically modulatable minimum region in an optical element. In optical elements such as an organic EL element, a color filter for liquid crystal element and an organic TFT array, in the case of black and white presentation, 1 dot=1 pixel, and in the case of colored presentation, e.g. 3 dots (R (red), G (green) and B (blue))=1 pixel.

Now, embodiments of the present invention will be described. In this specification, % represents mass % unless otherwise specified.

[Cured Resin Film in First Embodiment]

The cured resin film in the first embodiment of the present invention is a cured resin film formed on a substrate and having the following characteristics (I) to (III):

(I) In a composition analysis by XPS (X-ray photoelectron spectroscopy), the ratio of the concentration of fluorine atoms to the concentration of carbon atoms at the surface of the cured resin film i.e. [F/C] is at least 0.1.

(II) In a mass analysis in the thickness direction of the cured resin film by TOF-SIMS (time-of-flight secondary ion mass spectrometry) using Ar cluster as sputtering ions, the intensity profile of $Si_2O_5H^-$ has the maximum value in intensity in the interfacial region to the substrate as defined in the following (2) in the thickness range excluding the surface region of the cured resin film as defined in the following (1), and the ratio of the above maximum value in intensity to the minimum value in intensity in the thickness range excluding the above surface region and the above interfacial region i.e. [maximum value of $Si_2O_5H^-$/minimum value of $Si_2O_5H^-$] is more than 1 and at most 10.

(III) In the above mass analysis by TOF-SIMS, the ratio of the average value in intensity of $Si_2O_5H^-$ to the average value in intensity of $C^-$ in the thickness range excluding the surface region of the above cured resin film and the interfacial region to the above substrate i.e. [average value of $Si_2O_5H^-$/average value of $C^-$] is at least 0.001.

(1) The surface region of the above cured resin film is a region beginning at the surface of the above cured resin film and extending to a 100 nm position towards the substrate side from said surface.

(2) The interfacial region of the above cured resin film to the above substrate is a region beginning at the position from the above cured resin film surface, of the rising start point of intensity of secondary ions of the main component or a specific component of the above substrate and extending to the position from the above cured resin film surface, of the rising terminal point of intensity of secondary ions of the main component or a specific component of the above substrate, in the mass analysis in the thickness direction in TOF-SIMS (hereinafter sometimes referred to simply as an "interfacial region").

Further, in this specification, the "surface" of a cured resin film is the main surface on the side opposite to the substrate side of the cured resin film. In this specification, the "upper surface" of partition walls or a cured resin film has the same meaning as such a surface.

With respect to the film composition, the cured resin film of the present invention has the characteristic (I) as a characteristic of the surface and the characteristic (II) as a characteristic in the interfacial region to the substrate, and it also has the characteristic (III) in the region (hereinafter referred to also as the "interior of the cured resin film") excluding the above surface region of the cured resin film and the interfacial region. By virtue of such characteristics of its composition, the cured resin film of the present invention is excellent in liquid repellency on the surface and also excellent in adhesion at the interface to the substrate.

So long as the cured resin film of the present invention has characteristics corresponding to (I) to (Ill) respectively in the surface, the interfacial region and the interior, as mentioned above, the film thickness is not particularly limited. The film thickness of the cured resin film may suitably be selected depending upon the particular application, and is preferably from 0.2 to 50 μm, particularly preferably from 0.2 to 10 μm.

(I) Surface Characteristic

The cured resin film of the present invention is characterized in that at its surface, the ratio of the concentration of fluorine atoms to the concentration of carbon atoms in a composition analysis by XPS i.e. [F/C] (hereinafter sometimes referred to simply as [F/C]) is at least 0.1.

When [F/C] at the surface of the cured resin film obtained by the composition analysis by XPS is at least 0.1, sufficient liquid repellency will be exhibited on the surface of the cured resin film. That is, if [F/C] at the surface of the cured resin film is less than 0.1, the amount of F is insufficient, and liquid repellency will not be exhibited. [F/C] at the surface of the cured resin film is more preferably at least 0.12, most preferably at least 0.15.

The upper limit for [F/C] at the surface of the cured resin film is not particularly limited. However, [F/C] is preferably at most 3, since if the concentration of F at the cured resin film surface is too high, the curability of the surface deteriorates.

For the XPS analysis of the surface of the cured resin film, a common method may be used. For example, the following conditions may be mentioned as conditions for carrying out the XPS analysis of the surface of a cured resin film by means of Quantera-SXM manufactured by Ulvac-Phi, Inc., as an apparatus. However, the method is not limited thereto.

(Analytical Conditions)
X-ray source: Al Kα
X-ray beam size: about 20 μm in diameter
Measurement area: about 20 μm in diameter
Detection angle: 45° from the sample surface
Measured peaks: F1s, C1s
Measurement time (as acquired time): within 5 minutes
Pass energy: 224 eV
Analytical software: MultiPak In the above XPS analysis, in a case where the width of the cured resin film is narrower than the beam size (about 20 μm in diameter), the composition analysis of the surface of the cured resin film is possible by further narrowing the beam size.

(II) Characteristic in the Interfacial Region to the Substrate

The cured resin film of the present invention is characterized in that in a mass analysis in the thickness direction of the above cured resin film by TOF-SIMS, the intensity profile of $Si_2O_5H^-$ has the maximum value in intensity (hereinafter, this value is referred to as "the maximum value of $Si_2O_5H^-$") in the interfacial region to the substrate in the thickness range excluding the surface region of the above cured resin film. Further, the ratio of the above maximum value in intensity to the minimum value in intensity (hereinafter, this value is referred to as "the minimum value of $Si_2O_5H^-$") in the thickness range excluding the above surface region and the above interfacial region i.e. [maximum value of $Si_2O_5H^-$/minimum value of $Si_2O_5H^-$] is more than 1 and at most 10.

Figure 2:
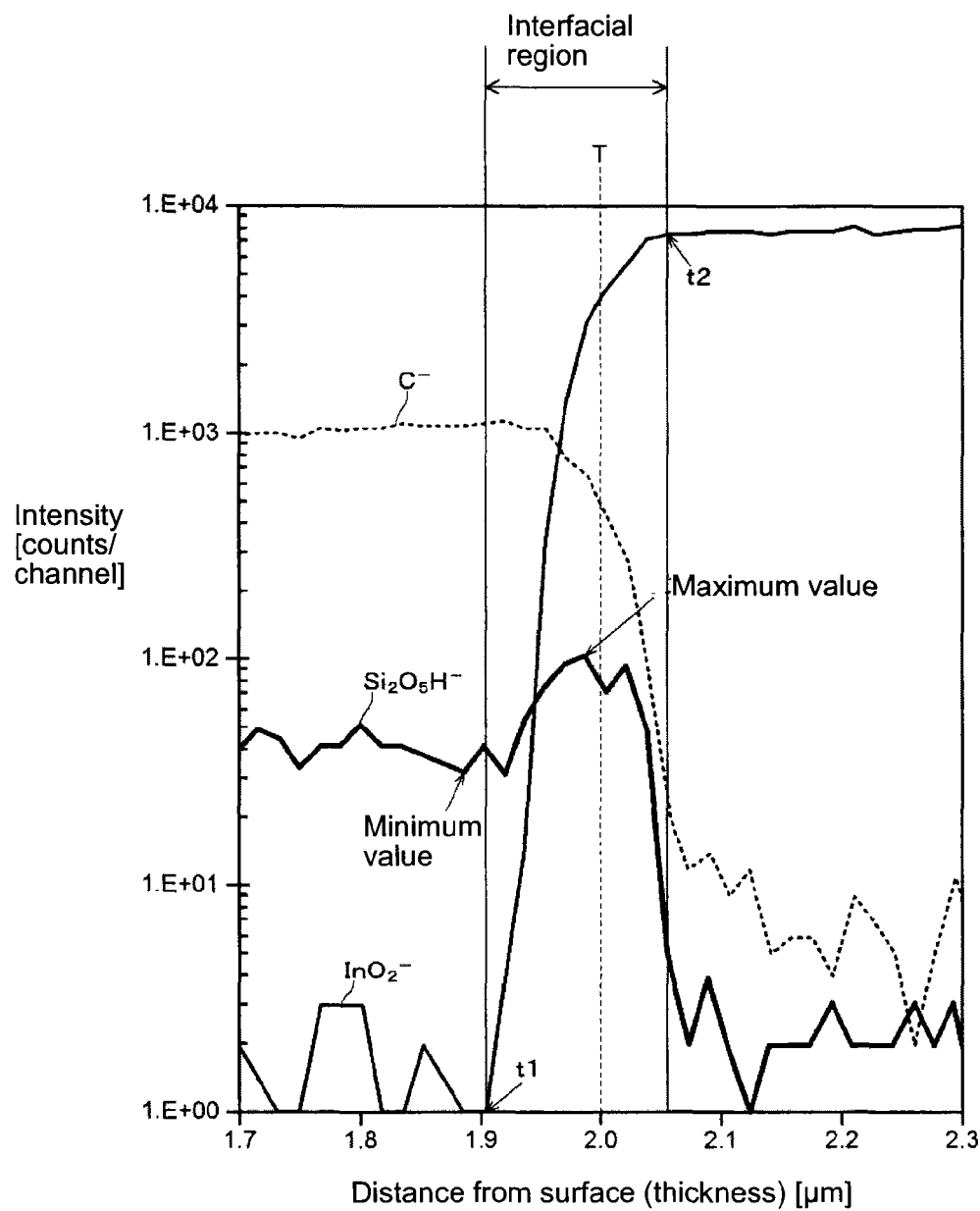
FIG. 2 is a chart showing, as enlarged, the vicinity of the interface between the cured resin film and the substrate in the analytical results in FIG. 1.

Here, the mass analysis in the thickness direction of the cured resin film by TOF-SIMS will be described with reference to a specific example. However, the cured resin film is by no means limited thereto. FIG. 1 shows the results of a mass analysis in the thickness direction of a film by TOF-SIMS, in an example of the cured resin film of the present invention. Further, FIG. 2 shows a chart wherein in the analytical results of FIG. 1, the vicinity of the interface between the cured resin film and the substrate is enlarged.

FIG. 1 shows the analytical results, with respect to partition walls B made of a cured resin film obtained in Ex. 1 in the after-described Examples, by TOF-SIMS in the case of using TOF. SIMS5 manufactured by ION-TOF, as an apparatus, and Ar cluster, as sputtering ions, and the analytical conditions at that time were as shown below.

(TOF-SIMS Analytical Conditions)
Primary ion species: $Bi_3^{++}$
Accelerating voltage for primary ions: 25 kV
Current value of primary ions: 0.2 pA (@10 kHz)
Raster size of primary ions: 150×150 μm$^2$
Bunching of primary ions: yes
Sputtering ion species: Ar cluster (about $Ar_{1500}$)
Accelerating voltage for sputtering ions: 10 kV
Current value of sputtering ions: 8.5 nA (@10 kHz)
Raster size of sputtering ions: 450×450 μm$^2$
Mass number of $C^-$ secondary ions: 12
Mass number of $Si_2O_5H^-$ secondary ions: 137
Mass number of $InO_2^-$ secondary ions: 147
Plot spacing of the profile in depth direction: Plotting at 8 or more points within the region of the interfacial region Here, in the above TOF-SIMS analysis, in a case where the width of the cured resin film is narrower than the raster size (150×150 μm$^2$) of primary ions, it is possible to obtain the profile in the thickness direction of the cured resin film, either by selectively taking out a portion of the cured resin film by an image analysis, or reducing the raster size of primary ions. Further, the plot spacing of the profile in depth direction is set to be 8 or more points within the region of the interfacial region, and plotting is preferably made at 10 or more points. In a case where it is not possible to conduct plotting at 8 or more points under an optional condition, the raster size of sputtering ions may be finely adjusted to secure an analytical condition where plotting at 8 or more points becomes possible.

The abscissa of the profile in thickness direction of the cured resin film obtainable by the above TOF-SIMS analysis is usually given as the sputtering time. As a method for converting the sputtering time to the distance (thickness) from the surface as shown on the abscissa in FIG. 1 and FIG. 2, a method for conversion by using the preliminarily measured thickness (film thickness) of the cured resin film and the sputtering time from the surface of the cured resin film to the interface between the cured resin film and the substrate, as defined by the following method, may be mentioned. The method for measuring the film thickness of the cured resin film is not particularly limited. For example, the film thickness may be measured by an electron microscopic observation of the cross-section of the cured resin film.

In the case of a sample used here (partition walls B made of a cured resin film obtained in Ex. 1 in Examples), the film thickness of the cured resin film was found to be 2.0 µm by the measurement by means of a laser microscope (apparatus name: VK-8500, manufactured by KEYENCE CORPORATION) as described later, and the time was converted to the distance by such a film thickness and the sputtering time from the surface of the cured resin film to the interface between the cured resin film and the substrate as defined below.

Further, as a method for converting the sputtering time to the distance, there may, for example, be a method wherein taking of the profile is interrupted during the measurement of the cured resin film, and the depths of obtained analyzed craters are measured by a contact-type thickness meter, whereby the sputtering rate for the cured resin film is preliminarily calculated.

Now, the interfacial region defined by the above (2) will be explained with reference to FIG. 1 and FIG. 2. FIG. 1 and FIG. 2 show three types of intensity profiles i.e. the intensity profile of $C^-$ secondary ions (shown by a dotted line in FIG. 1 and FIG. 2), the intensity profile of $Si_2O_5H^-$ secondary ions (shown by a thick solid line in FIG. 1 and FIG. 2) and the intensity profile of $InO_2^-$ secondary ions (shown by a thin solid line in FIG. 1 and FIG. 2), in thickness direction of the cured resin film analyzed by TOF-SIMS. Here, with respect to other secondary ions in the cured resin film, the description is omitted.

In FIG. 1, the abscissa represents the distance (thickness) from the surface, whereby the position of thickness "0" is the surface of the cured resin film, and the thickness of from 0 to 0.1 µm (100 nm) is the surface region. Carbon atoms as the main constituent of the cured resin film are analyzed as $C^-$ secondary ions. Further, in the case of Ex. 1 in Examples, a light-transmitting electrode made of a tin-doped indium oxide (ITO) film is formed on the surface on the substrate side, whereby the main constituent on the substrate side is analyzed as $InO_2^-$ secondary ions.

As shown in FIG. 2, the interfacial region between the cured resin film and the substrate is meant for a region from the rising start point (shown by t1 in FIG. 2) to the rising terminal point (shown by t2 in FIG. 2), of the intensity profile of $InO_2^-$ as secondary ions of the main component of the substrate. Further, the intensity of $InO_2$ at t1 is represented by $I_{t1}$, the intensity of $InO_2^-$ at t2 is represented by $I_{t2}$, and the point within the interfacial region where the intensity becomes $(I_{t2}-I_{t1})/2$, is taken as the interface (shown by T in FIG. 2). The distance (2.0 µm in FIG. 2) from the cured resin film surface to this interface is taken as the film thickness. Further, the interfacial region is a region wherein the magnitude relationship in intensity completely switches between $C^-$ secondary ions as the main component of the cured resin film and $InO_2^-$ secondary ions as the main component of the substrate surface.

Here, the intensity profile of secondary ions on the substrate side by TOF-SIMS to be used for defining the interfacial region, is not limited to the intensity profile of secondary ions of the main component constituting the substrate. For example, in a case where the main component constituting the substrate is a component contained in the cured resin film, a specific component other than the main component is used to obtain the intensity profile of secondary ions on the substrate side. Such a specific component is preferably one which is a component not contained in the cured resin film and of which the secondary ion intensity by TOF-SIMS is at least a certain value at the above rising terminal point.

In the cured resin film of which analytical results by TOF-SIMS are shown in FIG. 1 and FIG. 2, the intensity profile of $Si_2O_5H^-$ shown by a solid line in each Fig. has the maximum value in intensity (maximum value of $Si_2O_5H^-$, analytical value=103 [counts/channel]) in the interfacial region to the substrate in the thickness range excluding the surface region of the cured resin film. Further, the minimum value in intensity (minimum value of $Si_2O_5H^-$) in the thickness range excluding the surface region and the interfacial region (in the interior of the cured resin film) is detected as an analytical value of 32 [counts/channel] at a distance of 1.89 µm from the surface. Here, the ratio of the maximum value of $Si_2O_5H^-$ to the minimum value of $Si_2O_5H^-$ i.e. [maximum value of $Si_2O_5H^-$/minimum value of $Si_2O_5H^-$] becomes 3.2.

In the cured resin film of the present invention, the above [maximum value of $Si_2O_5H^-$/minimum value of $Si_2O_5H^-$] is more than 1 and at most 10. Here, the intensity of $Si_2O_5H^-$ by TOF-SIMS is used as an index showing the abundance of the component containing Si atoms (hereinafter sometimes referred to also as the Si component) in the cured resin film.

Figure 3:
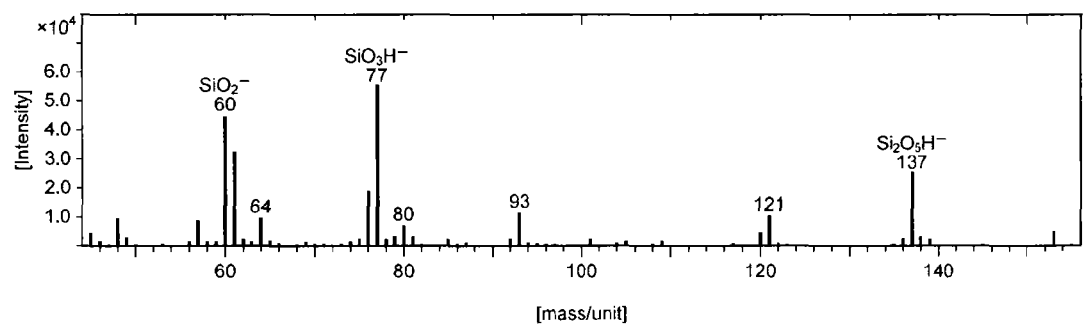
FIG. 3 is a chart showing the results of a mass analysis by TOF-SIMS, of one example of the compound (D) to be used in the present invention.

For example, the negative photosensitive resin composition of the present invention which will be described below, contains a compound (D) which is a partially hydrolyzed condensate of a hydrolysable silane compound mixture (M1) containing a hydrolysable silane compound having a mercapto group and a hydrolysable group and/or a hydrolysable silane compound having a group with an ethylenic double bond and a hydrolysable group, and which has no fluorine atom. Analytical results by TOF-SIMS of compound (D-1) in Examples as an example of this compound (D) are shown in FIG. 3. In FIG. 3, together with other Si component peaks, a peak of $Si_2O_5H^-$ is observed at 137. It is considered that $Si_2O_5H^-$ can be regarded as the representative of Si component peaks derived from a partially hydrolyzed condensate of a hydrolysable silane compound mixture like e.g. the compound (D), and thus, is used as an index showing a composition characteristic of the cured resin film of the present invention.

When [maximum value of $Si_2O_5H^-$/minimum value of $Si_2O_5H^-$] is within the above-mentioned range by the above analysis by TOF-SIMS, in the cured resin film, the Si component in the interfacial region to the substrate and the Si component in the interior of the cured resin film are considered to be properly present, so that the adhesion between the cured resin film and the substrate surface becomes stronger.

If [maximum value of $Si_2O_5H^-$/minimum value of $Si_2O_5H^-$] is 1 or less, the adhesion between the cured resin film and the substrate surface deteriorates. For example, in a case where the cured resin film is partition walls prepared by using a photosensitive resin composition, as the adhesion deteriorates, peeling during the development or deterioration in resolution is likely to occur. On the other hand, if [maximum value of $Si_2O_5H^-$/minimum value of $Si_2O_5H^-$] exceeds 10, agglomeration of the Si component tends to be excessive in the interfacial region of the cured resin film to the substrate, whereby cohesion failure is considered to take place. For example, in a case where the cured resin film is the above partition walls, peeling during the development or deterioration in resolution is likely to occur just like in the case where [maximum value of $Si_2O_5H^-$/minimum value of $Si_2O_5H^-$] is 1 or less.

The [maximum value of $Si_2O_5H^-$/minimum value of $Si_2O_5H^-$] is preferably from 1.1 to 10, particularly preferably from 1.1 to 8.

(III) Characteristic in the Interior of the Cured Resin Film

In the cured resin film of the present invention, in the above mass analysis by TOF-SIMS, the ratio of the average value in intensity of $Si_2O_5H^-$ to the average value in intensity of $C^-$ in the thickness range excluding the surface region of the cured resin film and the interfacial region to the substrate i.e. in the interior of the cured resin film, i.e. [average value of $Si_2O_5H^-$/average value of $C^-$], is at least 0.001.

In the same manner as for the characteristic in the interfacial region to the substrate in the above (II), the characteristic in the interior of the cured resin film will be described with reference to FIG. 1. As mentioned above, carbon atoms as the main constituent of the cured resin film are analyzed as $C^-$ secondary ions. From FIG. 1, it is evident that the intensity profile of $C^-$ in the interior of the cured resin film takes a substantially constant value at a high level. Therefore, in the present invention, the abundance of the Si component represented by the intensity profile of $Si_2O_5H^-$ in the interior of the cured resin film is to be shown by the ratio to the intensity profile of $C^-$, i.e. the above [average value of $Si_2O_5H^-$/average value of $C^-$].

When [average value of $Si_2O_5H^-$/average value of $C^-$] in the interior of the cured resin film is at least 0.001, the Si component is properly present in the interior of the cured resin film. On the assumption that the condition for the characteristic in the interfacial region to the substrate in the above (II) is satisfied, when [average value of $Si_2O_5H^-$/average value of $C^-$] in the interior of the cured resin film is at least 0.001, the adhesion to the substrate can be sufficiently secured. If [average value of $Si_2O_5H^-$/average value of $C^-$] in the interior of the cured resin film is less than 0.001, the adhesion to the substrate tends to be inadequate. For example, in a case where the cured resin film is partition walls prepared by using a photosensitive resin composition, as the above adhesion decreases, peeling during the development or deterioration in resolution is likely to occur. The [average value of $Si_2O_5H^-$/average value of $C^-$] in the interior of the cured resin film is preferably at least 0.005, particularly preferably at least 0.01.

The upper limit for [average value of $Si_2O_5H^-$/average value of $C^-$] in the interior of the cured resin film is not particularly limited. However, from the viewpoint of solvent resistance and acid resistance, [average value of $Si_2O_5H^-$/average value of $C^-$] is preferably at most 0.2.

Further, for example, in a case where a cured resin film disposed inside of a device, is to be analyzed by the above XPS and TOF-SIMS, it is necessary to expose the cured resin film from the device. Now, an example of the method for exposing the surface of a cured resin film disposed inside of a device will be described, but the exposing method is not limited to the following one.

As a method for exposing the surface of a cured resin film disposed inside of a device, for example, Surface And Interfacial Cutting Analysis System (hereinafter referred to as SAICAS) may be mentioned. As an exposing method using SAICAS, for example, in a case where the device is an organic EL display, it is possible to expose the surface of partition walls by removing a cover glass and cutting an exposed laminate including a luminescent layer and partition walls (a cured resin film) as a whole obliquely to the depth direction.

Likewise, in a case where the device is an organic EL display, as an exposing method using XPS or TOF-SIMS, it is possible to expose the surface of partition walls by removing a thin film at the top of partition walls (a cured resin film) by using a sputtering gun for argon, cesium, oxygen, gallium, gold, etc. which is built-in in the apparatus.

Further, as an exposing method using chemical etching, in a case where the device is an organic EL display, it is possible to expose the surface of partition walls by a method of dissolving one or both of electrodes sandwiching partition walls (a cured resin film) by an acid or alkali to form a space above and/or below the partition walls and peeling the laminate.

The cured resin film of the present invention is a cured resin film formed on a substrate and is not particularly limited so long as it is one having the above composition characteristics (I) to (III) by analyses by means of XPS and TOF-SIMS. The cured resin film of the present invention having such characteristics may be formed on a substrate, for example, by using a negative photosensitive resin composition of the present invention which will be described below.

[Negative Photosensitive Resin Composition]

The negative photosensitive resin composition of the present invention comprises an alkali-soluble resin or alkali-soluble monomer (A), which has a photo-curability, a photopolymerization initiator (B), an ink repellent agent (C) having fluorine atoms, and a compound (D) which is a partially hydrolyzed condensate of a hydrolysable silane compound mixture (M1) containing a hydrolysable silane compound having a mercapto group and a hydrolysable group and/or a hydrolysable silane compound having a group with an ethylenic double bond and a hydrolysable group, and which has no fluorine atom.

The negative photosensitive resin composition of the present invention may further contain, as a case requires, a cross-linking agent (E), a solvent (F), a colorant (G) and other optional components.

Now, the respective components will be described.

(Alkali-Soluble Resin or Alkali-Soluble Monomer (A))

In the following description, symbol (AP) will be put to an alkali-soluble resin, and symbol (AM) will be put to an alkali-soluble monomer.

The alkali-soluble resin (AP) is preferably a photosensitive resin having an acidic group and an ethylenic double bond in one molecule. Since the alkali-soluble resin (AP) has an ethylenic double bond in its molecule, an exposed portion of the negative photosensitive resin composition will be polymerized and cured by radicals formed from the photopolymerization initiator (B). Such an exposed portion thus cured will not be removed by an alkaline developer. Further, since the alkali-soluble resin (AP) has an acidic group in its molecule, a non-exposed portion of the negative photosensitive resin composition, which is not cured, can selectively be removed. As a result, the cured film may be made in the form of partition walls to partition a prescribed area into a plurality of compartments.

As the acidic group, a carboxy group, a phenolic hydroxy group, a sulfo group and a phosphoric group may, for example, be mentioned, and one of them may be used alone, or two or more of them may be used in combination.

As the ethylenic double bond, addition-polymerizable double bonds such as a (meth)acryloyl group, an allyl group, a vinyl group, a vinyloxy group and a vinyloxyalkyl group, may be mentioned. One of them may be used alone, or two or more of them may be used in combination. Further, some or all of hydrogen atoms in the ethylenic double bond may be substituted by an alkyl group such as a methyl group.

As the alkali-soluble resin (AP), a resin (A-1) having a side chain with an acidic group and an ethylenic double bond, and a resin (A-2) having an acidic group and an ethylenic double bond introduced into an epoxy resin, may, for example, be mentioned. One of them may be used alone, or two or more of them may be used in combination.

The resin (A-1) may be synthesized, for example, by the following methods (i) and (ii).

(i) A monomer having, in a side chain, a reactive group other than an acidic group, such as a hydroxy group, and a reactive group such as an epoxy group, and a monomer having an acidic group in a side chain, are copolymerized to obtain a copolymer having a side chain with a reactive group and a side chain with an acidic group. This copolymer is reacted with a compound having an ethylenic double bond and a functional group to be bonded to the above reactive group. Otherwise, a monomer having an acidic group such as a carboxy group in a side chain is copolymerized, and then, a compound having an ethylenic double bond and a functional group to be bonded to the acidic group, is reacted in such an amount that the acidic group will remain after the reaction.

(ii) A monomer having the same reactive group other than an acidic group, as in the above (i) and a compound having a protected ethylenic double bond and a functional group to be bonded to the reactive group, are reacted. Then, this monomer and a monomer having an acidic group in a side chain are copolymerized, and then, the protection of the ethylenic double bond is removed. Otherwise, a monomer having an acidic group in a side chain and a monomer having a protected ethylenic double bond in a side chain are copolymerized, and then, the protection of the ethylenic double bond is removed.

Here, the methods (i) and (ii) are preferably carried out in a solvent.

Among the above methods, the method (i) is preferably used. Now, the method (i) will be specifically described.

The monomer having a hydroxy group as a reactive group may, for example, be 2-hydroxyethyl(meth)acrylate, 2-hydroxypropyl(meth)acrylate, neopentyl glycol mono(meth)acrylate, glycerol mono(meth)acrylate, 2-hydroxyethyl vinyl ether, 2-hydroxyethyl allyl ether, N-hydroxymethyl(meth)acrylamide, N,N-bis(hydroxymethyl)(meth)acrylamide, etc.

In the case of using the monomer having a hydroxy group as a reactive group, the monomer having an acidic group to be copolymerized, may, for example, be 2-(meth)acryloyloxyethyl phosphate, as a monomer having a phosphoric group, in addition to the after-mentioned monomer having a carboxy group. The copolymerization of the monomer having a hydroxy group as a reactive group and a monomer having an acidic group, may be carried out by a known method.

The compound having an ethylenic double bond and a functional group to be bonded to the hydroxy group, to be reacted with the obtained copolymer, may, for example, be an acid anhydride having an ethylenic double bond, a compound having an isocyanate group and an ethylenic double bond, or a compound having an acyl chloride group and an ethylenic double bond.

The acid anhydride having an ethylenic double bond, may, for example, be maleic anhydride, itaconic anhydride, citraconic anhydride, methyl-5-norbornene-2,3-dicarboxylic acid anhydride, 3,4,5,6-tetrahydrophthalic acid anhydride, cis-1,2,3,6-tetrahydrophthalic acid anhydride or 2-buten-1-yl succinic anhydride.

The compound having an isocyanate group and an ethylenic double bond, may, for example, be 2-(meth)acryloyloxyethyl isocyanate or 1,1-bis((meth)acryloyloxymethyl)ethyl isocyanate.

The compound having an acyl chloride group and an ethylenic double bond, may, for example, be (meth)acryloyl chloride.

The monomer having an epoxy group as a reactive group, may, for example, be glycidyl(meth)acrylate or 3,4-epoxycyclohexymethyl(meth)acrylate.

As the monomer having an acidic group to be copolymerized with the monomer having an epoxy group as a reactive group, the same monomer as described above with respect to the monomer having a hydroxy group as a reactive group, may be used, and the copolymerization of the monomer having an epoxy group as a reactive group and the monomer having an acidic group, may also be carried out by a known method.

The compound having an ethylenic double bond and a functional group to be bonded to the epoxy group, to be reacted with the obtained copolymer, may, for example, be a compound having an ethylenic double bond and a carboxy group. Specific examples of such a compound may be (meth)acrylic acid, vinyl acetic acid, crotonic acid, itaconic acid, maleic acid, fumaric acid, cinnamic acid and their salts, and in the case of a dibasic acid, a monoester may be mentioned. Further, a carboxy group may be introduced into the resin (A-1) by reacting an acid anhydride wherein a dehydration condensation portion of a carboxylic acid and a hydroxyl group formed here constitutes a part of a ring structure.

The monomer having a carboxy group as a reactive group may, for example, be (meth)acrylic acid, vinyl acetic acid, crotonic acid, itaconic acid, maleic acid, fumaric acid, cinnamic acid or their salts, and in the case of a dibasic acid, a monoester may be mentioned. Further, such a monomer may be used also as the above-described monomer having an acidic group.

In the case of using the monomer having a carboxy group as a reactive group, this monomer is polymerized as mentioned above. As a compound having an ethylenic double bond and a functional group to be bonded to the carboxy group, to be reacted with the obtained polymer, a compound having an ethylenic double bond and an epoxy group may be mentioned. As such a compound, glycidyl(meth)acrylate and 3,4-epoxycyclohexylmethyl(meth)acrylate may, for example, be mentioned. Here, in such a case, the amount of the compound having an ethylenic double bond and a functional group to be bonded to the carboxy group, to be reacted with the polymer having a carboxy group, is adjusted to be such an amount that the carboxy group will remain as an acidic group in a side chain in the polymer after the reaction.

The resin (A-2) may be synthesized by reacting an epoxy resin with the after-described compound having an ethylenic double bond and a carboxy group, followed by a reaction with a polybasic carboxylic acid or its anhydride.

Specifically, by the reaction of the epoxy resin with the compound having an ethylenic double bond and a carboxy group, the ethylenic double bond is introduced to the epoxy resin. Then, by the reaction of the epoxy resin having the ethylenic double bond introduced, with the polybasic acid or its anhydride, the carboxy group may be introduced.

The epoxy resin is not particularly limited and may, for example, be a bisphenol A-type epoxy resin, a bisphenol F-type epoxy resin, a phenol novolac-type epoxy resin, a cresol novolac-type epoxy resin, a trisphenol methane-type epoxy resin, an epoxy resin having a naphthalene skeleton, an epoxy resin having a biphenyl skeleton represented by the following formula (A-2a), a fluorenyl-substituted bisphenol A-type epoxy resin represented by the following formula (A-2b) and an epoxy resin having a biphenyl skeleton represented by the following formula (A-2c).

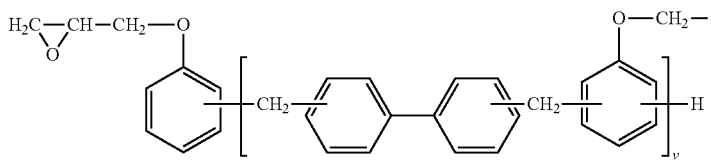

(in the formula (A-2a), v is an integer of from 1 to 50, preferably an integer of from 2 to 10, and each of hydrogen atoms in a benzene ring, which are independent of one another, may be substituted by a $C_{1-12}$ alkyl group, a halogen atom or a phenyl group of which some of hydrogen atoms may be substituted by a substituent.).

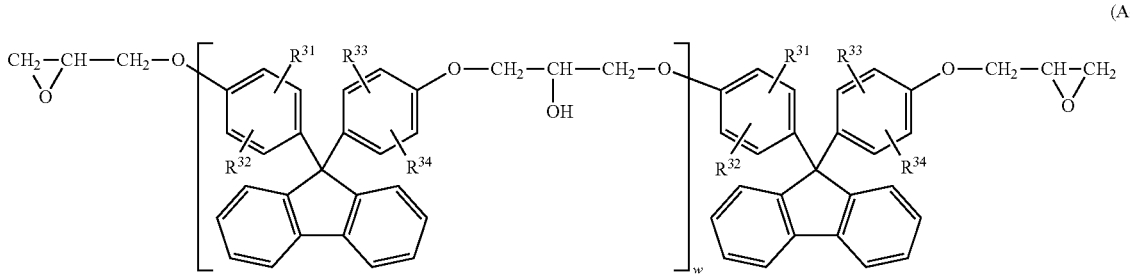

(in the formula (A-2b), each of $R^{31}$, $R^{32}$, $R^{33}$ and $R^{34}$ which are independent of one another, is a hydrogen atom, a chlorine atom or a $C_{1-5}$ alkyl group, and w is 0 or an integer of from 1 to 10.).

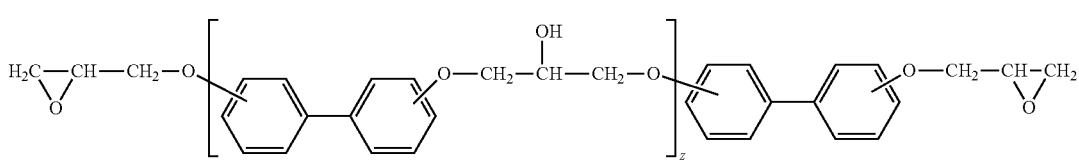

(in the formula (A-2c), each of hydrogen atoms in a benzene ring, which are independent of one another, may be substituted by a $C_{1-12}$ alkyl group, a halogen atom or a phenyl group of which some of hydrogen atoms may be substituted by a substituent, and z is 0 or an integer of from 1 to 10.).

Further, in a case where a polybasic carboxylic acid anhydride is reacted after reacting the epoxy resin represented by the formula (A-2a), (A-2b) or (A-2c) with the compound having an ethylenic double bond and a carboxy group, it is preferred to use a mixture of a dicarboxylic acid anhydride and a tetracarboxylic acid dianhydride, as the polybasic carboxylic acid anhydride.

As the compound having an ethylenic double bond and a carboxy group, (meth)acrylic acid, vinyl acetic acid, crotonic acid, itaconic acid, maleic acid, fumaric acid, cinnamic acid and their salts are preferred, and in the case of a dibasic acid, a monoester is preferred, and (meth)acrylic acid is particularly preferred.

As the alkali-soluble resin (AP), it is preferred to use the resin (A-2), since peeling of a cured film during the development is prevented, and it is possible to obtain a dot pattern with a high resolution, since the linearity of the pattern is good in a case where dots are in a linear form, and since a smooth cured film surface is readily obtainable.

As the resin (A-2), particularly preferred is a resin having an acidic group and an ethylenic double bond introduced to a bisphenol A-type epoxy resin, a resin having an acidic group and an ethylenic double bond introduced to a bisphenol F-type epoxy resin, a resin having an acidic group and an ethylenic double bond introduced to a phenol novolac-type epoxy resin, a resin having an acidic group and an ethylenic double bond introduced to a cresol novolac-type epoxy resin, a resin having an acidic group and an ethylenic double bond introduced to a trisphenol methane-type epoxy resin, or a resin having an acidic group and an ethylenic double bond introduced to an epoxy resin represented by the formula (A-2a), (A-2b) or (A-2c).

As the alkali-soluble monomer (AM), for example, a monomer (A-3) having a side chain with an acidic group and a side chain with an ethylenic double bond, is preferably used. The acidic group and the ethylenic double bond are the same as in the alkali-soluble resin (AP).

The monomer (A-3) may, for example, be 2,2,2-triacryloyloxymethylethylphthalic acid.

As the alkali-soluble resin or alkali-soluble monomer (A) to be contained in the negative photosensitive resin composition, one type may be used alone, or two or more types may be used in combination.

The content of the alkali-soluble resin or alkali-soluble monomer (A) in the total solid content in the negative photosensitive resin composition is preferably from 5 to 80 mass %, particularly preferably from 10 to 60 mass %. When the content is within the above range, the photocurability and developing properties of the negative photosensitive resin composition are good.

(Photopolymerization Initiator (B))

The photopolymerization initiator (B) in the present invention is not particularly limited so long as it is a compound having a function as a photopolymerization initiator, and a compound which generates radicals by light, is preferred.

The photopolymerization initiator (B) may, for example, be an α-diketone such as methyl phenyl glyoxylate or 9,10-phenanthrenequinone; an acyloin such as benzoin; an acyloin ether such as benzoin methyl ether, benzoin ethyl ether or benzoin propyl ether; a thioxanthone such as thioxanthone, 2-chlorothioxanthone, 2-methylthioxanthone, 2,4-dimethylthioxanthone, isopropyithioxanthone or 2,4-diethyithioxanthone; a benzophenone such as benzophenone, 4,4'-bis(dimethylamino)benzophenone or 4,4'-bis(diethylamino)benzophenone; an acetophenone such as acetophenone, 2-(4-toluenesulfonyloxy)-2-phenylacetophenone, p-dimethylaminoacetophenone, 2,2'-dimethoxy-2-phenylacetophenone, p-methoxyacetophenone, 2-methyl-1-[4-(methylthio)phenyl]-2-morpholinopropan-1-one or 2-benzyl-2-dimethylamino-1-(4-morpholinophenyl)-butan-1-one; a quinone such as anthraquinone, 2-ethyl anthraquinone, camphorquinone or 1,4-naphthoquinone; an aminobenzoic acid such as ethyl 2-dimethylaminobenzoate or (n-butoxy)ethyl 4-dimethylaminobenzoate; a halogenated compound such as phenacyl chloride or a trihalomethylphenyl sulfone; an acylphosphine oxide such as bis(2,4,6-trimethylbenzoyl)-phenylphosphine oxide; a peroxide such as di-t-butyl peroxide; an oxime ester such as 1,2-octanedione, 1-[4-(phenylthio)-, 2-(O-benzoyloxime) or ethanone 1-[9-ethyl-6-(2-methylbenzoyl)-9H-carbazol-3-yl]-1-(O-acetyloxime); an aliphatic amine such as triethanolamine, methyldiethanolamine, triisopropanolamine, n-butylamine, N-methyldiethanolamine or diethylaminoethyl methacrylate; a thiol compound such as 2-mercaptobenzimidazole, 2-mercaptobenzoxazole, 2-mercaptobenzothiazole, 1,4-butanol bis(3-mercaptobutyrate), tris(2-mercaptopropanoyloxyethyl) isocyanurate or pentaerythritol tetrakis(3-mercarptobutyrate); etc.

Among such photopolymerization initiators (B), benzophenones, aminobenzoic acids, aliphatic amines and thiol compounds are preferred, since they may exhibit sensitization effects when used together with other radical initiators.

As the photopolymerization initiator (B), preferred is 2-methyl-1-[4-(methylthio)phenyl]-2-morpholinopropan-1-one, 2-benzyl-2-dimethylamino-1-(4-morpholinophenyl)-butan-1-one, 1,2-octanedione, 1-[4-(phenylthio)-, 2-(O-benzoyloxime), ethanone 1-[9-ethyl-6-(2-methylbenzoyl)-9H-carbazol-3-yl]-1-(O-acetyloxime) or 2,4-diethylthioxanthone. Further, a combination of this with a benzophenone such as 4,4'-bis(diethylamino)benzophenone is particularly preferred.

As the photopolymerization initiator (B), one type may be used alone, or two or more types may be used in combination.

The content of the photopolymerization initiator (B) in the total solid content in the negative photosensitive resin composition is preferably from 0.1 to 50 mass %, more preferably from 0.5 to 30 mass %, particularly preferably from 5 to 15 mass %. When the content is within the above range, the photocurability and developing properties of the negative photosensitive resin composition are good.

(Ink Repellent Agent (C))

In the present invention, the ink repellent agent (C) having fluorine atoms has ink repellency and a nature to migrate to the upper surface (upward migration nature) in a process for forming a cured film by using a negative photosensitive resin composition which contains the ink repellent agent. By using the ink repellent agent (C), the upper layer portion including the upper surface of the obtainable cured film becomes to be a layer wherein the ink repellent agent (C) is present at a high concentration (hereinafter sometimes referred to as "ink repellent layer"), and ink repellency will be imparted selectively to the upper surface of the cured film.

The content of fluorine atoms in the ink repellent agent (C) is preferably from 1 to 40 mass %, more preferably from 5 to 35 mass %, particularly preferably from 10 to 30 mass %. When the content of fluorine atoms in the ink repellent agent (C) is at least the lower limit value in the above range, good ink repellency can be imparted to the upper surface of the cured film, and when it is at most the upper limit value, the compatibility with other components in the negative photosensitive resin composition will be good.

As the ink repellent agent (C), specifically the following ink repellent agent (C1) and ink repellent agent (C2) may, for example, be mentioned.

Ink repellent agent (C1): a partially hydrolyzed condensate of a hydrolysable silane compound mixture (M2) containing a hydrolysable silane compound having a fluoroalkylene group and/or a fluoroalkyl group, and a hydrolysable group.

Ink repellent agent (C2): a compound of which the main chain is a hydrocarbon chain and which has a side chain having fluorine atoms.

The ink repellent agent (C1) and ink repellent agent (C2) may be used alone or in combination. In the negative photosensitive resin composition of the present invention, it is particularly preferred to use the ink repellent agent (C1).

<Ink Repellent Agent (C1)>

Ink repellent agent (C1) is a partially hydrolyzed condensate of a hydrolysable silane compound mixture (M2) (hereinafter sometimes referred to simply as "mixture (M2)"). The mixture (M2) contains a hydrolysable silane compound (hereinafter referred to also as a "hydrolysable silane compound (s1)") having a fluoroalkylene group and/or a fluoroalkyl group, and a hydrolysable group, as an essential component and optionally contains a hydrolysable silane compound other than the hydrolysable silane compound (s1). As the hydrolysable silane compound which the mixture (M2) optionally contains, the following hydrolysable silane compounds (s2) to (s5) are preferred.

Hydrolyzable silane compound (s2): a hydrolysable silane compound having four hydrolysable groups bonded to silicon atoms.

Hydrolyzable silane compound (s3): a hydrolysable silane compound having a hydrolysable group and a group having an ethylenic double bond, and containing no fluorine atom.

Hydrolyzable silane compound (s4): a hydrolysable silane compound having only a hydrolysable group and a hydrocarbon group as groups bonded to silicon atoms.

Hydrolyzable silane compound (s5): a hydrolysable silane compound having a mercapto group and a hydrolysable group, and containing no fluorine atom.

Now, hydrolysable silane compounds (s1) to (s5) will be described. Hydrolysable silane compound (s1)

In the present invention, by using hydrolysable silane compound (s1), the ink repellent agent (C1) has fluorine atoms in the form of a fluoroalkylene group and/or a fluoroalkyl group, whereby it has the above mentioned upward migration nature and ink repellency. In order to bring these characteristics of the hydrolysable silane compound (s1) to a higher level, the hydrolysable silane compound (s1) more preferably has at least one member selected from the group consisting of a fluoroalkyl group, a perfluoroalkylene group and a perfluoroalkyl group, and particularly preferably has a perfluoroalkyl group. Further, a perfluoroalkyl group containing an etheric oxygen atom is also preferred. That is, the most preferred compound as the hydrolysable silane compound (s1) is a compound having a perfluoroalkyl group and/or a perfluoroalkyl group containing an etheric oxygen atom.

As the hydrolysable group, an alkoxy group, a halogen atom, an acyl group, an isocyanate group, an amino group and a group having at least one hydrogen in an amino group substituted by an alkyl group, may, for example, be mentioned. A $C_{1-4}$ alkoxy group and a halogen atom are preferred, a methoxy group, an ethoxy group and a chlorine atom are more preferred, and a methoxy group and an ethoxy group are particularly preferred, since they become hydroxy groups (silanol groups) by a hydrolysis reaction and further, a reaction to form a Si—O—Si bond by their intermolecular condensation reaction tends to smoothly proceed.

As the hydrolysable silane compound (s1), one type may be used alone, or two or more types may be used in combination.

As the hydrolysable silane compound (s1), a compound represented by the following formula (cx-1) is preferred.

$$(A-R^{F11})_a—Si(R^{H11})_bX^{11}_{(4-a-b)} \quad (cx-1)$$

In the formula (cx-1), the respective symbols have the following meanings.

$R^{F11}$ is a $C_{1-16}$ bivalent organic group which contains at least one fluoroalkylene group and which may contain an etheric oxygen atom.

$R^{H11}$ is a $C_{1-6}$ hydrocarbon group.

a is 1 or 2, and b is 0 or 1, provided that a+b is 1 or 2.

A is a fluorine atom or a group represented by the following formula (Ia).

$$—Si(R^{H12})_cX^{12}_{(3-c)} \quad (Ia)$$

$R^{H12}$ is a $C_{1-6}$ hydrocarbon group.

c is 0 or 1.

$X^{11}$ and $X^{12}$ are hydrolysable groups.

When a plurality of $X^{11}$ are present, they may be the same or different from one another.

When a plurality of $X^{12}$ are present, they may be the same or different from one another.

When a plurality of $A-R^{F11}$ are present, they may be the same or different from one another.

The compound (cx-1) is a fluorinated hydrolysable silane compound having one or two 2- or 3-functional hydrolysable silyl groups.

As $R^{H11}$ and $R^{H12}$, a $C_{1-3}$ hydrocarbon group is preferred, and a methyl group is particularly preferred.

In the formula (cx-1), it is particularly preferred that a is 1, and b is 0 or 1.

Specific examples and preferred modes of $X^{11}$ and $X^{12}$ are as mentioned above.

As the hydrolysable silane compound (s1), a compound represented by the following formula (cx-1a) is particularly preferred.

$$D-R^{F12}-Q^{11}-SiX^{11}_3 \quad (cx-1a)$$

In the formula (cx-1a), the respective symbols have the following meanings.

$R^{F12}$ is a $C_{2-15}$ perfluoroalkylene group which may contain an etheric oxygen atom.

D is a fluorine atom or a group represented by the following formula (Ib).

$$-Q^{12}-SiX^{12}_3 \quad (1b)$$

$X^{11}$ and $X^{12}$ are hydrolysable groups.

Three $X^{11}$ may be the same or different from one another.

Three $X^{12}$ may be the same or different from one another.

$Q^{11}$ and $Q^{12}$ are $C_{1-10}$ bivalent organic groups containing no fluorine atoms.

In the formula (cx-1a), when D is a fluorine atom, $R^{F12}$ is preferably a $C_{4-8}$ perfluoroalkylene group, or a C4-10 perfluoroalkylene group containing an etheric oxygen atom, more preferably a C4-8 perfluoroalkylene group, particularly preferably a C6 perfluoroalkylene group.

Further, in the formula (cx-1a), when D is a group (Ib), $R^{F12}$ is preferably a $C_{3-15}$ perfluoroalkylene group, or a $C_{3-15}$ perfluoroalkylene group containing an etheric oxygen atom, particularly preferably a $C_{4-6}$ perfluoroalkylene group.

When $R^{F12}$ is the above-exemplified group, the ink repellent agent (C1) has good ink repellency, and the compound (cx-1a) is excellent in solubility in a solvent.

The structure of $R^{F12}$ may, for example, be a straight chain structure, a branched structure, a ring structure or a partially cyclic structure, and a straight chain structure is preferred.

As specific examples of $R^{F12}$, the following groups may be mentioned.

—(CF$_2$)$_4$—, —(CF$_2$)$_6$—, —(CF$_2$)$_8$—,
—CF$_2$CF$_2$OCF$_2$CF$_2$OCF$_2$—,
—CF$_2$CF$_2$OCF$_2$CF$_2$OCF$_2$CF$_2$—,
—CF$_2$CF$_2$OCF$_2$CF$_2$OCF$_2$CF$_2$OCF$_2$CF$_2$OCF$_2$—,
—CF$_2$CF$_2$OCF$_2$CF$_2$OCF$_2$CF$_2$OCF$_2$CF$_2$OCF$_2$CF$_2$—,
—CF$_2$CF$_2$CF$_2$OCF$_2$—, —CF$_2$CF$_2$CF$_2$OCF$_2$CF$_2$—,
—CF$_2$CF$_2$CF$_2$OCF(CF$_3$)—, —CF$_2$CF$_2$CF$_2$OCF(CF$_3$)CF$_2$—, —CF$_2$CF$_2$CF$_2$OCF(CF$_3$)CF$_2$OCF$_2$CF$_2$—,
—CF$_2$CF$_2$CF$_2$OCF(CF$_3$)CF$_2$OCF(CF$_3$)—,
—CF$_2$CF$_2$CF$_2$OCF(CF$_3$)CF$_2$OCF(CF$_3$)CF$_2$—, —CF$_2$OCF(CF$_3$)CF$_2$OCF(CF$_3$)—, —CF$_2$CF$_2$OCF(CF$_3$)CF$_2$OCF(CF$_3$)—.

Specifically, when it is assumed that Si is to be bonded to the right hand side bond, represented by —(CH$_2$)$_{i1}$— (wherein i1 is an integer of from 1 to 5), —CH$_2$O(CH$_2$)$_{i2}$— (wherein i2 is an integer of from 1 to 4), —SO$_2$NR$^1$—(CH$_2$)$_{i3}$— (wherein R$^1$ is a hydrogen atom, a methyl group or an ethyl group, i3 is an integer of from 1 to 4, and the total number of carbon atoms in R$^1$ and (CH$_2$)$_{i3}$ is an integer of at most 4), or —(C=O)—NR$^1$—(CH$_2$)$_{i4}$-(wherein R$^1$ is as defined above, i4 is an integer of from 1 to 4, and the total number of carbon atoms in R$^1$ and (CH$_2$)$_{i4}$ is an integer of at most 4). $Q^{11}$ and $Q^{12}$ are more preferably —(CH$_2$)$_{i1}$— wherein i1 is an integer of from 2 to 4, particularly preferably —(CH$_2$)$_2$—.

Further, when $R^{F12}$ is a perfluoroalkylene group which contains no etheric oxygen atom, $Q^{11}$ and $Q^{12}$ are preferably a group represented by —(CH$_2$)$_{i1}$—, and i1 is more preferably an integer of from 2 to 4, and i1 is particularly preferably 2.

When $R^{F12}$ is a perfluoroalkylene group which contains an etheric oxygen atom, $Q^{11}$ and $Q^{12}$ are preferably a group represented by —(CH$_2$)$_{i1}$—, —CH$_2$O(CH$_2$)$_{i2}$—, —SO$_2$NR$^1$—(CH$_2$)$_{i3}$— or —(C=O)—NR$^1$—(CH$_2$)$_{i4}$—. Also in this case, —(CH$_2$)$_{i1}$— is more preferred, and i1 is more preferably an integer of from 2 to 4, and i1 is particularly preferably 2.

When D is a fluorine atom, the following compounds may be mentioned as specific examples of the compound (cx-1a).
$F(CF_2)_4CH_2CH_2Si(OCH_3)_3$,
$F(CF_2)_6CH_2CH_2Si(OCH_3)_3$,
$F(CF_2)_6CH_2CH_2CH_2Si(OCH_3)_3$,
$F(CF_2)_8CH_2CH_2Si(OCH_3)_3$,
$F(CF_2)_3OCF(CF_3)CF_2O(CF_2)_2CH_2CH_2Si(OCH_3)_3$,
$F(CF_2)_2O(CF_2)_2O(CF_2)_2CH_2CH_2Si(OCH_3)_3$.

When D is a group (1b), the following compounds may be mentioned as specific examples of the compound (cx-1a).
$(CH_3O)_3SiCH_2CH_2(CF_2)_4CH_2CH_2Si(OCH_3)_3$,
$(CH_3O)_3SiCH_2CH_2(CF_2)_6CH_2CH_2Si(OCH_3)_3$,
$(CH_3O)_3SiCH_2CH_2(CF_2)_6CH_2CH_2CH_2Si(OCH_3)_3$,
$(CH_3O)_3SiCH_2CH_2(CF_2)_{20}CF_2(CF_3)CFO(CF_2)_{20}CF(CF_3)CF_2O(CF_2)_2CH_2CH_2Si(OCH_3)_3$.

In the present invention, as the compound (cx-1a), particularly preferred are $F(CF_2)_6CH_2CH_2Si(OCH_3)_3$ and $F(CF_2)_3OCF(CF_3)CF_2O(CF_2)_2CH_2CH_2Si(OCH_3)_3$.

The content of the hydrolysable silane compound (s1) in the mixture (M2) is preferably such a proportion that the content of fluorine atoms in the partially hydrolyzed condensate obtainable from the mixture would be from 1 to 40 mass %, more preferably from 5 to 35 mass %, particularly preferably from 10 to 30 mass %. When the content of the hydrolysable silane compound (s1) is at least the lower limit value in the above range, good ink repellency can be imparted to the upper surface of the cured film, and when it is at most the upper limit value, the compatibility with other hydrolysable silane compounds in the mixture will be good.

Hydrolysable Silane Compound (s2)

By incorporating the hydrolysable silane compound (s2) in the mixture (M2) in the present invention, it is possible to improve the film-forming properties after the ink repellent agent (C1) has migrated to the upper surface, in a cured film formed by curing a negative photosensitive resin composition containing the ink repellent agent (C1). Namely, it is considered that since the number of hydrolysable groups in the hydrolysable silane compound (s2) is large, the ink repellent agent (C1) will well condense to each other after migrated to the upper surface to form a thin film over the entire upper surface thereby to form an ink repellent layer.

Further, by incorporating the hydrolysable silane compound (s2) in the mixture (M2), the ink repellent agent (C1) becomes easily soluble in a hydrocarbon-type solvent.

As the hydrolysable silane compound (s2), one type may be used alone, or two or more types may be used in combination.

As the hydrolysable group, the same one as the hydrolysable group in the hydrolysable silane compound (s1) may be employed.

The hydrolysable silane compound (s2) may be represented by the following formula (cx-2).

$$SiX^2_4 \quad (cx-2)$$

In the formula (cx-2), $X^2$ is a hydrolysable group, and four $X^2$ may be the same or different from one another. As $X^2$, the same group as the above $X^{11}$ and $X^{12}$ is used.

The following compounds may be mentioned as specific examples of the compound (cx-2). Further, as the compound (cx-2), as a case requires, a partially hydrolyzed condensate obtained by preliminarily subjecting a plurality of such compounds to partial hydrolytic condensation may be used. $Si(OCH_3)_4$, $Si(OCH_2CH_3)_4$, a partially hydrolyzed condensate of $Si(OCH_3)_4$ (e.g. Methyl Silicate 51 (tradename), manufactured by Colcoat Co., Ltd.), and partially hydrolyzed condensates of $Si(OCH_2CH_3)_4$ (e.g. Ethyl Silicate 40 and Ethyl Silicate 48 (tradenames), manufactured by Colcoat Co., Ltd.).

The content of the hydrolysable silane compound (s2) in the mixture (M2) is preferably from 0.01 to 5 mol, particularly preferably from 0.05 to 3 mol, per 1 mol of the hydrolysable silane compound (s1). When the content is at least the lower limit value in the above range, the film-forming properties of the ink repellent agent (C1) are good, and when it is at most the upper limit value, the ink repellency of the ink repellent agent (C1) is good.

Hydrolysable Silane Compound (s3)

By incorporating the hydrolysable silane compound (s3) to the mixture (M2) in the present invention, (co)polymerization of the ink repellent agent (C1) each other via a group having an ethylenic double bond, or between the ink repellent agent (C1) and other component having an ethylenic double bond, contained in the negative photosensitive resin composition, becomes possible. It is thereby possible to improve the fixing properties of the ink repellent agent (C1) in the upper layer of the cured film, i.e. in the ink repellent layer. Particularly, in the production of partition walls, at the time of carrying out development, it is possible to sufficiently prevent the ink repellent agent (C1) from detaching from the ink repellent layer, or prevent peeling of the upper surface of the ink repellent layer.

As the hydrolysable silane compound (s3), one type may be used alone, or two or more types may be used in combination.

As the hydrolysable group, the same one as the hydrolysable group in the hydrolysable silane compound (s1) may be employed.

As the group having an ethylenic double bond, a (meth) acryloyloxy group and a vinyl phenyl group are preferred, and a (meth)acryloyloxy group is particularly preferred.

As the hydrolysable silane compound (s3), a compound represented by the following formula (cx-3) is preferred.

$$(Y-Q^3)_g-Si(R^{H3})_h X^3_{(4-g-h)} \quad (cx-3)$$

The symbols in the formula (cx-3) have the following meanings.

Y is a group having an ethylenic double bond.

$Q^3$ is a $C_{1-6}$ bivalent organic group containing no fluorine atom.

$R^{H3}$ is a $C_{1-6}$ hydrocarbon group.

$X^3$ is a hydrolysable group.

g is 1 or 2, and h is 0 or 1, provided that g+h is 1 or 2.

When a plurality of $Y-Q^3$ are present, they may be the same or different from one another.

When a plurality of $X^3$ are present, they may be the same or different from one another.

As $R^{H3}$, the same group as the above $R^{H11}$ and $R^{H12}$ may be employed.

As $X^3$, the same group as the above $X^{11}$ and $X^{12}$ may be employed.

As Y, a (meth)acryloyloxy group and a vinyl phenyl group are preferred, and a (meth)acryloyloxy group is particularly preferred.

Specific examples of $Q^3$ may, for example, be a $C_{2-6}$ alkylene group and a phenylene group. Among them, —$(CH_2)_3$— is preferred.

It is preferred that g is 1, and h is 0 or 1.

As the compound (cx-3), one type may be used alone, or two or more types may be used in combination.

The following compounds may be mentioned as specific examples of the compound (cx-3).
$CH_2=C(CH_3)COO(CH_2)_3Si(OCH_3)_3$,
$CH_2=C(CH_3)COO(CH_2)_3Si(OC_2H_5)_3$,
$CH_2=CHCOO(CH_2)_3Si(OCH_3)_3$,
$CH_2=CHCOO(CH_2)_3Si(OC_2H_5)_3$,
$[CH_2=C(CH_3)COO(CH_2)_3]CH_3Si(OCH_3)_2$,
$[CH_2=C(CH_3)COO(CH_2)_3]CH_3Si(OC_2H_5)_2$.

The content of the hydrolysable silane compound (s3) in the mixture (M2) is preferably from 0.1 to 5 mol, particularly preferably from 0.5 to 4 mol, per 1 mol of the hydrolysable silane compound (s1). When the content is at least the lower limit value in the above range, the upward migration nature of the ink repellent agent (C1) is good, further, the fixing properties of the ink repellent agent (C1) are good in the ink repellent layer including the upper surface after the upward migration, and furthermore, the storage stability of the ink repellent agent (C1) is good. When it is at most the upper limit value, the ink repellency of the ink repellent agent (C1) is good.

Hydrolysable Silane Compound (s4)

In a case where the hydrolysable silane compound (s2) is used in the mixture (M2) in the present invention, embossing may sometimes be formed at an edge of the upper surface of partition walls formed by curing a negative photosensitive resin composition. This is very small embossing at a level to be observed by a scanning electron microscope (SEM). The present inventors have ascertained that in such embossing, the content of F and/or Si is larger than in other portions.

Although such embossing does not bring about any particular problem to partition walls, the present inventors have found it possible to prevent formation of such embossing by replacing a part of the hydrolysable silane compound (s2) with the hydrolysable silane compound (s4) having a less number of hydrolysable groups.

The film-forming properties of the ink repellent agent (C1) will increase by the reaction of silanol groups to one another formed by the hydrolysable silane compound (s2) having a large number of hydrolysable groups. However, because of the high reactivity, the above mentioned embossing is considered to occur. And, by replacing a part of the hydrolysable silane compound (s2) with the hydrolysable silane compound (s4) having a less number of hydrolysable groups, the reaction of silanol groups to one another is considered to be suppressed so that formation of embossing is thereby prevented.

As the hydrolysable group, the same one as the hydrolysable group in the hydrolysable silane compound (s1) may be employed.

As the hydrolysable silane compound (s4), one type may be used alone, or two or more types may be used in combination.

As the hydrolysable silane compound (s4), a compound represented by the following formula (cx-4) is preferred.

$$(R^{H4})_j\text{—}SiX^4_{(4-j)} \qquad (cx\text{-}4)$$

The symbols in the formula (cx-4) have the following meanings.

$R^{H4}$ is a $C_{1-20}$ hydrocarbon group.

$X^4$ is a hydrolysable group.

j is an integer of 1 to 3, preferably 2 or 3.

When a plurality of $R^{H4}$ are present, they may be the same or different from one another.

When a plurality of $X^4$ are present, they may be the same or different from one another.

When j is 1, $R^{H4}$ may be a $C_{1-20}$ aliphatic hydrocarbon group or a $C_6$-10 aromatic hydrocarbon group, preferably a $C_{1-10}$ alkyl group or a phenyl group. When j is 2 or 3, $R^{H4}$ is preferably a $C_{1-6}$ hydrocarbon group, more preferably a $C_{1-3}$ hydrocarbon group.

As $X^4$, the same group as the above $X^{11}$ and $X^{12}$ may be employed.

The following compounds may be mentioned as specific examples of the compound (cx-4). Here, Ph in the formula represents a phenyl group. $(CH_3)_3$—Si—$OCH_3$, $(CH_3CH_2)_3$—Si—$OCH_2CH_3$, $(CH_3)_3$—Si—$OCH_2CH_3$, $(CH_3CH_2)_3$—Si—$OCH_3$, $(CH_3)_2Si$—$(OCH_3)_2$, $(CH_3)_2$—Si—$(OCH_2CH_3)_2$, $(CH_3CH_2)_2$—Si—$(OCH_2CH_3)_2$, $(CH_3CH_2)_2$—Si—$(OCH_3)_2$, Ph-Si$(OCH_2CH_3)_3$, $C_{10}H_{21}$—Si$(OCH_3)_3$.

The content of the hydrolysable silane compound (s4) in the mixture (M2) is preferably from 0.05 to 5 mol, particularly preferably from 0.3 to 3 mol, per 1 mol of the hydrolysable silane compound (s1). When the content is at least the lower limit value in the above range, embossing of the edge of the upper surface of partition walls can be prevented. When it is at most the upper limit value, the ink repellency of the ink repellent agent (C1) is good.

Hydrolysable Silane Compound (s5)

By using the hydrolysable silane compound (s5) in the negative photosensitive resin composition, curing at a lower exposure becomes possible. It is considered that a mercapto group in the hydrolysable silane compound (s5) has a chain transfer property and thus can readily be bonded to an ethylenic double bond, etc. of the above-mentioned alkali-soluble resin or alkali-soluble monomer (A) thereby to accelerate photo-curing.

Further, the hydrolysable silane compound (s5) containing a mercapto group has a pKa of about 10 and is likely to be readily deprotonated i.e. dissociated in an alkaline solution. Here, pKa=$-\log_{10}$ Ka, where Ka is the acid dissociation constant. Thus, the mercapto group is considered to increase the alkali solubility during the development of the negative photosensitive resin composition.

As the hydrolysable silane compound (s5), one type may be used alone, or two or more types may be used in combination.

As the hydrolysable group, the same one as the hydrolysable group in the hydrolysable silane compound (s1) may be employed.

As the hydrolysable silane compound (s5), a compound represented by the following formula (cx-5) is preferred.

$$(HS\text{-}Q^5)_p\text{-}Si(R^{H5})_q X^5_{(4-p-q)} \qquad (cx\text{-}5)$$

The symbols in the formula (cx-5) have the following meanings.

$Q^5$ is a $C_{1-10}$ bivalent organic group containing no fluorine atom.

$R^{H5}$ is a $C_{1-6}$ hydrocarbon group.

$X^5$ is a hydrolysable group.

p is 1 or 2, and q is 0 or 1, provided that p+q is 1 or 2.

When a plurality of HS-$Q^5$ are present, they may be the same or different from one another.

When a plurality of $X^5$ are present, they may be the same or different from one another.

As $X^5$, the same group as the above $X^{11}$ and $X^{12}$ may be employed.

As $Q^5$, a $C_{1-10}$ alkylene group is preferred, a $C_{1-5}$ alkylene group is more preferred, and a $C_{1-3}$ alkylene group is particularly preferred.

As $R^{H5}$, the same group as the above $R^{H11}$ and $R^{H12}$ may be employed.

Specific examples of the compound (cx-5) may, for example, be HS—(CH$_2$)$_3$—Si(OCH$_3$)$_3$, HS—(CH$_2$)$_3$—Si(CH$_3$)(OCH$_3$)$_2$, etc.

The content of the hydrolysable silane compound (s5) in the mixture (M2) is preferably from 0.125 to 18 mol, particularly preferably from 0.125 to 8 mol, per 1 mol of the hydrolysable silane compound (s1). When the content is at least the lower limit value in the above range, in the negative photosensitive resin composition, curing at a lower exposure becomes possible, and the alkali solubility is increased whereby the developing properties will be good. When it is at most the upper limit value, the ink repellency of the ink repellent agent (C1) is good.

Other Hydrolysable Silane Compounds

The mixture (M2) may optionally contain one or more hydrolysable silane compounds other than the hydrolysable silane compounds (s1) to (s5).

As such other hydrolysable silane compounds, hydrolysable silane compounds having an alkylene oxide group and a hydrolysable group and containing no fluorine atom, may be mentioned. Specifically, for example, CH$_3$O(C$_2$H$_4$O)$_k$Si(OCH$_3$)$_3$ (polyoxyethylene group-containing trimethoxysilanes) (wherein k is for example about 10) may be mentioned.

Ink Repellent Agent (C1)

The ink repellent agent (C1) is a partially hydrolyzed condensate of the mixture (M2). As an example of the ink repellent agent (C1), an average composition formula of an ink repellent agent (C11) is shown by the following formula (Ic), as a partially hydrolyzed condensate of the mixture (M2) which contains the compound (cx-1a) and optionally contains the compounds (cx-2) to (cx-5) wherein the group D in the compound (cx-1) is a fluorine atom.

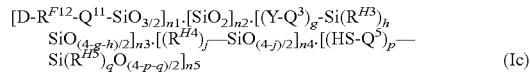

(Ic)

In the formula (Ic), n1 to n5 are molar fractions of the respective constituting units to the total molar amount of the constituting units. n1>0, n2≥0, n3≥0, n4≥0, n5≥0, and n1+n2+n3+n4+n5=1. Other symbols are as defined above, provided that D is a fluorine atom.

Here, the ink repellent agent (C11) is actually a formed product (partially hydrolyzed condensate) having hydrolysable groups or silanol groups remained, and such a formed product is hardly represented by a chemical formula. The average composition formula represented by the formula (Ic) is a chemical formula in a case where it is assumed that in the ink repellent agent (C11), all of hydrolysable groups and silanol groups have become to be siloxane bonds. Further, in the formula (Ic), units derived respectively from the compounds (cx-1a), (cx-2) to (cx-5) are assumed to be randomly arranged.

In the average composition formula represented by the formula (Ic), n1:n2:n3:n4:n5 agrees to the charged composition of the compounds (cx-la), (cx-2) to (cx-5) in the mixture (M2).

The molar ratios of the respective components will be designed from the balance of the effects of the respective components.

n1 is preferably from 0.02 to 0.4 in such an amount that the content of fluorine atoms in the ink repellent agent (C11) becomes to be within the above-mentioned preferred range.

n2 is preferably from 0 to 0.98, particularly preferably from 0.05 to 0.6.

n3 is preferably from 0 to 0.8, particularly preferably from 0.2 to 0.5.

n4 is preferably from 0 to 0.5, particularly preferably from 0.05 to 0.3.

n5 is preferably from 0 to 0.9, more preferably from 0.05 to 0.8, particularly preferably from 0.05 to 0.4.

Here, the above preferred molar ratios of the respective components similarly apply also to a case where D in the compound (cx-1a) is a group (Ib).

Further, the above preferred molar ratios of the respective components may similarly apply to a case where the mixture (M2) contains the hydrolysable silane compound (s1) and optionally contains the hydrolysable silane compounds (s2) to (s5). That is, the preferred amounts of the hydrolysable silane compounds (s1) to (s5) to be charged in the mixture (M2) in order to obtain the ink repellent agent (C1) correspond, respectively, to the above preferred ranges of n1 to n5.

The mass average molecular weight (Mw) of the ink repellent agent (C1) is preferably at least 500, preferably less than 1,000,000, particularly preferably less than 10,000.

When the mass average molecular weight (Mw) is at least the lower limit value, the ink repellent agent (C1) tends to hardly migrate to the upper surface at the time of forming a cured film by using the negative photosensitive resin composition. When it is less than the upper limit value, the solubility of the ink repellent agent (C1) in a solvent will be good.

The mass average molecular weight (Mw) of the ink repellent agent (C1) can be adjusted by the production conditions.

The ink repellent agent (C1) may be produced by subjecting the above-described mixture (M2) to hydrolysis and condensation reaction by a known method.

For this reaction, it is preferred to use, as a catalyst, an inorganic acid such as hydrochloric acid, sulfuric acid, nitric acid or phosphoric acid, or an organic acid such as acetic acid, oxalic acid or maleic acid, which is commonly used. Further, as the case requires, an alkali catalyst such as sodium hydroxide or tetramethyl ammonium hydroxide may be used.

In the above reaction, a known solvent may be employed.

The ink repellent agent (C1) obtainable by the above reaction may be incorporated to the negative photosensitive resin composition together with a solvent.

<Ink Repellent Agent (C2)>

The ink repellent agent (C2) is a compound, of which the main chain is a hydrocarbon chain and which contains a side chain having fluorine atoms. The mass average molecular weight (Mw) of the ink repellent agent (C2) is preferably from 100 to 1,000,000, particularly preferably from 5,000 to 100,000. When the mass average molecular weight (Mw) is at least the lower limit value, the ink repellent agent (C2) tends to hardly migrate to the upper surface at the time of forming a cured film by using the negative photosensitive resin composition. When it is less than the upper limit value, the solubility of the ink repellent agent (C2) in a solvent will be good.

The ink repellent agent (C2) is preferably a polymer containing a fluoroalkyl group which may contain an etheric oxygen atom and/or a side chain having a fluoroalkyl group which may contain an etheric oxygen atom.

The fluoroalkyl group may be linear or branched.

The following structures may be mentioned as specific examples of the fluoroalkyl group.

—CF$_3$, —CF$_2$CF$_3$, —CF$_2$CHF$_2$, —(CF$_2$)$_2$CF$_3$, —(CF$_2$)$_3$CF$_3$, —(CF$_2$)$_4$CF$_3$, —(CF$_2$)$_5$CF$_3$, —(CF$_2$)$_6$CF$_3$, —(CF$_2$)$_7$CF$_3$, —(CF$_2$)$_8$CF$_3$, —(CF$_2$)$_9$CF$_3$, —(CF$_2$)$_{11}$CF$_3$, —(CF$_2$)$_{15}$CF$_3$.

The following structures may be mentioned as specific examples of the fluoroalkyl group containing an etheric oxygen atom.
—CF(CF$_3$)O(CF$_2$)$_5$CF$_3$,
—CF$_2$O(CF$_2$CF$_2$O)$_{r1}$CF$_3$,
—CF(CF$_3$)O(CF$_2$CF(CF$_3$)O)$_{r2}$C$_6$F$_{13}$, and
—CF(CF$_3$)O(CF$_2$CF(CF$_3$)O)$_{r3}$C$_3$F$_7$.

In the above formulae, r1 is an integer of from 1 to 8, r2 is an integer of from 1 to 4, and r3 is an integer of from 1 to 5.

The fluoroalkyl group is preferably a perfluoroalkyl group, whereby the ink repellency will be good.

The number of carbon atoms in the fluoroalkyl group is preferably from 4 to 15. Within such a range, the ink repellency will be excellent, and at the time of producing the ink repellent agent (C2), compatibility between the monomer having the fluoroalkyl group and the after-described monomers other than such monomer will be good.

The ink repellent agent (C2) is preferably a polymer having polymerized units containing fluoroalkyl groups. It is preferred to introduce the polymerized units containing fluoroalkyl groups to a polymer by polymerizing a polymerizable monomer having a fluoroalkyl group. Otherwise, fluoroalkyl groups may be introduced to a polymer by various modification methods wherein a polymer having reactive sites is reacted with an optional compound.

The hydrocarbon chain constituting the main chain of the ink repellent agent (C2) may, specifically, be a main chain obtainable by polymerization of a monomer having an ethylenic double bond, or a novolac type main chain composed of repeating units of -Ph-CH$_2$— (wherein Ph is a benzene skeleton).

In order to obtain the ink repellent agent (C2) by polymerization of a monomer having an ethylenic double bond, a monomer having a fluoroalkyl group as well as an ethylenic double bond may be polymerized alone, or, as the case requires, together with other monomer having an ethylenic double bond. Now, a case where the main chain of the ink repellent agent (C2) is a main chain obtainable by polymerization of a monomer having an ethylenic double bond, will be described.

The monomer having a fluoroalkyl group as well as an ethylenic double bond, may, for example, be CH$_2$=CR$^4$COOR$^5$R$^f$, CH$_2$=CR$^4$COOR$^6$NR$^4$SO$_2$R$^f$, CH$_2$=CR$^4$COOR$^6$NR$^4$COR$^f$, CH$_2$=CR$^4$COOCH$_2$CH(OH)R$^5$R$^f$ or CH$_2$=CR$^4$CR$^4$=CFR$^f$.

In the above formulae, R$^f$ is a fluoroalkyl group, R$^4$ is a hydrogen atom, a halogen atom other than a fluorine atom, or a methyl group, R$^5$ is a single bond or a 01-6 bivalent organic group, and R$^6$ is a C$_{1-6}$ bivalent organic group. Preferred embodiments of the fluoroalkyl group as R$^f$ are as mentioned above. The halogen atom as R$^4$ is preferably a chlorine atom.

Specific examples of R$^5$ or R$^6$ may be —CH$_2$—, —CH$_2$CH$_2$—, —CH(CH$_3$)—, —CH$_2$CH$_2$CH$_2$—, —CH(CH$_3$)$_2$—, —CH(CH$_2$CH$_3$)—, —CH$_2$CH$_2$CH$_2$CH$_2$—, —CH(CH$_2$CH$_2$CH$_3$)—, —CH$_2$(CH$_2$)$_3$CH$_2$— and —CH(CH$_2$CH(CH$_3$)$_2$)—.

As the above polymerizable monomer, one type may be used alone, or two or more types may be used in combination.

The ink repellent agent (C2) is preferably a polymer containing a side chain having an acidic group, whereby alkali-solubility of the ink repellent agent (C2) will be good.

Here, the acidic group may be contained in a side chain having a fluoroalkyl group. Otherwise, the acidic group may be present separately from the side chain having a fluoroalkyl group, and there may be a side chain having no fluoroalkyl group.

As the acidic group, preferred is at least one member selected from the group consisting of a carboxy group, a phenolic hydroxy group and a sulfo group, or its salt.

The ink repellent agent (C2) is preferably a polymer containing a side chain having an ethylenic double bond, whereby it has a photo-crosslinkable properties and can bond to each other or to other component having an ethylenic double bond contained in a negative photosensitive resin composition at the upper layer of a cured film in the process for producing the cured film by curing the negative photosensitive resin composition, so that the fixing properties of the ink repellent agent (C) can be improved.

A polymer containing at least two ethylenic double bonds in one side chain is particularly preferred.

Further, an ethylenic double bond may be contained in a side chain having a fluoroalkyl group. Otherwise, an ethylenic double bond may be present separately from a side chain having a fluoroalkyl group, and there may be a side chain having no fluoroalkyl group. As the group having an ethylenic double bond, a (meth)acryloyloxy group and a vinyl phenyl group are preferred, and a (meth)acryloyloxy group is particularly preferred.

The ink repellent agent (C2) may be a polymer containing a side chain having an alkylene oxide group. The alkylene oxide group may be contained in the form of a polyoxyalkylene chain (POA chain) having a plurality of alkylene oxide groups linked to one another.

Although the alkylene oxide group itself does not have photo-crosslinkable properties, the ink repellent agent (C2) having an alkylene oxide group can bond to each other or to other component contained in a negative photosensitive resin composition in the upper layer in the process for producing a cured film, so that the fixing properties of the ink repellent agent (C2) can be improved, in the same manner as in the case of having an ethylenic double bond. The alkylene oxide has hydrophilicity and thus has an effect to increase wettability to the developer.

Here, the alkylene oxide group may be contained in a side chain having a fluoroalkyl group. Otherwise, an alkylene oxide group may be present separately from a side chain having a fluoroalkyl group, and there may be a side chain having no fluoroalkyl group.

The ink repellent agent (C2) may contain at least one side chain among a side chain having an acidic group, a side chain having an ethylenic double bond and a side chain having an alkylene oxide group. In one side chain, at least two types among an acidic group, an ethylenic double bond and an alkylene oxide group, may be contained.

The ink repellent agent (C2) may contain a side chain having an optional group, other than a side chain having an acidic group, a side chain having an ethylenic double bond and a side chain having an alkylene oxide group.

A method for introducing a side chain having an acidic group and not having a fluoroalkyl group, is preferably a method wherein a monomer having a fluoroalkyl group and a monomer having an acidic group and not having a fluoroalkyl group are copolymerized. Otherwise, an acidic group may be introduced to a polymer by various modifying methods to react a polymer having reactive sites with an optional compound.

As the monomer having a carboxy group, (meth)acrylic acid, vinyl acetic acid, crotonic acid, itaconic acid, maleic acid, fumaric acid, cinnamic acid and their salts may be mentioned. They may be used alone, or two or more of them may be used in combination.

As the monomer having a phenolic hydroxy group, o-hydroxystyrene, m-hydroxystyrene and p-hydroxystyrene may be mentioned. Further, such compounds may be mentioned wherein at least one hydrogen atom in such benzene rings is substituted by an alkyl group such as methyl, ethyl or n-butyl, an alkoxy group such as methoxy, ethoxy or n-butoxy, a halogen atom, a haloalkyl group having at least one hydrogen atom in an alkyl group substituted by a halogen atom, a nitro group, a cyano group, or an amide group.

As the monomer having a sulfo group, vinyl sulfonic acid, styrenesulfonic acid, (meth)allylsulfonic acid, 2-hydroxy-3-(meth)allyloxypropane sulfonic acid, 2-sulfoethyl(meth)acrylate, 2-sulfopropyl(meth)acrylate, 2-hydroxy-3-(meth)acryloxypropane sulfonic acid, 2-(meth)acrylamido-2-methylpropane sulfonic acid, and their salts, may be mentioned.

The method for introducing a carboxy group to a polymer by various modifying methods to react a polymer having reactive sites with an optional compound, may, for example, be 1) a method wherein a monomer having a hydroxy group is preliminarily copolymerized, and then reacted with an acid anhydride, or 2) a method wherein an acid anhydride having an ethylenic double bond is preliminarily copolymerized and then reacted with a compound having a hydroxy group.

Specific examples of the monomer having a hydroxy group may be 2-hydroxyethyl(meth)acrylate, 2-hydroxypropyl(meth)acrylate, 3-hydroxypropyl(meth)acrylate, 4-hydroxybutyl(meth)acrylate, 5-hydroxypentyl(meth)acrylate, 6-hydroxyhexyl(meth)acrylate, 4-hydroxycyclohexyl(meth)acrylate, neopentyl glycol mono(meth)acrylate, 3-chloro-2-hydroxypropyl(meth)acrylate, glycerol mono(meth)acrylate, 2-hydroxyethyl vinyl ether, 4-hydroxybutyl vinyl ether, cyclohexanediol monovinyl ether, 2-hydroxyethyl allyl ether, N-hydroxymethyl(meth)acrylamide and N,N-bis(hydroxymethyl)(meth)acrylamide. They may be used alone, or two or more of them may be used in combination.

The monomer having a hydroxyl group may be a monomer having a polyoxyalkylene chain (POA chain) with a hydroxy group at its terminal.

For example, $CH_2=CHOCH_2C_6H_{10}CH_2O(C_2H_4O)_{k1}H$, $CH_2=CHOC_4H_8O(C_2H_4O)_{k1}H$, $CH_2=CHCOOC_2H_4O(C_2H_4O)_{k1}H$, $CH_2=C(CH_3)COOC_2H_4O(C_2H_4O)_{k1}H$, $CH_2=CHCOOC_2H_4O(C_2H_4O)_{k2}(C_3H_6O)_{k3}H$ and $CH_2=C(CH_3)COOC_2H_4O(C_2H_4O)_{k2}(C_3H_6O)_{k3}H$ may be mentioned. They may be used alone, or two or more of them may be used in combination.

In the above formulae, k1 is an integer of from 1 to 100, k2 is an integer of from 0 to 100, and k3 is an integer of from 1 to 100, provided that k2+k3 is from 1 to 100.

The acid anhydride may be an acid anhydride of a compound having at least two carboxy groups in one molecule. Pivalic anhydride and trimellitic anhydride may be mentioned. Further, an acid anhydride having an ethylenic double bond, such as maleic anhydride, itaconic anhydride, citraconic anhydride, phthalic anhydride, 3-methylphthalic anhydride, methyl-5-norbornene-2,3-dicarboxylic anhydride, 3,4,5,6-tetrahydrophthalic anhydride, cis-1,2,3,6-tetrahydrophthalic anhydride or 2-buten-1-ylsuccinic hydride, may be mentioned. These may be used alone, or two or more of them may be used in combination.

The compound having a hydroxy group may be a compound having at least one hydroxy group, and the above-mentioned specific examples of the monomer having a hydroxy group may be mentioned, such as an alcohol such as ethanol, 1-propanol, 2-propanol, 1-butanol or ethylene glycol, a cellosolve such as 2-methoxyethanol, 2-ethoxyethanol or 2-butoxyethanol, and a carbitol such as 2-(2-methoxyethoxyl)ethanol, 2-(2-ethoxyethoxyl)ethanol or 2-(2-butoxyethoxyl)ethanol. Among them, a compound having one hydroxy group in its molecule is preferred. These may be used alone, or two or more of them may be used in combination.

By the above method, it is possible to introduce a side chain containing an acidic group, a side chain containing an acidic group and an ethylenic double bond, or a side chain containing an acidic group and an alkylene oxide group.

It is also possible to use a monomer not containing a hydroxyl group and an acidic group and having a polyoxyalkylene chain (POA chain), e.g. a monomer represented by the following formula (POA-1) or (POA-2).

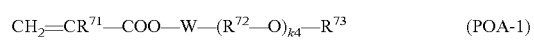

$CH_2=CR^{71}—COO—W—(R^{72}—O)_{k4}—R^{73}$ (POA-1)

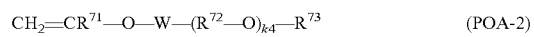

$CH_2=CR^{71}—O—W—(R^{72}—O)_{k4}—R^{73}$ (POA-2)

(in the formulae (POA-1) and (POA-2), $R^{71}$ is a hydrogen atom, a chlorine atom, a bromine atom, an iodine atom, a cyano group, a $C_{1-20}$ alkyl group, a $C_{7-20}$ alkyl group substituted by an aryl group, a $C_{6-20}$ aryl group or a $C_{3-20}$ cycloalkyl group, $R^{72}$ is a $C_{1-5}$ alkylene group, $R^{73}$ is a $C_{1-4}$ alkyl group, W is a single bond or a $C_{1-10}$ bivalent organic group having no fluorine atom, and k4 is an integer of from 6 to 30.).

Otherwise, by suitably selecting known monomers and reactions depending upon the desired composition, it is possible to obtain an ink repellent agent (C2) as a polymer which contains one or more side chains among a side chain having an acidic group, a side chain having an ethylenic double bond and a side chain having an alkylene oxide group, and which contains a side chain having fluorine atoms, preferably a fluoroalkyl group which may contain an etheric oxygen atom, and/or a side chain having a fluoroalkyl group which may contain an etheric oxygen atom. Here, in such a case, it is preferred to suitably adjust the blend proportions of the monomers to be used, so that the content of fluorine atoms in the ink repellent agent (C2) will be in the above-mentioned preferred range.

In a case where the main chain of the ink repellent agent (C2) is a novolac type main chain composed of repeating units of -Ph-$CH_2$—, usually, a polymer wherein a benzene skeleton (Ph) constituting the main chain, has a side chain with fluorine atoms, and optionally has a group with an acidic group, a group with an ethylenic double bond and an alkylene oxide group bonded thereto, is employed as the ink repellent agent (C2). The above side chain with fluorine atoms is preferably a fluoroalkyl group which may have an etheric oxygen atom and/or a side chain having a fluoroalkyl group which may have an etheric oxygen atom.

With respect to the acidic group, the group having an ethylenic double bond and the alkylene oxide group, the same ones as in the above described case of the ink repellent agent (C2) having a main chain obtainable by polymerization of a monomer having an ethylenic double bond, may be mentioned. Also in this case, it is preferred to design the molecule of the ink repellent agent (C2) so that the content of fluorine atoms in the ink repellent agent (C2) will be within the above-mentioned preferred range.

Such ink repellent agent (C2) may be produced by polymerizing a monomer having the above-mentioned respective groups preliminarily introduced to a benzene skeleton, or after obtaining a polymer having reactive sites, specifically hydroxy groups, amino groups, mercapto groups, sulfonic groups, carboxylic groups, carbonyl groups, ethylenic double bonds, etc., the above-mentioned respective groups may be introduced to the polymer by a modifying method of reacting suitable compounds to the reactive sites.

The content of the ink repellent agent (C) in the total solid content in the negative photosensitive resin composition is preferably from 0.06 to 15 mass %, more preferably from 0.13 to 5 mass %, particularly preferably from 0.25 to 1.5 mass %. When the content is at least the lower limit value in the above range, the upper surface of a cured film to be formed from the negative photosensitive resin composition will have excellent ink repellency. When it is at most the upper limit value in the above range, the adhesion between the cured film and the substrate will be good.

(Compound (D))

The compound (D) in the present invention is a compound which is a partially hydrolyzed condensate of a hydrolysable silane compound mixture (M1) containing a hydrolysable silane compound having a mercapto group and a hydrolysable group and/or a hydrolysable silane compound having a group with an ethylenic double bond and a hydrolysable group, and which contains no fluorine atom.

The compound (D) in the present invention has a nature to migrate to the upper surface in the process of forming a cured film by using a negative photosensitive resin composition containing it and thus has a function to promote migration of the above-mentioned ink repellent agent (C) to the upper surface of the cured film. The negative photosensitive resin composition is applied to form a coating film on a substrate and then, usually via a drying step, subjected to exposure to form a cured film. During the period from this coating film formation and before the exposure, the ink repellent agent (C) and the compound (D) migrate to the upper layer in the coating film.

Here, the ink repellent agent (C) has a higher speed for migration to the upper layer as compared with the compound (D), but a part of it may be left in an intermediate layer without migration to the upper layer. The compound (D) will migrate uniformly to the upper layer as a whole, although its speed for migration to the upper layer may be slow, and thus is considered to migrate as accompanied by the ink repellent agent (C) left in the intermediate layer at the time of migration to the upper layer. The ink repellent agent (C) and the compound (D) thus migrated to the upper layer are in such a relation that the ink repellent agent (C) having fluorine atoms is positioned at the upper-most layer including the upper surface, and the compound (D) is positioned beneath it. Then, this system is subjected to exposure to obtain a cured film of the present invention. In the present invention, as the negative photosensitive resin composition contains the compound (D) together with the ink repellent agent (C), it is possible to obtain a cured film having excellent ink repellency at the upper surface, as described above.

Further, in the case of forming partition walls by using the negative photosensitive resin composition of the present invention, exposure is carried out in such a state that portions corresponding to dots, of the coating film, are masked. By the exposure, exposed portions are cured to form partition walls, and non-exposed portions will be removed by subsequent development to form opening sections for forming dots. Here, as mentioned above, almost all of the ink repellent agent (C) has been migrated to the upper layer before the exposure, by the function of the compound (D), and therefore, there will be substantially no ink repellent agent (C) remaining at the opening sections at the time of developing the non-exposed portions. Further, also in the partition walls cured by the exposure, there will be substantially no ink repellent agent (C) present at their side surfaces. Thus, in the partition walls obtainable by using the negative photosensitive resin composition of the present invention, the upper surface of the partition walls has excellent ink repellency, and at the same time, the opening sections including the side walls of the partition walls have ink-philicity so that the ink can uniformly wet-spread without unevenness, even without UV/$O_3$ irradiation treatment.

The compound (D) is a partially hydrolyzed condensate of a hydrolysable silane compound mixture (M1) (hereinafter sometimes referred to simply as a "mixture (M1)") and contains no fluorine atom. Therefore, all of hydrolysable silane compounds contained in the mixture (M1) contain no fluorine atom.

The hydrolysable silane compound having a mercapto group and a hydrolysable group and containing no fluorine atom, in the mixture (M1), corresponds to the hydrolysable silane compound (s5) to be used for the above-described production of the ink repellent agent (C1). The hydrolysable silane compound (s5) in the mixture (M1) may be the same as in the case of the ink repellent agent (C1), including its preferred embodiments.

Further, the hydrolysable silane compound having a group with an ethylenic double bond and a hydrolysable group and containing no fluorine atom, in the mixture (M1), corresponds to the hydrolysable silane compound (s3) to be used for the above-described production of the ink repellent agent (C1). The hydrolysable silane compound (s3) in the mixture (M1) may be the same as in the case of the ink repellent agent (C1), including its preferred embodiments.

In order to obtain the compound (D), the mixture (M1) contains the hydrolysable silane compound (s5) and/or the hydrolysable silane compound (s3). The mixture (M1) may contain either one or both of the hydrolysable silane compound (s5) and the hydrolysable silane compound (s3). When the hydrolysable silane compound (s5) is contained, one type may be used alone, or two or more types may be used in combination. The same applies with respect to the hydrolysable silane compound (s3). The content of the hydrolysable silane compound (s5) and/or the hydrolysable silane compound (s3) in the mixture (M1) is preferably from 1 to 100 mol %, particularly preferably from 20 to 70 mol %, to the total amount of the mixture (M1). It is particularly preferred that the content of the hydrolysable silane compound (s5) is within a range of from 0 to 80 mol % to the total amount of the mixture (M1), the content of the hydrolysable silane compound (s3) is within a range of from 0 to 80 mol % to the total amount of the mixture (M1), and their total content is from 20 to 70 mol %.

In addition to the hydrolysable silane compound (s5) and/or the hydrolysable silane compound (s3), the mixture (M1) preferably optionally contains the hydrolysable silane compound (s2), a hydrolysable silane compound having an epoxy group and a hydrolysable group and containing no fluorine atom (hereinafter referred to as a hydrolysable silane compound (s6)), etc.

In the same manner as in the case of the above ink repellent agent (C1), the hydrolysable silane compound (s2) in the mixture (M1) may be used as a component to increase the film-forming properties and may be the same as the hydrolysable silane compound (s2) in the ink repellent agent (C1), including its preferred embodiments. The content of the hydrolysable silane compound (s2) in the mixture (M1) is preferably from 0 to 99 mol %, particularly preferably from 15 to 80 mol %, to the total amount of the mixture (M1). As the hydrolysable silane compound (s2), one type may be used alone, or two or more types may be used in combination.

By incorporating the hydrolysable silane compound (s6) to the mixture (M1), the adhesion to the substrate will be improved. As the hydrolysable silane compound (s6), a compound represented by the following formula (cx-6) is preferred.

$$(E-Q^6)_s\text{-}Si(R^{H6})_t X^6_{(4-s-t)} \qquad \text{(cx-6)}$$

In the formula (cx-6), the respective symbols have the following meanings.

E is an epoxy group, a glycidoxy group or a 3,4-epoxycyclohexyl group.

$Q^6$ is a $C_{1-10}$ bivalent organic group containing no fluorine atom.

$R^{H6}$ is a $C_{1-6}$ hydrocarbon group.

$X^6$ is a hydrolysable group.

s is 1 or 2, and t is 0 or 1, provided that s+t is 1 or 2.

When a plurality of $E\text{-}Q^6$ are present, they may be the same or different from each other.

When a plurality of $X^6$ are present, they may be the same or different from each other.

As $X^6$, the same group as the above $X^{11}$ and $X^{12}$ may be employed.

As $Q^6$, a $C_{1-10}$ alkylene group is preferred, a $C_{1-5}$ alkylene group is more preferred, and a $C_{1-3}$ alkylene group is particularly preferred.

As $R^{H6}$, the same group as the above $R^{H11}$ and $R^{H12}$ may be employed.

Specific examples of the compound (cx-6) may be $E\text{-}(CH_2)_2\text{—}Si(OCH_3)_3$, $E\text{-}(CH_2)_3\text{—}Si(OCH_3)_3$, $E\text{-}(CH_2)_3\text{—}Si(OCH_2CH_3)_3$, $E\text{-}(CH_2)_3\text{—}Si(CH_3)(OCH_2CH_3)_3$, etc. Among them, 2-(3,4-epoxycyclohexyl)ethyltrimethoxysilane, 3-glycidoxypropyltrimethoxysilane, 3-glycidoxypropyltriethoxysilane, 3-glycidoxypropylmethyldiethoxysilane, etc. are preferred.

The content of the hydrolysable silane compound (s6) in the mixture (M1) is preferably from 0 to 99 mol %, preferably from 15 to 80 mol %, particularly preferably from 15 to 50 mol % to the total amount of the mixture (M1). As the hydrolysable silane compound (s6), one type may be used alone, or two or more types may be used in combination.

The mixture (M1) may further optionally contain the hydrolysable silane compound (s4) as described for the above ink repellent agent (C1) or other hydrolysable silane compounds.

The compound (D) is a partially hydrolyzed condensate of the mixture (M1). As an example of the compound (D), an average composition formula of a compound (D1) as a partially hydrolyzed condensate of the following mixture (M11) will be shown by the following formula (D1).

The mixture (M11) contains a compound (cx-5) as the hydrolysable silane compound (s5) and/or a compound (cx-3) as the hydrolysable silane compound (s3) and optionally contains a compound (cx-2) as the hydrolysable silane compound (s2) and a compound (cx-6) as the hydrolysable silane compound (s6).

$$[(Y\text{-}Q^3)_g\text{-}Si(R^{H3})_h SiO_{(4-g-h)/2}]_{m1} \cdot [(HS\text{-}Q^5)_p\text{-}Si(R^{H5})_q O_{(4-p-q)/2}]_{m2} \cdot [SiO_2]_{m3} \cdot [(E\text{-}Q^6)_s\text{-}Si(R^{H6})_t O_{(4-s-t)/2}]_{m4} \qquad \text{(D1)}$$

In the formula (D1), m1 to m4 are molar fractions of the respective constituting units to the total molar amount of the respective constituting units. m1>0, m2>0, m3≥0, and m4≥0, provided that m1+m2+m3+m4=1. Other symbols are as defined above.

Here, the compound (D1) is actually a formed product (partially hydrolyzed condensate) having hydrolysable groups or silanol groups remained, and such a formed product is hardly represented by a chemical formula. The average composition formula represented by the formula (D1) is a chemical formula in a case where it is assumed that in the compound (D1), all of hydrolysable groups and silanol groups have become to be siloxane bonds. Further, in the formula (D1), units derived respectively from the compounds (cx-la), (cx-2) to (cx-5) are assumed to be randomly arranged.

In the average composition formula represented by the formula (D1), m1:m2:m3:m4 agrees to the charged composition of the compounds (cx-3), (cx-5), (cx-2), (cx-6) in the mixture (M1). The molar ratios of the respective components will be designed from the balance of the effects of the respective components. Specific molar ratios may be calculated from mol % of the above-described respective components.

Further, the above preferred molar ratio of the respective components may similarly apply to a case where the mixture (M1) contains the hydrolysable silane compound (s5) and/or the hydrolysable silane compound (s3) and optionally contains the hydrolysable silane compounds (s2) and (s6). That is, the preferred amounts of the hydrolysable silane compounds (s5), (s3), (s2) and (s6) to be charged in the mixture (M1) in order to obtain the compound (D) correspond, respectively, to the above preferred ranges of m1 to m4.

The mass average molecular weight (Mw) of the compound (D) is preferably at least 150, preferably at most 3,000, particularly preferably from 500 to 2,000.

When the mass average molecular weight (Mw) is at least the lower limit value, the compound (D) tends to hardly migrate to the upper surface at the time of forming a cured film by using the negative photosensitive resin composition. When it is less than the upper limit value, the solubility of the compound (D) in a solvent will be good.

The mass average molecular weight (Mw) of the compound (D) can be adjusted by the production conditions.

The compound (D) may be produced by subjecting the above-described mixture (M1) to hydrolysis and condensation reaction by a known method.

For this reaction, it is preferred to use, as a catalyst, an inorganic acid such as hydrochloric acid, sulfuric acid, nitric acid or phosphoric acid, or an organic acid such as acetic acid, oxalic acid or maleic acid, which is commonly used.

In the above reaction, a known solvent may be employed.

The compound (D) obtainable by the above reaction may be incorporated to the negative photosensitive resin composition together with a solvent.

As the compound (D), one type may be used alone, or two or more types may be used in combination.

The content of the compound (D) in the total solid content in the negative photosensitive resin composition is preferably from 0.001 to 20 mass %, more preferably from 0.01 to 10 mass %, particularly preferably from 0.05 to 5 mass %. When the content is at least the lower limit value in the above range, the upper surface of a cured film to be formed from the negative photosensitive resin composition will have excellent ink repellency, and at the same time, when the cured film is partition walls, opening sections will have ink-philicity and will be excellent in wet-spreadability of ink. When it is at most the upper limit value, the storage stability will be good.

(Cross-Linking Agent (E))

The cross-linking agent (E) to be optionally contained in the negative photosensitive resin composition of the present invention is a compound having at least 2 ethylenic double bonds per molecule and having no acidic group. When the negative photosensitive resin composition contains the cross-linking agent (E), the curability of the negative photosensitive resin composition at the time of exposure will be improved, and it becomes possible to form a cured film even at a low exposure amount.

As the cross-linking agent (E), diethylene glycol di(meth)acrylate, trimethylolpropane tri(meth)acrylate, pentaerythritol tri(meth)acrylate, pentaerythritol tetra(meth)acrylate, ditrimethylolpropane tetra(meth)acrylate, dipentaerythritol penta(meth)acrylate, dipentaerythritol hexa(meth)acrylate, ethoxylated isocyanuric acid tri(meth)acrylate, tris-(2-acryloxyethyl) isocyanurate, E-caprolactone-modified tris-(2-acryloxyethyl) isocyanurate and urethane acrylate may, for example, be mentioned.

From the viewpoint of optical reactivity, it is preferred to have many ethylenic double bonds. For example, pentaerythritol tetra(meth)acrylate, ditrimethylolpropane tetra(meth)acrylate, dipentaerythritol hexa(meth)acrylate, dipentaerythritol penta(meth)acrylate, ethoxylated isocyanuric acid tri(meth)acrylate and urethane acrylate are preferred.

As the cross-linking agent (E), one type may be used alone, or two or more types may be used in combination.

The content of the cross-linking agent (E) in the negative photosensitive resin composition is preferably from 10 to 60 mass %, particularly preferably from 20 to 55 mass %.

(Solvent (F))

When the negative photosensitive resin composition of the present invention contains a solvent (F), the viscosity is reduced, and application of the negative photosensitive resin composition to a substrate surface becomes easy. As a result, it is possible to form a coating film of the negative photosensitive resin composition having a uniform film thickness.

As the solvent (F), a known solvent may be used. As the solvent (F), one type may be used alone, or two or more types may be used in combination.

As the solvent (F), alkylene glycol alkyl ethers, alkylene glycol alkyl ether acetates, alcohols, solvent naphthas, etc. may be mentioned. Among them, at least one solvent selected from the group consisting of alkylene glycol alkyl ethers, alkylene glycol alkyl ether acetates and alcohols is preferred, and at least one solvent selected from the group consisting of propylene glycol monomethyl ether acetate, propylene glycol monomethyl ether, diethylene glycol ethylmethyl ether and 2-propanol is more preferred.

The content of the solvent (F) in the negative photosensitive resin composition is preferably 50 to 99 mass %, more preferably from 60 to 95 mass %, particularly preferably from 65 to 90 mass %, to the total amount of the composition.

(Colorant (G))

The negative photosensitive resin composition of the present invention may contain a colorant (G) in order to impart light shielding properties to a curd film, particularly to partition walls, depending upon the particular application. As the colorant (G) in the present invention, carbon black, aniline black, anthraquinone-type black pigment and perylene-type black pigment, specifically C.I. pigment black 1, 6, 7, 12, 20, 31, etc., may be mentioned. It is also possible to use a mixture of organic pigments and/or inorganic pigments such as red pigments, blue pigments and green pigments.

As the colorant (G), one type may be used alone, or two or more types may be used in combination. In a case where the negative photosensitive resin composition of the present invention contains the colorant (G), the content of the colorant (G) in the total solid content is preferably from 15 to 65 mass %, particularly preferably from 20 to 50 mass %. Within such a range, the obtainable negative photosensitive resin composition will have good sensitivity, and partition walls to be formed will be excellent in light-shielding properties.

(Other Components)

The negative photosensitive resin composition in the present invention may further contain one or more of other additives such as a thermal cross-linking agent, a polymer dispersant, a dispersion assistant, a silane coupling agent, fine particles, a phosphoric acid compound, a curing accelerator, a thickener, a plasticizer, a defoaming agent, a leveling agent, a cissing preventive agent and an ultraviolet absorber, as the case requires.

The negative photosensitive resin composition of the present invention is obtained by mixing prescribed amounts of the above-described respective components.

By using the negative photosensitive resin composition of the present invention, it is possible to form a cured resin film, particularly partition walls, having good ink repellency on the upper surface. The obtainable cured resin film is excellent in adhesion to a substrate on which the cured film is formed. Especially in the case of partition walls, since the adhesion to the substrate is excellent, peeling during the development is prevented, and thus, it is possible to obtain partition walls which present an optical element having a high resolution. At that time, in opening sections partitioned by the partition walls, the ink repellent agent is less likely to remain, and thus, it is possible to obtain opening sections wherein the ink can uniformly wet-spread without unevenness, even without UV/$O_3$ irradiation treatment.

[Cured Resin Film and Partition Walls in Second Embodiment]

The cured resin film in the second embodiment of the present invention is formed by using the above-described negative photosensitive resin composition of the present invention. The cured resin film in the second embodiment of the present invention may be obtained, for example, by applying the negative photosensitive resin composition of the present invention on the surface of a base material such as a substrate, and drying it to remove a solvent, etc., as the case requires, followed by exposure for curing. The cured resin film to be formed on a substrate by using the negative photosensitive resin composition of the present invention is a cured resin film within the scope of the cured resin film in the first embodiment of the present invention which has the characteristic (I) as a characteristic of the surface and the characteristic (II) as a characteristic in the interfacial region to the substrate, and also has the characteristic (III) in the interior of the cured resin film, in the analyses by means of XPS and TOF-SIMS.

The partition walls of the present invention are partition walls made of the above-described resin cured film of the present invention, formed in a form to partition the substrate surface into a plurality of compartments for forming dots. The partition walls are obtained, for example, in such a manner that in the above-described production of a cured resin film, portions to become compartments for forming dots are masked before exposure, followed by exposure and then by development. By the development, the masked non-exposed portions are removed, whereby opening sections corresponding to the compartments for forming dots are formed together with partition walls.

Now, an example of the method for producing partition walls in an embodiment of the present invention will be described with reference to FIGS. 4A to 4D, but the method for producing partition walls is by no means limited to the following. Here, the following production method will be described as one wherein the negative photosensitive resin composition contains a solvent (F).

Figure 4A:
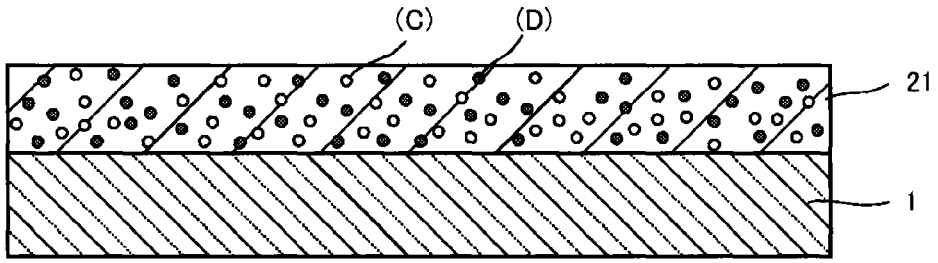
FIG. 4A is a process chart schematically illustrating a method for producing partition walls in an embodiment of the present invention.

As shown in FIG. 4A, the negative photosensitive resin composition is applied over the entire main surface on one side of a substrate 1 to form a coating film 21. At that time, in the coating film 21, an ink repellent agent (C) and a compound (D) are wholly dissolved and uniformly dispersed. Here, in FIG. 4A, the ink repellent agent (C) and the compound (D) are schematically shown, and in reality, they are not present in the form of such particles.

Figure 4B:
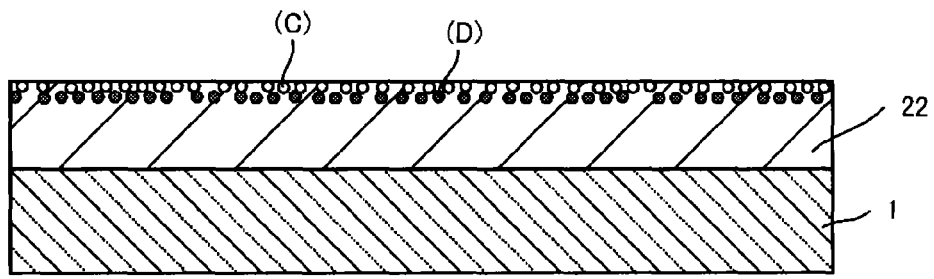
FIG. 4B is a process chart schematically illustrating a method for producing partition walls in an embodiment of the present invention.

Then, as shown in FIG. 4B, the coating film 21 is dried to form a dried film 22. The drying method may, for example, be heat drying, vacuum drying, vacuum heat drying, etc. In the case of heat drying, the heating temperature is preferably from 50 to 120° C., although it may depend on the type of the solvent (F).

During this drying process, the ink repellent agent (C) and the compound (D) will migrate to the upper layer of the dried film. The behavior of the ink repellent agent (C) and the compound (D) is as described above, and the ink repellent agent (C) and the compound (D) migrated to the upper layer will be in such a relation that the ink repellent agent (C) having fluorine atoms is positioned at the upper-most layer including the upper surface, and the compound (D) is positioned at a layer beneath it. Here, even in a case where the negative photosensitive resin composition does not contain a solvent (F), the upward migration of the ink repellent agent (C) and the compound (D) in the coating film will be accomplished in the same manner.

Figure 4C:
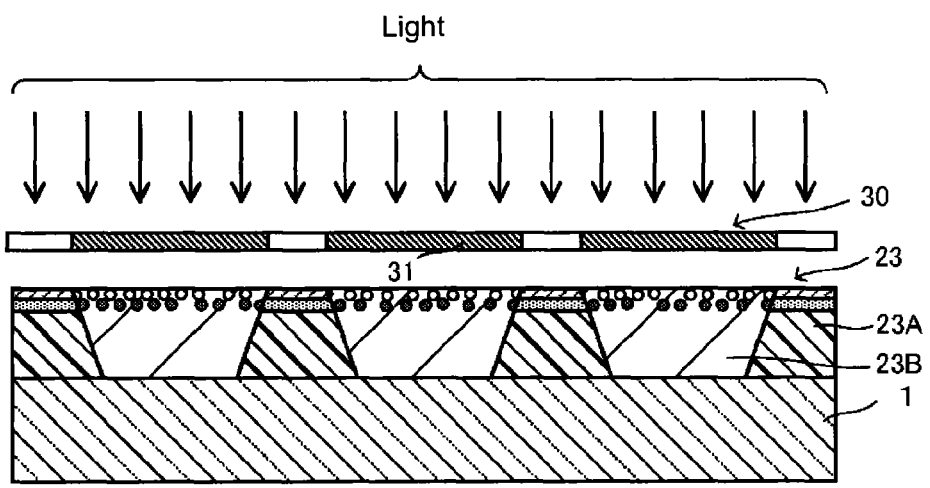
FIG. 4C is a process chart schematically illustrating a method for producing partition walls in an embodiment of the present invention.

Then, as shown in FIG. 4C, light is applied to the dried film 22 for exposure via a photomask 30 having masking portions 31 in a form corresponding to opening sections partitioned by partition walls. The film after exposure of the dried film 22 will be referred to as an exposed film 23. In the exposed film 23, exposed portions 23A are photo-cured, and non-exposed portions 23B are in the same state as the dried film 22.

The light for irradiation may, for example, be visible light; ultraviolet light; far ultraviolet light; excimer laser light such as KrF excimer laser light, ArF excimer laser light, $F_2$ excimer laser light, $Kr_2$ excimer laser light, KrAr excimer laser light or $Ar_2$ excimer laser light; X-rays; electron rays; etc.

As the light for irradiation, light with a wavelength of from 100 to 600 nm is preferred, light with a wavelength of from 300 to 500 nm is more preferred, and light including i-line (365 nm), h-line (405 nm) or g-line (436 nm) is particularly preferred. Further, as the case requires, light of 330 or less may be cut.

The exposure system may be whole surface integrated exposure or scanning exposure. Or, the same portion may be exposed plural times, and in such a case, the exposure conditions for the plural times may be the same or different.

In each of such exposure systems, the exposure amount may, for example, be preferably from 5 to 1,000 $mJ/cm^2$, more preferably from 5 to 500 $mJ/cm^2$, further preferably from 5 to 300 $mJ/cm^2$, particularly preferably from 5 to 200 $mJ/cm^2$, most preferably from 5 to 50 $mJ/cm^2$. Here, the exposure amount is optimized depending upon the wavelength of light to be applied, the composition of the negative photosensitive resin composition, the thickness of the coating film, etc.

The exposure time per unit area is not particularly limited and may be designed from the exposure power of the exposure apparatus to be used and the necessary exposure amount, etc. Here, in the case of scanning exposure, the exposure time may be determined from the scanning speed of light.

The exposure time per unit area is usually from about 1 to 60 seconds.

Figure 4D:
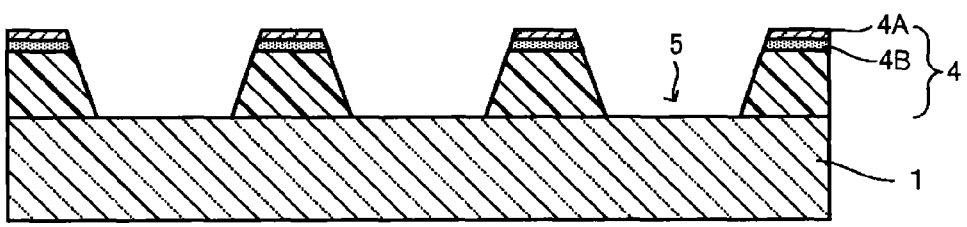
FIG. 4D is a process chart schematically illustrating a method for producing partition walls in an embodiment of the present invention.

Then, as shown in FIG. 4D, development by using an alkaline developer is carried out to form partition walls 4 made solely of portions corresponding to exposed portions 23A of the exposed film 23. Opening sections 5 partitioned by partition walls 4 are areas where non-exposed portions 23B were present in the exposed film 23, and FIG. 4D shows the state after the non-exposed portions 23B have been removed by development. The non-exposed portions 23B are dissolved and removed by the alkaline developer in such a state that, as described above, the ink repellent agent (C) and the compound (D) have migrated to the upper layer so that the ink repellent agent (C) and the compound (D) are no longer substantially present in the lower layer thereof, and therefore, the ink repellent agent (C) and the compound (D) do not substantially remain in the opening sections 5.

Here, in the partition walls 4 shown in FIG. 4D, the upper-most layer including the upper surface is an ink repellent layer 4A. At the time of exposure, the ink repellent agent (C) may be present as it is at a high concentration to constitute an ink repellent layer, however, depending upon the type of the ink repellent agent (C), the ink repellent agent (C) may be photo-cured to each other and/or together with other photocurable component to form an ink repellent layer 4A wherein the ink repellent agent (C) is firmly bonded. Further, beneath the ink repellent layer 4A, a layer 4B is formed wherein the compound (D) is gathered at a high concentration and photo-cured to each other and/or together with other photocurable component.

After the development, the partition walls 4 may further be heated. The heating temperature is preferably from 130 to 250° C. By the heating, curing of the partition walls 4 will be further strengthened. Further, the ink repellent agent (C) will be more firmly bonded in the ink repellent layer 4A.

The cured resin film and partition walls of the present invention thus obtainable, have good ink repellency at the upper surface and at the same time, they are excellent in adhesion to the substrate. Further, with the partition walls, the ink repellent agent will not substantially remain in the opening sections after the development, and thus, it is possible to sufficiently secure wet-spreadability of ink at the opening sections even without $UV/O_3$ irradiation treatment.

At the time of carrying out pattern printing by an IJ method, the partition walls of the present invention are useful as partition walls to define the opening sections to be ink injection regions. If the partition walls of the present invention are formed and used so that the opening sections correspond to desired ink injection regions at the time of carrying out pattern printing by an IJ method, since the upper surface of the partition walls selectively has good ink repellency, it is possible to prevent the ink from being injected beyond the partition walls to undesired opening sections i.e. undesired ink injection regions. Further, the opening sections defined by the partition walls have good wet-spreadability of ink, whereby it becomes possible to uniformly print the ink at the desired regions without white spots, etc. The partition walls of the present invention are excellent in adhesion to the substrate, whereby peeling during the development is prevented, and it is possible to present an optical element having a high resolution.

The partition walls to be formed from the negative photosensitive resin composition of the present invention have, for example, a width of preferably at most 100 μm, particularly preferably at most 20 µm. Further, the distance (the pattern width) between the adjacent partition walls is preferably at most 300 µm, particularly preferably at most 100 µm. The height of the partition walls is preferably from 0.05 to 50 µm, particularly preferably from 0.2 to 10 µm.

By using the partition walls of the present invention, as mentioned above, pattern printing by an IJ method can be exquisitely carried out. Thus, the partition walls of the present invention are useful as partition walls of an optical element having partition walls located between a plurality of dots and their adjacent dots on a substrate surface, on which the dots are formed by an IJ method.

[Optical Element]

The optical element of the present invention is an optical element having the partition walls of the present invention located between a plurality of dots and their adjacent dots on a substrate surface. In the optical element of the present invention, the dots are preferably formed by an IJ method.

Now, an optical element in an embodiment of the present invention will be described with reference to a case where it is produced by an IJ method. However, the method for producing the optical element of the present invention is not limited to the following one.

Figure 5A:
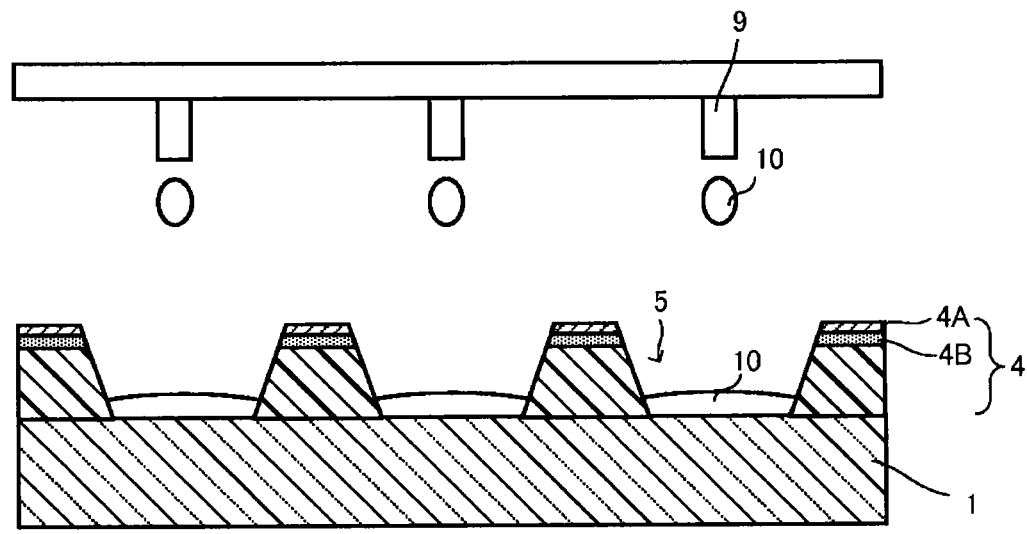
FIG. 5A is a process chart schematically illustrating a method for producing an optical element in an embodiment of the present invention.
Figure 5B:
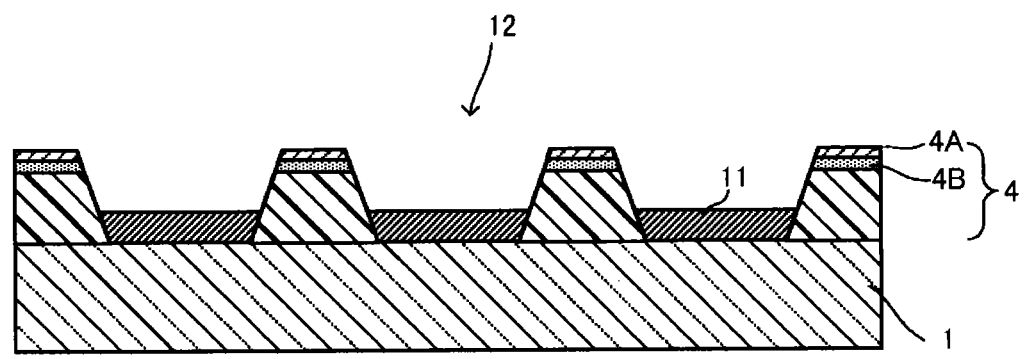
FIG. 5B is a process chart schematically illustrating a method for producing an optical element in an embodiment of the present invention.

FIGS. 5A to 5B schematically illustrate a method for producing an optical element by using the partition walls 4 formed on a substrate 1 as shown in the above-described FIG. 4D. Here, the partition walls 4 formed on a substrate 1 are ones formed so that opening sections 5 would agree to the pattern of dots of the optical element to be produced.

As shown in FIG. 5A, an ink 10 is dropped from an ink jet head 9 into opening sections 5 defined by partition walls 4 so that a predetermined amount of the ink 10 is injected into the opening sections 5. As the ink, an ink known for an optical element is suitably selected for use to meet the functions of dots.

Then, depending upon the type of the ink 10 used, for example, removal of a solvent, or for curing, treatment such as drying and/or heating, etc. may be applied to obtain, as shown in FIG. 5B, an optical element 12 having desired dots 11 formed in a form being adjacent to the partition walls 4.

The optical element of the present invention employs the partition walls of the present invention, whereby an ink can uniformly wet-spread without unevenness in opening sections partitioned by the partition walls during the process for its production, and thus is an optical element having dots formed with high precision.

As the optical element, an organic EL element, a color filter of a liquid crystal element, an organic TFT array element, etc. may be mentioned.

The organic TFT array element is an element wherein a plurality of dots are arranged in a planar view matrix form, each dot is provided with image electrodes and TFT as a switching element to drive them, and an organic semiconductor layer is used as a semiconductor layer including a channel layer of TFT.

The organic TFT array element is used as a TFT array substrate for e.g. an organic EL element or a liquid crystal element.

The organic EL element may be produced, for example, as follows.

On a light transmitting substrate of e.g. glass, a light transmitting electrode of e.g. tin-doped indium oxide (ITO) is deposited by e.g. a sputtering method. As the case requires, this light transmitting electrode may be subjected to patterning.

Then, using the negative photosensitive resin composition of the present invention, partition walls are formed in a planar view lattice form along outlines of respective dots, by a photolithography method including coating, exposure and development.

Then, into the dots, by an IJ method, materials for a hole injection layer, a hole transport layer, a luminescent layer, a hole blocking layer and an electron injection layer are respectively applied and dried to sequentially laminate these layers. The types and number of organic layers to be formed in the dots are suitably designed.

Finally, a reflecting electrode of e.g. aluminum is formed by e.g. a vapor deposition method.

EXAMPLES

Now, the present invention will be described with reference to Examples, but it should be understood that the present invention is by no means thereby limited. Examples for the negative photosensitive resin composition of the present invention will be shown in Ex. 1 to 29, and Comparative Examples will be shown in Ex. 31 to 35. Further, Examples for the cured resin film in the first embodiment of the present invention will be shown in Ex. 1 to 29 and Ex. 33.

The respective measurements were conducted by the following methods. [Number average molecular weight (Mn), mass average molecular weight (Mw)]

A number average molecular weight (Mn) and a mass average molecular weight (Mw) were measured by a gel permeation chromatography method using polystyrene as the standard substance. As gel permeation chromatography, HPLC-8220GPC (manufactured by Tosoh Corporation) was used. As the column, one having three columns of shodex LF-604 connected, was used. As the detector, a RI detector was used. As the standard substance, EasiCal PS1 (manufactured by Polymer Laboratories Ltd.) was used. Further, at the time of measuring a number average molecular weight and a mass average molecular weight, the column was held at 37° C., tetrahydrofuran was used as the eluent, the flow rate was adjusted to be 0.2 mL/min., and 40 µL of a 0.5% tetrahydrofuran solution of a sample to be measured, was injected.

[Content of Fluorine Atoms]

The content of fluorine atoms was calculated by $^{19}F$ NMR measurement using 1,4-ditrifluoromethylbenzene as the standard substance.

[Content of ethylenic double bonds (C=C)]

The content of ethylenic double bonds was calculated from the blend proportions of raw materials.

[Acid Value]

The acid value was theoretically calculated from the blend proportions of raw materials.

Abbreviations of compounds used in the following Examples are shown below. (Alkali-soluble resin (AP))

Alkali-soluble resin (A1) composition: A composition (solid content: 70 mass %, solvent naphtha: 30 mass %) of a resin (alkali-soluble resin (A1), acid value: 60 mgKOH/g) obtained by purifying with hexane a resin having acryloyl groups and carboxy groups introduced by reacting a cresol novolac-type epoxy resin with acrylic acid and then with 1,2,3,6-tetrahydrophthalic anhydride.

Alkali-soluble resin (A2) composition: A composition (solid content: 70 mass %, solvent naphtha: 30 mass %) of a resin (alkali-soluble resin (A2), acid value: 98 mgKOH/g) obtained by purifying with hexane a resin having acryloyl groups and carboxy groups introduced by reacting a bisphenol A-type epoxy resin with acrylic acid and then with 1,2,3,6-tetrahydrophthalic anhydride.

Alkali-soluble resin (A3) composition: A composition (solid content: 55 mass %, PGMEA: 45 mass %) of a resin (alkali-soluble resin (A3), acid value: 60 mgKOH/g) obtained by purifying with hexane a resin having acryloyl groups and carboxy groups introduced by reacting a fluorene-type epoxy resin with acrylic acid and then with 1,2,3,6-tetrahydro phthalic anhydride.

(Photopolymerization Initiator (B))

IR907: Tradename: IRGACURE 907, 2-methyl-1-[4-(methylthio)phenyl]-2-morpholinopropan-1-one (manufactured by BASF)

OXE02: Tradename: IRGACURE OXE 02, ethanone 1-[9-ethyl-6-(2-methylbenzoyl)-9H-carbazol-3-yl]-1-(O-acetyloxime) (manufactured by BASF)

IR819: Tradename: IRGACURE 819, bis(2,4,6-trimethylbenzoyl)-phenylphosphine oxide (manufactured by BASF)

IR369: Tradename: IRGACURE 369,2-benzyl-2-dimethylamino-1-(morpholinophenyl)-butan-1-one (manufactured by BASF)

EAB: 4,4'-bis(diethylamino)benzophenone (manufactured by Tokyo Chemical Industry Co., Ltd)

(Raw Materials for Ink Repellent Agent (C1) and Compound (D))

Compound (cx-11) corresponding to compound (cx-1): $CF_3(CF_2)_5CH_2CH_2Si(OCH_3)_3$ (produced by a known method).

Compound (cx-12) corresponding to compound (cx-1): $CF_3(CF_2)_7CH_2CH_2Si(OCH_3)_3$ (produced by a known method).

Compound (cx-13) corresponding to compound (cx-1): $CF_3(CF_2)_3CH_2CH_2Si(OCH_3)_3$ (produced by a known method).

Compound (cx-21) corresponding to compound (cx-2): $Si(OC_2H_5)_4$ (manufactured by Colcoat Co., Ltd.)

Compound (cx-31) corresponding to compound (cx-3): $CH_2=CHCOO(CH_2)_3Si(OCH_3)_3$ (manufactured by Tokyo Chemical Industry Co., Ltd.).

Compound (cx-41) corresponding to compound (cx-4): $(CH_3)_3SiOCH_3$ (manufactured by Tokyo Chemical Industry Co., Ltd.).

Compound (cx-42) corresponding to compound (cx-4): $Ph-Si(OCH_2CH_3)_3$ (in the formula, Ph is a phenyl group, tradename: KBE-103, manufactured by Shin-Etsu Chemical Co., Ltd.).

Compound (cx-43) corresponding to compound (cx-4): $C_{10}H_{21}—Si(OCH_3)_3$ (tradename: KBM-3103C, manufactured by Shin-Etsu Chemical Co., Ltd.).

Compound (cx-51) corresponding to compound (cx-5): $HS(CH_2)_3Si(OCH_3)_3$ (tradename: KBM-803, manufactured by Shin-Etsu Chemical Co., Ltd.).

Compound (cx-61) corresponding to compound (cx-6): $Ep-CH_2O(CH_2)_3Si(OCH_3)_3$ (in the formula, Ep is an epoxy group, tradename: KBM-403, manufactured by Shin-Etsu Chemical Co., Ltd.).

(Raw Materials for Ink Repellent Agent (C2))

C6FMA: $CH_2=C(CH_3)COOCH_2CH_2(CF_2)_6F$.

C4α-Cl acrylate: $CH_2=C(Cl)COOCH_2CH_2(CF_2)_4F$.

MAA: Methacrylic acid.

2-HEMA: 2-Hydroxyethyl methacrylate.

IBMA: Isobornyl methacrylate.

V-65: (2,2'-Azobis(2,4-dimethylvaleronitrile, manufactured by Wako Pure Chemical Industries, Ltd.).

n-DM: n-Dodecyl mercaptan.

BEI: Karenz BEI (1,1-(bisacryloyloxymethyl)ethyl isocyanate, manufactured by Showa Denko K.K.).

AOI: Karenz AOI (2-acryloyloxyethyl isocyanate, manufactured by Showa Denko K.K.).

DBTDL: Dibutyltin dilaurate.

TBQ: t-Butyl-p-benzoquinone.

MEK: 2-Butanone.

(Cross-Linking Agent (E))

A9530: Tradename: NK Ester A-9530, manufactured by Shin-Nakamura Chemical Co., Ltd., mixed product of dipentaerythritol hexaacrylate and dipentaerythritol pentaacrylate.

A9550: Tradename: NK Ester A-9550, manufactured by Shin-Nakamura Chemical Co., Ltd., mixed product of dipentaerythritol hexaacrylate and dipentaerythritol pentaacrylate.

A9300: Tradename: NK Ester A-9300, manufactured by Shin-Nakamura Chemical

Co., Ltd., tris(2-acryloxyethyl) isocyanurate.

A-DPH: Tradename: NK Ester A-DPH, manufactured by Shin-Nakamura Chemical Co., Ltd., dipentaerythritol hexaacrylate.

(Solvent (F))

PGMEA: Propylene glycol monomethyl ether acetate.

PGME: Propylene glycol monomethyl ether.

EDM: Diethylene glycol ethylmethyl ether.

IPA: 2-Propanol.

[Synthesis of Compound (D)]

Compound (D) and compound (Dx) as a partially hydrolyzed condensate of a non-fluorinated hydrolysable silane compound, not classified in compound (D), were synthesized as follows.

Synthesis Example 1

Synthesis of Compound (D-1)

Into a 100 cm$^3$ three necked flask equipped with a stirrer, 3 g of compound (cx-21) and 2.82 g of compound (cx-51) were put to obtain a mixture of hydrolysable silane compounds. Then, to this mixture, 17.5 g of PGME was added to obtain a raw material solution.

To the obtained raw material solution, 3.63 g of a 1% nitric acid aqueous solution was dropwise added. After completion of the dropwise addition, stirring was conducted at room temperature for 24 hours to obtain a PGME solution of compound (D-1) (concentration of compound (D-1): 10 mass %, hereinafter referred to also as "compound (D-1) solution").

Further, after completion of the reaction, components of the reaction solution were measured by gas chromatography to confirm that the respective compounds as raw materials became lower than the detective limit.

The number average molecular weight (Mn) and mass average molecular weight (Mw) of obtained compound (D-1) were measured, and the results are shown in Table 1 together with charged amounts of raw material hydrolysable silane compounds, etc. used for the production. In Table 1, silane compounds mean hydrolysable silane compounds.

Synthesis Examples 2 to 10

Syntheses of Compounds (D-2) to (D-8), (Dx-1) and (Dx-2)

In the same manner as in Synthesis Example 1 except that the raw material composition was changed as shown in Table 1, PGME solutions of compounds (D-2) to (D-8), (Dx-1) and (Dx-2) were respectively obtained (compound concentration in each solution: 10 mass %, hereinafter, the respective solutions may be referred to also as "(D-2) solution" to "(D-8) solution", "(Dx-1) solution" and "(Dx-2) solution").

The number average molecular weight (Mn) and mass average molecular weight (Mw) of obtained each compound were measured, and the results are shown in Table 1 together with charged amounts of raw material hydrolysable silane compounds, etc. used for the production.

to confirm that the respective compounds as raw materials became lower than the detective limit.

Charged amounts of raw material hydrolysable silane compounds, etc. used for the production of the obtained ink repellent agent (C1-1) are shown in Table 2. In Table 2, silane compounds mean hydrolysable silane compounds. Further, the number average molecular weight (Mn), the mass average molecular weight (Mw), the content of fluo-

TABLE 1

| Synthesis Examples | | 1 | 3 | 4 | 5 | 6 | 7 | 8 | 9 | 2 | 10 |
|---|---|---|---|---|---|---|---|---|---|---|---|
| | Compound (D, Dx) | (D-1) | (D-2) | (D-3) | (D-4) | (D-5) | (D-6) | (D-7) | (D-8) | (Dx-1) | (Dx-2) |
| | Mn | 820 | 940 | 830 | 880 | 930 | 800 | 800 | 910 | 840 | 980 |
| | Mw | 900 | 1.020 | 940 | 950 | 1.020 | 980 | 950 | 1.000 | 980 | 1.100 |
| Charged | Compound (cx-21) | 3.00 | 3.01 | 2.00 | 1.99 | 2.00 | 2.00 | 0.00 | 0.00 | 3.01 | 3.00 |
| amounts (g) of | Compound (cx-31) | 0.00 | 3.37 | 0.00 | 2.25 | 2.25 | 0.75 | 0.00 | 2.00 | 0.00 | 0.00 |
| silane | Compound (cx-51) | 2.82 | 0.00 | 1.89 | 1.89 | 0.00 | 0.63 | 2.00 | 0.00 | 0.00 | 0.00 |
| compounds, etc. | Compound (cx-61) | 0.00 | 0.00 | 2.27 | 0.00 | 2.27 | 0.76 | 0.00 | 0.00 | 3.40 | 0.00 |
| | PGME | 17.5 | 22.4 | 24.4 | 24.3 | 27.7 | 13.9 | 9.9 | 11.2 | 22.7 | 0.1 |
| | 1% Nitric acid aqueous solution | 3.63 | 3.63 | 3.46 | 3.46 | 3.46 | 2.42 | 1.01 | 0.92 | 3.62 | 2.07 |
| Charged molar | Compound (cx-21) | 0.50 | 0.50 | 0.33 | 0.33 | 0.33 | 0.50 | 0.00 | 0.00 | 0.50 | 1.00 |
| ratios of silane | Compound (cx-31) | 0.00 | 0.50 | 0.00 | 0.33 | 0.33 | 0.17 | 0.00 | 1.00 | 0.00 | 0.00 |
| compounds | Compound (cx-51) | 0.50 | 0.00 | 0.33 | 0.33 | 0.00 | 0.17 | 1.00 | 0.00 | 0.00 | 0.00 |
| | Compound (cx-61) | 0.00 | 0.00 | 0.33 | 0.00 | 0.33 | 0.17 | 0.00 | 0.00 | 0.50 | 0.00 |

[Synthesis of Ink Repellent Agent (C)]

Ink repellent agent (C1) and ink repellent agent (C2) were synthesized or prepared as follows.

Synthesis Example 21

Synthesis of Ink Repellent Agent (C1-1)

Into a 1,000 cm³ three necked flask equipped with a stirrer, 15 g of compound (cx-11), 20 g of compound (cx-21) and 27 g of compound (cx-31) were put to obtain a mixture of hydrolysable silane compounds. Then, to this mixture, 284.3 g of PGME was added to obtain a raw material solution.

To the obtained raw material solution, 30 g of a 1% hydrochloric acid aqueous solution was dropwise added. After completion of the dropwise addition, stirring was conducted at 40° C. for 5 hours to obtain a PGME solution of ink repellent agent (C1-1) (concentration of ink repellent agent (C1-1): 10 mass %, hereinafter referred to also as "ink repellent agent (C1-1) solution").

Further, after completion of the reaction, components of the reaction solution were measured by gas chromatography rine atoms, the content of C=C and the acid value of the obtained ink repellent agent (C1-1) were measured, and the results are shown in Table 3.

Synthesis Examples 22 to 30

Syntheses of Ink Repellent Agents (C1-2) to (C1-7)

In the same manner as in Synthesis Example 21 except that the raw material composition was changed as shown in Table 2, solutions of ink repellent agents (C1-2) to (C1-7) were respectively obtained (compound concentration in each solution: 10 mass %, hereinafter, the respective solutions may be referred to also as "ink repellent agent (C1-2) solution" to "(C1-7) solution").

Charged amounts of raw material hydrolysable silane compounds, etc. used for the production of obtained each ink repellent agent are shown in Table 2. Further, the number average molecular weight (Mn), the mass average molecular weight (Mw), the content of fluorine atoms, the content of C=C and the acid value of the obtained ink repellent agent were measured, and the results are shown in Table 3.

TABLE 2

| Synthesis Examples | | 21 | 22 | 23 | 24 | 25 | 26 | 27 | 28 | 29 | 30 |
|---|---|---|---|---|---|---|---|---|---|---|---|
| Ink repellent agent (C) | | (C1-1) | (C1-2) | (C1-3) | (C1-4) | (C1-5) | (C1-6) | (C1-7) | (C1-8) | (C1-9) | (C1-10) |
| Charged | Compound (cx-11) | 15 | 10.5 | 15 | 15 | 15 | 0 | 0 | 15 | 15 | 15 |
| amounts (g) | Compound (cx-12) | 0 | 0 | 0 | 0 | 0 | 15 | 0 | 0 | 0 | 0 |
| of silane | Compound (cx-13) | 0 | 0 | 0 | 0 | 0 | 0 | 15 | 0 | 0 | 0 |
| compounds, | Compound (cx-21) | 20 | 70.1 | 16.7 | 23.3 | 23.3 | 19.2 | 29.6 | 20 | 16.7 | 23.3 |
| etc. | Compound (cx-31) | 27 | 0 | 18.8 | 17.5 | 17.5 | 14.4 | 22.2 | 27 | 18.8 | 17.5 |
| | Compound (cx-41) | 0 | 0 | 4.2 | 0 | 0 | 0 | 0 | 0 | 4.2 | 0 |
| | Compound (cx-42) | 0 | 0 | 0 | 7.2 | 0 | 0 | 0 | 0 | 0 | 7.2 |
| | Compound (cx-43) | 0 | 0 | 0 | 0 | 7.8 | 6.4 | 9.9 | 0 | 0 | 0 |
| | Compound (cx-51) | 0 | 0 | 2.2 | 0 | 0 | 0 | 0 | 0 | 2.2 | 0 |
| | PGME | 284.3 | 0 | 0 | 262.9 | 281.3 | 255.6 | 321.1 | 284.3 | 0 | 262.9 |
| | PGMEA | 0 | 160 | 0 | 0 | 0 | 0 | 0 | 0 | 0 | 0 |
| | IPA | 0 | 0 | 269.2 | 0 | 0 | 0 | 0 | 0 | 269.2 | 0 |
| | 1% Hydrochloric acid aqueous solution | 30 | 50.9 | 26.7 | 0 | 0 | 0 | 0 | 0 | 0 | 0 |

TABLE 2-continued

| Synthesis Examples<br>Ink repellent agent (C) | | 21<br>(C1-1) | 22<br>(C1-2) | 23<br>(C1-3) | 24<br>(C1-4) | 25<br>(C1-5) | 26<br>(C1-6) | 27<br>(C1-7) | 28<br>(C1-8) | 29<br>(C1-9) | 30<br>(C1-10) |
|---|---|---|---|---|---|---|---|---|---|---|---|
| | 1% Nitric acid aqueous solution | 0 | 0 | 0 | 30.8 | 30.8 | 25.4 | 39.2 | 0 | 0 | 0 |
| | 1% Sodium hydroxide aqueous solution | 0 | 0 | 0 | 0 | 0 | 0 | 0 | 30 | 26.7 | 0 |
| | 1% TMAH solution | 0 | 0 | 0 | 0 | 0 | 0 | 0 | 0 | 0 | 30.8 |
| Charged molar ratios of silane compounds | Compound (cx-11) | 0.13 | 0.06 | 0.14 | 0.13 | 0.13 | 0.00 | 0.00 | 0.13 | 0.14 | 0.13 |
| | Compound (cx-12) | 0.00 | 0.00 | 0.00 | 0.00 | 0.00 | 0.13 | 0.00 | 0.00 | 0.00 | 0.00 |
| | Compound (cx-13) | 0.00 | 0.00 | 0.00 | 0.00 | 0.00 | 0.00 | 0.13 | 0.00 | 0.00 | 0.00 |
| | Compound (cx-21) | 0.39 | 0.94 | 0.34 | 0.45 | 0.45 | 0.45 | 0.45 | 0.39 | 0.34 | 0.45 |
| | Compound (cx-31) | 0.47 | 0.00 | 0.34 | 0.30 | 0.30 | 0.30 | 0.30 | 0.47 | 0.34 | 0.30 |
| | Compound (cx-41) | 0.00 | 0.00 | 0.09 | 0.00 | 0.00 | 0.00 | 0.00 | 0.00 | 0.09 | 0.00 |
| | Compound (cx-42) | 0.00 | 0.00 | 0.00 | 0.12 | 0.00 | 0.00 | 0.00 | 0.00 | 0.00 | 0.12 |
| | Compound (cx-43) | 0.00 | 0.00 | 0.00 | 0.00 | 0.12 | 0.12 | 0.12 | 0.00 | 0.00 | 0.00 |
| | Compound (cx-51) | 0.00 | 0.00 | 0.09 | 0.00 | 0.00 | 0.00 | 0.00 | 0.00 | 0.09 | 0.00 |

Synthesis Example 31

Synthesis of Ink Repellent Agent (C2-1)

Into an autoclave having an internal capacity of 1,000 cm$^3$ and equipped with a stirrer, 415.1 g of MEK, 81.0 g of C6FMA, 18.0 g of MAA, 81.0 g of 2-HEMA, 5.0 g of polymerization initiator V-65 and 4.7 g of n-DM were charged, and while stirring under a nitrogen atmosphere, polymerized at 50° C. for 24 hours, and further heated at 70° C. for 5 hours to inactivate the polymerization initiator to obtain a solution of a copolymer. The copolymer had a number average molecular weight of 5,540 and a mass average molecular weight of 13,200.

Then, into an autoclave having an internal capacity of 300 cm$^3$ and equipped with a stirrer, 130.0 g of the above copolymer solution, 33.5 g of BEI, 0.13 g of DBTDL and 1.5 g of TBQ were charged and while stirring, reacted at 40° C. for 24 hours, to synthesize a crude polymer. To the obtained crude polymer solution, hexane was added for reprecipitation purification, followed by vacuum drying to obtain 65.6 g of ink repellent agent (C2-1).

The number average molecular weight (Mn), the mass average molecular weight (Mw), the content of fluorine atoms, the content of ethylenic double bonds and the acid value of the obtained ink repellent agent (C2-1) are shown in Table 3.

(Preparation of Ink Repellent Agent (C2-2))

As ink repellent agent (C2-2), Megafax RS102 (tradename, manufactured by DIC Corporation, a polymer having repeating units represented by the following formula (C2F), n/m=3 to 4) was prepared.

The number average molecular weight (Mn), the mass average molecular weight (Mw), the content of fluorine atoms, the content of ethylenic double bonds and the acid value of ink repellent agent (C2-2) are shown in Table 3.

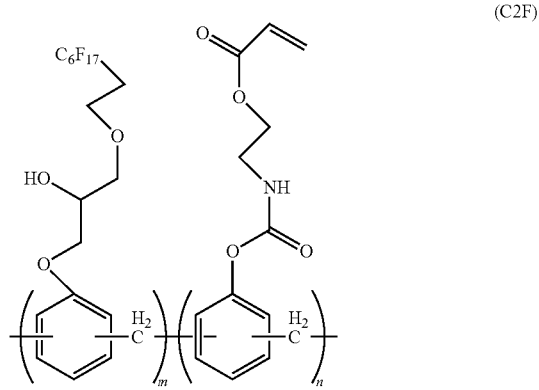

(C2F)

Synthesis Example 32

Synthesis of Ink Repellent Agent (C2-3)

Into an autoclave having an internal capacity of 1,000 cm$^3$ and equipped with a stirrer, 317.5 g of C4a-Cl acrylate, 79.4 g of MAA, 47.7 g of IBMA, 52.94 g of 2-HEMA, 4.6 g of n-DM and 417.7 g of MEK were put, and while stirring under a nitrogen atmosphere, polymerized at 50° C. for 24 hours, and further heated at 70° C. for 5 hours to inactivate the polymerization initiator to obtain a solution of a copolymer. The copolymer had a number average molecular weight of 5,060 and a mass average molecular weight of 8,720. The solid content concentration was measured and found to be 30 wt %.

Then, into an autoclave having an internal capacity of 300 cm$^3$ and equipped with a stirrer, 130.0 g of the above copolymer solution, 3.6 g of A01(0.8 equivalent to hydroxy groups in the copolymer, 0.014 g of DBTDL and 0.18 g of TBQ were charged and while stirring, reacted at 40° C. for 24 hours, to synthesize a crude polymer. To the obtained crude polymer solution, hexane was added for reprecipitation purification, followed by vacuum drying to obtain 35.8 g of ink repellent agent (C2-3).

The number average molecular weight (Mn), the mass average molecular weight (Mw), the content of fluorine atoms, the content of ethylenic double bonds and the acid value of the obtained ink repellent agent (C2-3) are shown in Table 3.

TABLE 3

| Synthesis Examples | 21 | 22 | 23 | 24 | 25 | 26 | 27 | 28 | 29 | 30 | 31 | — | 32 |
|---|---|---|---|---|---|---|---|---|---|---|---|---|---|
| Ink repellent agent (C) | (C1-1) | (C1-2) | (C1-3) | (C1-4) | (C1-5) | (C1-6) | (C1-7) | (C1-8) | (C1-9) | (C1-10) | (C2-1) | (C2-2) | (C2-3) |
| Mn | 1.200 | 1.330 | 1.050 | 1.030 | 1.040 | 950 | 1.010 | 1.330 | 1.280 | 1.360 | 7.540 | 5.700 | 8.000 |
| Mw | 1.310 | 1.560 | 1.200 | 1.150 | 1.170 | 1.090 | 1.130 | 1.520 | 1.490 | 1.650 | 16.200 | 8.800 | 10.600 |
| Content of fluorine atoms (%) | 21.0 | 19.0 | 22.4 | 22.2 | 21.1 | 25.4 | 15.9 | 21.0 | 22.4 | 22.2 | 14.8 | 19.0 | 28.0 |
| Content of C=C (mmol/g) | 3.06 | 0.00 | 2.27 | 2.09 | 1.98 | 1.83 | 2.17 | 3.06 | 2.27 | 2.09 | 3.73 | 2.86 | 0.60 |
| Acid value (mg KOH/g) | — | — | — | — | — | — | — | — | — | — | 35.1 | 0 | 93.3 |

Ex 1: Production of Negative Photosensitive Resin Composition, and Production of Cured Film, Partition Walls A and Partition Walls B (Production of Negative Photosensitive Resin Composition)
1.18 g of the compound (D-1) solution, 1.18 g of the ink repellent agent (C1-1) solution, 14.04 g of the alkali-soluble resin (A1) composition, 9.83 g of A9530, 1.12 g of IR907, 0.98 g of EAB, 70.7 g of PGME, 5.5 g of IPA and 5.5 g of water were put in a 200 cm$^3$ container for stirring, and stirred for 3 hours to produce a negative photosensitive resin composition 1.

(Production of Partition Walls A)
A 10 cm square glass substrate was subjected to ultrasonic cleaning with ethanol for 30 seconds and then to UV/O$^3$ treatment for 5 minutes. For the UV/O$^3$ treatment, PL2001 N-58 (manufactured by Sen Engineering Co., Ltd.) was used as an UV/O$^3$ generating apparatus. The light power (light output) calculated for 254 nm was 10 mW/cm$^2$.

On the surface of the glass substrate after the above cleaning, the negative photosensitive resin composition 1 obtained as described above, was applied by means of a spinner and then, dried on a hot plate at 100° C. for 2 minutes to form a dried film having a film thickness of 2.4 μm. The obtained dried film was subjected to whole surface integrated exposure to UV light of an ultrahigh pressure mercury lamp, of which the exposure power (exposure output) calculated for 365 nm was 25 mW/cm$^2$, via a photomask (exposure amount: 250 mJ/cm$^2$). At the time of exposure, light of 330 nm or less was cut. The photomask used, was one having portions (opening sections-forming portions) capable of forming opening sections of 2.5 cm×5 cm defined by partition walls with a width of 20 μm, and portions (lines-forming portions) capable of forming 15 lines (partition walls) with a width of from 1 to 15 μm and a length of 1.3 cm i.e. portions capable of forming 15 lines (partition walls) with a length of 1.3 cm so that the width gradually increases by 1 μm unit every time starting from 1 μm. Here, the spaced distance between the dried film and the photomask was set to be 50 μm.

Then, the glass substrate provided with a dried film after the exposure treatment, was immersed in a 2.38% tetramethylammonium hydroxide aqueous solution for 40 seconds for development, followed by rinsing with water to remove non-exposed portions and then by drying. Then, it was heated on a hot plate at 230° C. for 60 minutes to obtain partition walls A as a cured film having opening sections corresponding to masking portions with the photomask.

(Production of Partition Walls B)
Partition walls B were produced on an ITO light transmitting electrode of a glass substrate provided with the ITO light transmitting electrode in the same manner as in the production of the above partition walls A except that in the production of the above partition walls A, a light transmitting electrode of ITO (thickness: 150 nm) was formed by a sputtering method on the surface of the glass substrate after cleaning, and the negative photosensitive resin composition 1 obtained as described above was applied on the surface of the light transmitting electrode of the obtained glass substrate provided with the light transmitting electrode by means of a spinner. The obtained partition walls B are ones having the same levels of ink wet-spreadability, ink repellency and resolution as the partition walls A.

(Production of Cured Film)
On the surface of the same glass substrate as in the production of the partition walls A, the negative photosensitive resin composition 1 obtained as described above, was applied by means of a spinner and then, dried on a hot plate at 100° C. for 2 minutes to form a dried film having a film thickness of 2.4 μm. The obtained dried film was subjected to whole surface integrated exposure to UV light of an ultrahigh pressure mercury lamp, of which the exposure power (exposure output) calculated for 365 nm was 25 mW/cm$^2$ (exposure amount: 40 mJ/cm$^2$). At the time of exposure, light of 330 nm or less was cut.

Then, the glass substrate provided with a dried film after the exposure treatment, was immersed in a 0.02% tetramethylammonium hydroxide aqueous solution for 10 seconds, followed by rinsing with water and then by drying. Then, it was heated on a hot plate at 230° C. for 60 minutes to obtain a cured film having no opening sections.

With respect to the obtained negative photosensitive resin composition 1, partition walls A and cured film, the following evaluations were conducted. The evaluation results are shown in Table 4.

(Evaluation 1)
<Thickness of Partition Walls A>
Measured by means of a laser microscope (manufactured by Keyence
Corporation, apparatus name: VK-8500).
<Wet-Spreadability of Ink>
6.25 g of liquid epoxy ME-562 (tradename, manufactured by Nippon Pelnox Corporation), 6.25 g of curing agent HV-562 (tradename, manufactured by Nippon Pelnox Corporation), 33.75 g of 3-butylene glycol diacetate and 3.75 g of 4-butyrolactone were stirred and mixed for one hour by means of a stirrer, and water was added with stirring until the surface tension became 35 mN/m to prepare an ink.

Using an ink jet method, about 20 pL of the ink prepared as described above was applied to opening sections defined by the partition walls A in the glass substrate sample, whereupon by observation by means of super focal depth profile microscope VK-8500 (manufactured by Keyence Corporation), the wet-spreadability of ink in the opening sections defined by the partition walls A was evaluated in accordance with the following standards.

◯ (good): The entire surface of opening sections is wet with ink.

× (no good): Part of opening sections rejects ink.

<Ink Repellency>

The PGMEA contact angle on the upper surface of the partition walls A or cured film obtained as described above was measured and adopted as an evaluation for ink repellency.

By a static drop method, in accordance with JIS R3257 "Method for testing wettability of substrate glass surface", PGMEA droplets were placed at three locations on the upper surface of the partition walls A or cured film, and measurements were made with respect to the respective PGMEA droplets. The droplets were about 2 μL/droplet, and the measurements were conducted at 20° C. The contact angle was obtained as an average value of the three measured values.

<Resolution>

The narrowest line width among lines of partition walls A remained at line-forming portions after development by immersion in a 2.38% tetramethylammonium hydroxide aqueous solution for 40 seconds during the above mentioned production of partition walls A, was taken as the resolution. The unit is μm.

<Storage Stability of Negative Photosensitive Resin Composition>

The negative photosensitive resin composition 1 was stored at room temperature (from 20 to 25° C.) for 20 days. Then, the state (transparent or turbid) of the negative photosensitive resin composition 1 was visually observed, whereupon partition walls A and a cured film (provided that the size of the glass substrate was 7.5 cm square) were produced in the same manner as the above-described partition walls A and cured film. Here, during the production, in the form of a coating film, the presence or absence of a foreign matter on the film surface was observed visually and by a laser microscope.

The outer appearance of the obtained partition walls A and cured film and the presence or absence of a foreign matter on the film surface were observed visually and by a laser microscope, whereby they were compared with the partition walls A and cured film formed in the same manner as above from the negative photosensitive resin composition 1 before the storage (provided that the size of the glass substrate was changed to 7.5 cm square), and evaluated in accordance with the following standards.

◉: Even when the coating film is observed visually or by a laser microscope, no foreign matter is ascertained, and the outer appearance is the same as the partition walls A and cured film formed from the negative photosensitive resin composition before the storage.

◯: When the coating film is observed by a laser microscope, a particulate foreign matter is ascertained.

Δ: When the coating film is visually observed, a particulate foreign matter is ascertained.

×: The negative photosensitive resin composition after the storage gets turbid.

Ex. 2 to 29 and Ex. 31 to 35

A negative photosensitive resin compositions, and partition walls A and a cured film, were produced in the same manner as in Ex. 1 except that the negative photosensitive resin composition was changed to the composition as shown in Tables 4 to 6, and the same evaluations as in Ex. 1 were conducted. The evaluation results are shown in Tables 4 to 6. The ratio of solvent (F) means the ratio of each solvent in the entire amount of the solvent (F). Further, in Ex. 31 and Ex. 35, partition walls B were produced in the same manner as in Ex. 1 on an ITO light transmitting electrode of a glass substrate provided with the ITO light transmitting electrode, by using the negative photosensitive resin composition as shown in Table 6.

TABLE 4

| | Components | Compounds · compositions | Ex. 1 | Ex. 2 | Ex. 3 | Ex. 4 | Ex. 5 | Ex. 6 | Ex. 7 | Ex. 8 | Ex. 9 | Ex. 10 |
|---|---|---|---|---|---|---|---|---|---|---|---|---|
| Negative photosensitive resin composition [g] | (A) | Alkali-soluble resin (A1) composition | 14.04 | 14.48 | 10.63 | 17.55 | 14.17 | 14.43 | 11.13 | 11.29 | 10.48 | 12.44 |
| | | Alkali-soluble resin (A2) composition | — | — | — | — | — | — | — | — | — | — |
| | | Alkali-soluble resin (A3) composition | — | — | — | — | — | — | — | — | — | — |
| | (B) | IR907 | 1.12 | 1.16 | 0.85 | 1.40 | 1.13 | 1.15 | 0.89 | 0.90 | 0.84 | 0.99 |
| | | OXE02 | — | — | — | — | — | — | — | — | — | — |
| | | IR819 | — | — | — | — | — | — | — | — | — | — |
| | | IR369 | — | — | — | — | — | — | — | — | — | — |
| | | EAB | 0.98 | 1.01 | 0.74 | 1.23 | 0.99 | 1.01 | 0.78 | 0.79 | 0.57 | 0.68 |
| | (C) | Ink repellent agent (C1-1) solution | 1.18 | 1.22 | 0.89 | 1.47 | 1.19 | 1.21 | — | — | 0.76 | 0.91 |
| | | Ink repellent agent (C1-2) solution | — | — | — | — | — | — | 0.94 | — | — | — |
| | | Ink repellent agent (C1-3) solution | — | — | — | — | — | 0.63 | — | — | — | — |
| | | Ink repellent agent (C1-4) solution | — | — | — | — | — | — | — | — | — | — |
| | | Ink repellent agent (C1-5) solution | — | — | — | — | — | — | — | — | — | — |
| | | Ink repellent agent (C1-6) solution | — | — | — | — | — | — | — | — | — | — |
| | | Ink repellent agent (C1-7) solution | — | — | — | — | — | — | — | — | — | — |
| | | Ink repellent agent (C1-8) solution | — | — | — | — | — | — | — | — | — | — |

TABLE 4-continued

| Components | | Compounds · compositions | Ex. 1 | Ex. 2 | Ex. 3 | Ex. 4 | Ex. 5 | Ex. 6 | Ex. 7 | Ex. 8 | Ex. 9 | Ex. 10 |
|---|---|---|---|---|---|---|---|---|---|---|---|---|
| | | Ink repellent agent (C1-9) solution | — | — | — | — | — | — | — | — | — | — |
| | | Ink repellent agent (C1-10) solution | — | — | — | — | — | — | — | — | — | — |
| | | Ink repellent agent (C2-1) | — | — | — | — | — | — | — | — | — | — |
| | | Ink repellent agent (C2-2) | — | — | — | — | — | — | — | — | — | — |
| | | Ink repellent agent (C2-3) | — | — | — | — | — | — | — | — | — | — |
| | (D, Dx) | Compound (D-1) solution | 1.18 | — | — | — | — | — | 0.94 | 0.95 | 0.44 | 0.17 |
| | | Compound (D-2) solution | — | 1.22 | — | — | — | — | — | — | — | — |
| | | Compound (D-3) solution | — | — | 0.89 | — | — | — | — | — | — | — |
| | | Compound (D-4) solution | — | — | — | 1.47 | — | — | — | — | — | — |
| | | Compound (D-5) solution | — | — | — | — | 1.19 | — | — | — | — | — |
| | | Compound (D-6) solution | — | — | — | — | — | 1.21 | — | — | — | — |
| | | Compound (D-7) solution | — | — | — | — | — | — | — | — | — | — |
| | | Compound (D-8) solution | — | — | — | — | — | — | — | — | — | — |
| | | Compound (Dx-1) solution | — | — | — | — | — | — | — | — | — | — |
| | | Compound (Dx-2) solution | — | — | — | — | — | — | — | — | — | — |
| | (E) | A9530 | 9.83 | 10.13 | 7.44 | 12.29 | 9.92 | 10.10 | 7.79 | 7.90 | 7.34 | 8.71 |
| | | A9550 | — | — | — | — | — | — | — | — | — | — |
| | | A9300 | — | — | — | — | — | — | — | — | — | — |
| | | A-DPH | — | — | — | — | — | — | — | — | — | — |
| | (F) | PGMEA | — | 67.99 | — | — | — | — | — | 75.63 | 76.77 | 84.10 |
| | | PGME | 70.70 | — | 78.45 | 63.58 | 71.31 | 72.59 | 75.64 | — | — | — |
| | | EDM | — | — | — | — | — | — | — | — | — | — |
| | | IPA | 5.50 | 10.80 | 11.10 | 11.00 | 11.10 | 11.30 | 10.90 | 10.90 | 10.80 | 12.00 |
| | | Water | 5.50 | — | — | — | — | — | — | — | — | — |
| | Solid content concentration [mass %] | | 20 | 21 | 15 | 25 | 20 | 20 | 16 | 16 | 15 | 16 |
| Ratio in solid content [mass %] | | Alkali-soluble resin (A) | 44.7 | 44.7 | 44.7 | 44.7 | 44.7 | 44.7 | 44.7 | 44.8 | 45.3 | 45.4 |
| | | Photopolymerization initiator (B) | 9.6 | 9.6 | 9.6 | 9.6 | 9.6 | 9.6 | 9.6 | 9.6 | 8.7 | 8.7 |
| | | Ink repellent agent (C) | 0.5 | 0.5 | 0.5 | 0.5 | 0.5 | 0.5 | 0.5 | 0.4 | 0.5 | 0.5 |
| | | Compound (D, Dx) | 0.5 | 0.5 | 0.5 | 0.5 | 0.5 | 0.5 | 0.5 | 0.5 | 0.3 | 0.1 |
| | | Crosslinking agent (E) | 44.7 | 44.7 | 44.7 | 44.7 | 44.7 | 44.7 | 44.7 | 44.8 | 45.3 | 45.4 |
| Ratio of solvent (F) [mass %] | | Solvent naphtha | 4.9 | 5.2 | 3.4 | 6.6 | 4.9 | 4.9 | 3.7 | 3.8 | 3.5 | 3.7 |
| | | PGMEA | 0.0 | 81.8 | 0.0 | 0.0 | 0.0 | 0.0 | 0.0 | 84.1 | 84.6 | 84.2 |
| | | PGME | 82.3 | 0.0 | 84.6 | 79.6 | 82.3 | 82.3 | 84.2 | 0.0 | 0.0 | 0.0 |
| | | EDM | 0.0 | 0.0 | 0.0 | 0.0 | 0.0 | 0.0 | 0.0 | 0.0 | 0.0 | 0.0 |
| | | IPA | 6.4 | 13.0 | 12.0 | 13.8 | 12.8 | 12.8 | 12.1 | 12.1 | 11.9 | 12.0 |
| | | Water | 6.4 | 0.0 | 0.0 | 0.0 | 0.0 | 0.0 | 0.0 | 0.0 | 0.0 | 0.0 |
| Evaluations | Cured film-partition walls | Thickness of partition walls [μm] | 2.0 | 2.0 | 2.0 | 2.0 | 2.0 | 2.0 | 2.0 | 2.0 | 3.0 | 3.0 |
| | | Ink repellency (PGMEA contact angle [°]) Partition walls: exposure amount 250 mJ/cm² | 48 | 46 | 46 | 46 | 44 | 46 | 43 | 43 | 47 | 47 |
| | | Cured film: exposure amount 40 mJ/cm² | 40 | 41 | 37 | 40 | 35 | 40 | 36 | 39 | 38 | 35 |
| | | Wet-spreadability of ink | ◯ | ◯ | ◯ | ◯ | ◯ | ◯ | ◯ | ◯ | ◯ | ◯ |
| | | Resolution [μm] | 5 | 7 | 5 | 5 | 3 | 5 | 7 | 2 | 4 | 5 |
| | Negative photosensitive resin composition | Storage stability (20 days) | ⊚ | ⊚ | ⊚ | ⊚ | ⊚ | ⊚ | ⊚ | ⊚ | ⊚ | ⊚ |

TABLE 5

| Components | | Compounds · compositions | Ex.11 | Ex.12 | Ex.13 | Ex.14 | Ex.15 | Ex.16 | Ex.17 | Ex.18 | Ex.19 | Ex.20 |
|---|---|---|---|---|---|---|---|---|---|---|---|---|---|
| Negative photo-sensitive resin composition [g] | (A) | Alkali-soluble resin (A1) composition | 12.98 | 13.10 | 17.23 | 14.04 | 17.55 | — | — | — | — | — |
| | | Alkali-soluble resin (A2) composition | — | — | — | — | — | 21.07 | — | — | — | — |
| | | Alkali-soluble resin (A3) composition | — | — | — | — | — | — | 26.81 | 29.04 | 29.04 | 29.04 |
| | (B) | IR907 | 1.04 | 1.05 | 1.38 | 1.12 | 1.40 | 1.40 | 1.40 | 1.40 | 1.40 | 1.40 |
| | | OXE02 | — | — | — | — | — | — | — | — | — | — |
| | | IR819 | — | — | — | — | — | — | — | — | — | — |
| | | IR369 | — | — | — | — | — | — | — | — | — | — |
| | | EAB | 0.91 | 0.92 | 1.21 | 0.98 | 1.23 | 1.23 | 1.23 | 1.23 | 1.23 | 1.23 |

TABLE 5-continued

| | Components | Compounds · compositions | Ex.11 | Ex.12 | Ex.13 | Ex.14 | Ex.15 | Ex.16 | Ex.17 | Ex.18 | Ex.19 | Ex.20 |
|---|---|---|---|---|---|---|---|---|---|---|---|---|
| | (C) | Ink repellent agent (C1-1) solution | — | — | — | 1.18 | 1.47 | 1.48 | 1.48 | — | — | — |
| | | Ink repellent agent (C1-2) solution | — | — | — | — | — | — | — | — | — | — |
| | | Ink repellent agent (C1-3) solution | — | — | — | — | — | — | — | — | — | — |
| | | Ink repellent agent (C1-4) solution | — | — | — | — | — | — | — | 1.48 | — | — |
| | | Ink repellent agent (C1-5) solution | — | — | — | — | — | — | — | — | 1.48 | — |
| | | Ink repellent agent (C1-6) solution | — | — | — | — | — | — | — | — | — | 1.48 |
| | | Ink repellent agent (C1-7) solution | — | — | — | — | — | — | — | — | — | — |
| | | Ink repellent agent (C1-8) solution | — | — | — | — | — | — | — | — | — | — |
| | | Ink repellent agent (C1-9) solution | — | — | — | — | — | — | — | — | — | — |
| | | Ink repellent agent (C1-10) solution | — | — | — | — | — | — | — | — | — | — |
| | | Ink repellent agent (C2-1) | 1.09 | — | — | — | — | — | — | — | — | — |
| | | Ink repellent agent (C2-2) | — | 1.10 | — | — | — | — | — | — | — | — |
| | | Ink repellent agent (C2-3) | — | — | 1.45 | — | — | — | — | — | — | — |
| | (D, Dx) | Compound (D-1) solution | 1.09 | 1.10 | 1.45 | — | — | 1.48 | 1.48 | 1.48 | 1.48 | 1.48 |
| | | Compound (D-2) solution | — | — | — | — | — | — | — | — | — | — |
| | | Compound (D-3) solution | — | — | — | — | — | — | — | — | — | — |
| | | Compound (D-4) solution | — | — | — | — | — | — | — | — | — | — |
| | | Compound (D-5) solution | — | — | — | — | — | — | — | — | — | — |
| | | Compound (D-6) solution | — | — | — | — | — | — | — | — | — | — |
| | | Compound (D-7) solution | — | — | — | 1.18 | — | — | — | — | — | — |
| | | Compound (D-8) solution | — | — | — | — | 1.47 | — | — | — | — | — |
| | | Compound (Dx-1) solution | — | — | — | — | — | — | — | — | — | — |
| | | Compound (Dx-2) solution | — | — | — | — | — | — | — | — | — | — |
| | (E) | A9530 | 9.09 | 9.17 | 12.06 | 9.83 | 12.29 | 9.83 | 9.83 | — | — | — |
| | | A9550 | — | — | — | — | — | — | — | — | — | — |
| | | A9300 | — | — | — | — | — | — | — | — | — | — |
| | | A-DPH | — | — | — | — | — | — | — | 8.60 | 8.60 | 8.60 |
| | (F) | PGMEA | 81.2 | 76.2 | 67.8 | 76.2 | 69.1 | — | — | — | — | — |
| | | PGME | — | — | — | — | — | 68.03 | 62.28 | 61.28 | 61.28 | 61.28 |
| | | EDM | — | — | — | — | — | — | — | — | — | — |
| | | IPA | 5.65 | 5.40 | 5.40 | 5.50 | 5.50 | 5.50 | 5.50 | 5.50 | 5.50 | 5.50 |
| | | Water | — | — | — | — | — | — | — | — | — | — |
| | Solid content concentration [mass %] | | 18 | 19 | 25 | 25 | 25 | 25 | 25 | 25 | 25 | 25 |
| | Ratio in solid content [mass %] | Alkali-soluble resin (A) | 44.7 | 44.7 | 44.7 | 44.7 | 44.7 | 53.6 | 53.6 | 58.1 | 58.1 | 58.1 |
| | | Photopolymerization initiator (B) | 9.6 | 9.6 | 9.6 | 9.6 | 9.6 | 9.6 | 9.6 | 9.6 | 9.6 | 9.6 |
| | | Ink repellent agent (C) | 0.5 | 0.5 | 0.5 | 0.5 | 0.5 | 0.5 | 0.5 | 0.5 | 0.5 | 0.5 |
| | | Compund (D, Dx) | 0.5 | 0.5 | 0.5 | 0.5 | 0.5 | 0.5 | 0.5 | 0.5 | 0.5 | 0.5 |
| | | Crosslinking agent (E) | 44.7 | 44.7 | 44.7 | 44.7 | 44.7 | 35.7 | 35.7 | 31.3 | 31.3 | 31.3 |
| | Ratio of solvent (F) [mass %] | Solvent naphtha | 4.3 | 4.6 | 6.6 | 4.9 | 4.9 | 7.9 | 0.0 | 0.0 | 0.0 | 0.0 |
| | | PGMEA | 89.5 | 89.1 | 86.5 | 88.7 | 88.7 | 0.0 | 15.1 | 16.4 | 16.4 | 16.4 |
| | | PGME | 0.0 | 0.0 | 0.0 | 0.0 | 0.0 | 85.2 | 78.0 | 76.7 | 76.7 | 76.7 |
| | | EDM | 0.0 | 0.0 | 0.0 | 0.0 | 0.0 | 0.0 | 0.0 | 0.0 | 0.0 | 0.0 |
| | | IPA | 6.2 | 6.3 | 6.9 | 6.4 | 6.4 | 6.9 | 6.9 | 6.9 | 6.9 | 6.9 |
| | | Water | 0.0 | 0.0 | 0.0 | 0.0 | 0.0 | 0.0 | 0.0 | 0.0 | 0.0 | 0.0 |
| Evaluations | Cured film-partition walls | Thickness of partition walls [μm] | 2.0 | 2.0 | 2.0 | 2.0 | 2.0 | 2.0 | 2.0 | 2.0 | 2.0 | 2.0 |
| | | Ink repellency (PGMEA contact angle [°]) Partition walls: exposure amount 250 mJ/cm² | 50 | 49 | 51 | 48 | 46 | 46 | 46 | 47 | 45 | 50 |
| | | Cured film: exposure amount 40 mJ/cm² | 41 | 41 | 42 | 42 | 41 | 40 | 42 | 41 | 43 | 42 |
| | | Wet-spreadability of ink | ◯ | ◯ | ◯ | ◯ | ◯ | ◯ | ◯ | ◯ | ◯ | ◯ |
| | | Resolution [μm] | 8 | 7 | 8 | 6 | 5 | 4 | 3 | 7 | 8 | 7 |
| | Negative photosensitive resin composition | Storage stability (20 days) | ◎ | ◎ | ◎ | ◎ | ◎ | ◎ | ◎ | ◎ | ◎ | ◎ |

TABLE 6

| Components | Compounds · compositions | Ex.21 | Ex.22 | Ex.23 | Ex.24 | Ex.25 | Ex.26 | Ex.27 |
|---|---|---|---|---|---|---|---|---|
| (A) | Alkali-soluble resin (A1) composition | — | — | — | — | 10.53 | — | — |
| | Alkali-soluble resin (A2) composition | — | — | — | — | — | 10.50 | — |
| | Alkali-soluble resin (A3) composition | 29.04 | 29.04 | 29.04 | 29.04 | — | — | 17.55 |
| (B) | IR907 | 1.40 | 1.40 | 1.40 | 1.40 | — | — | — |
| | OXE02 | — | — | — | — | 0.84 | — | — |
| | IR819 | — | — | — | — | — | 0.74 | — |
| | IR369 | — | — | — | — | — | — | 0.89 |
| | EAB | 1.23 | 1.23 | 1.23 | 1.23 | 0.74 | 0.88 | 0.58 |
| (C) | Ink repellent agent (C1-1) solution | — | — | — | — | — | — | — |
| | Ink repellent agent (C1-2) solution | — | — | — | — | — | — | — |
| | Ink repellent agent (C1-3) solution | — | — | — | — | — | — | — |
| | Ink repellent agent (C1-4) solution | — | — | — | — | — | — | — |
| | Ink repellent agent (C1-5) solution | — | 1.48 | 1.48 | 1.48 | — | — | — |
| | Ink repellent agent (C1-6) solution | — | — | — | — | — | — | — |
| | Ink repellent agent (C1-7) solution | 1.48 | — | — | — | — | — | — |
| | Ink repellent agent (C1-8) solution | — | — | — | — | 0.88 | — | — |
| | Ink repellent agent (C1-9) solution | — | — | — | — | — | 0.88 | — |
| | Ink repellent agent (C1-10) solution | — | — | — | — | — | — | 0.89 |
| | Ink repellent agent (C2-1) | — | — | — | — | — | — | — |
| | Ink repellent agent (C2-2) | — | — | — | — | — | — | — |
| | Ink repellent agent (C2-3) | — | — | — | — | — | — | — |
| (D, Dx) | Compound (D-1) solution | 1.48 | — | — | — | 0.89 | — | 0.89 |
| | Compound (D-2) solution | — | 1.48 | — | — | — | — | — |
| | Compound (D-3) solution | — | — | — | — | — | 0.88 | — |
| | Compound (D-4) solution | — | — | — | — | — | — | — |
| | Compound (D-5) solution | — | — | — | — | — | — | — |
| | Compound (D-6) solution | — | — | — | — | — | — | — |
| | Compound (D-7) solution | — | — | 1.48 | — | — | — | — |
| | Compound (D-8) solution | — | — | — | 1.48 | — | — | — |
| | Compound (Dx-1) solution | — | — | — | — | — | — | — |
| | Compound (Dx-2) solution | — | — | — | — | — | — | — |
| (E) | A9530 | — | — | — | — | — | — | — |
| | A9550 | — | — | — | — | 7.39 | — | — |
| | A9300 | — | — | — | — | — | 7.37 | 5.21 |
| | A-DPH | 8.60 | 8.60 | 8.60 | 8.60 | — | — | — |
| (F) | PGMEA | — | — | — | — | — | — | — |
| | PGME | 61.28 | 61.28 | 61.28 | 61.28 | 45.01 | 45.02 | 40.25 |
| | EDM | — | — | — | — | 44.00 | 44.00 | 44.00 |
| | IPA | 5.50 | 5.50 | 5.50 | 5.50 | — | — | — |
| | Water | — | — | — | — | — | — | — |
| | Solid content concentration [mass %] | 25 | 25 | 25 | 25 | 15 | 15 | 15 |
| Ratio in solid content [mass %] | Alkali-soluble resin (A) | 58.1 | 58.1 | 58.1 | 58.1 | 44.8 | 44.6 | 58.6 |
| | Photopolymerization initiator (B) | 9.6 | 9.6 | 9.6 | 9.6 | 9.6 | 9.8 | 8.9 |
| | Ink repellent agent (C) | 0.5 | 0.5 | 0.5 | 0.5 | 0.4 | 0.4 | 0.4 |
| | Compound (D, Dx) | 0.5 | 0.5 | 0.5 | 0.5 | 0.5 | 0.5 | 0.5 |
| | Crosslinking agent (E) | 31.3 | 31.3 | 31.3 | 31.3 | 44.8 | 44.6 | 31.6 |
| Ratio of solvent (F) [mass %] | Solvent naphtha | 0.0 | 0.0 | 0.0 | 0.0 | 3.4 | 3.4 | 0.0 |
| | PGMEA | 16.4 | 16.4 | 16.4 | 16.4 | 0.0 | 0.0 | 8.6 |
| | PGME | 76.7 | 76.7 | 76.7 | 76.7 | 48.8 | 48.8 | 43.7 |
| | EDM | 0.0 | 0.0 | 0.0 | 0.0 | 47.7 | 47.7 | 47.7 |
| | IPA | 6.9 | 6.9 | 6.9 | 6.9 | 0.0 | 0.0 | 0.0 |
| | Water | 0.0 | 0.0 | 0.0 | 0.0 | 0.0 | 0.0 | 0.0 |
| | Thickness of partition walls [μm] | 2.0 | 2.0 | 2.0 | 2.0 | 2.0 | 2.0 | 2.0 |
| Cured film-partition walls | Ink repellency (PGMEA contact angle [°]) Partition walls: exposure amount 250 mJ/cm² | 43 | 45 | 46 | 45 | 45 | 46 | 46 |
| | Cured film: exposure amount 40 mJ/cm² | 37 | 41 | 42 | 42 | 41 | 40 | 42 |
| | Wet-spreadability of ink | ○ | ○ | ○ | ○ | ○ | ○ | ○ |
| | Resolution [μm] | 5 | 7 | 3 | 4 | 4 | 3 | 2 |
| Negative photosensitive resin composition | Storage stability (20 days) | ⊚ | ⊚ | ⊚ | ⊚ | ⊚ | ⊚ | ⊚ |
| (A) | Alkali-soluble resin (A1) composition | — | 12.61 | 14.12 | 14.14 | 13.10 | 13.22 | 14.12 |
| | Alkali-soluble resin (A2) composition | 13.66 | — | — | — | — | — | — |
| | Alkali-soluble resin (A3) composition | — | — | — | — | — | — | — |
| (B) | IR907 | 0.74 | 0.74 | 1.13 | 1.13 | 1.05 | 1.05 | 1.13 |
| | OXE02 | — | — | — | — | — | — | — |
| | IR819 | — | — | — | — | — | — | — |
| | IR369 | — | — | — | — | — | — | — |
| | EAB | 0.88 | 0.88 | 0.99 | 0.99 | 0.92 | 0.93 | 0.99 |
| (C) | Ink repellent agent (C1-1) solution | — | 0.88 | 1.19 | — | 1.10 | 1.11 | — |
| | Ink repellent agent (C1-2) solution | — | — | — | — | — | — | — |
| | Ink repellent agent (C1-3) solution | 0.88 | — | — | 0.79 | — | — | — |
| | Ink repellent agent (C1-4) solution | — | — | — | — | — | — | — |
| | Ink repellent agent (C1-5) solution | — | — | — | — | — | — | — |

TABLE 6-continued

| Components | Compounds · compositions | | Ex.21 | Ex.22 | Ex.23 | Ex.24 | Ex.25 | Ex.26 | Ex.27 |
|---|---|---|---|---|---|---|---|---|---|
| | Ink repellent agent (C1-6) solution | | — | — | — | — | — | — | — |
| | Ink repellent agent (C1-7) solution | | — | — | — | — | — | — | — |
| | Ink repellent agent (C1-8) solution | | — | — | — | — | — | — | — |
| | Ink repellent agent (C1-9) solution | | — | — | — | — | — | — | — |
| | Ink repellent agent (C1-10) solution | | — | — | — | — | — | — | — |
| | Ink repellent agent (C2-1) | | — | — | — | — | — | — | — |
| | Ink repellent agent (C2-2) | | — | — | — | — | — | — | — |
| | Ink repellent agent (C2-3) | | — | — | — | — | — | — | — |
| (D, Dx) | Compound (D-1) solution | | 0.88 | 0.88 | — | — | — | — | — |
| | Compound (D-2) solution | | — | — | — | — | — | — | — |
| | Compound (D-3) solution | | — | — | — | — | — | — | — |
| | Compound (D-4) solution | | — | — | — | — | — | — | — |
| | Compound (D-5) solution | | — | — | — | — | — | — | — |
| | Compound (D-6) solution | | — | — | — | — | — | — | — |
| | Compound (D-7) solution | | — | — | — | — | — | — | — |
| | Compound (D-8) solution | | — | — | — | — | — | — | — |
| | Compound (Dx-1) solution | | — | — | — | — | 1.10 | — | — |
| | Compound (Dx-2) solution | | — | — | — | — | — | 1.11 | — |
| (E) | A9530 | | — | — | 9.88 | 9.90 | 9.17 | 9.25 | 9.93 |
| | A9550 | | — | — | — | — | — | — | — |
| | A9300 | | 5.16 | 5.89 | — | — | — | — | — |
| | A-DPH | | — | — | — | — | — | — | — |
| (F) | PGMEA | | — | — | — | — | — | — | — |
| | PGME | | 44.07 | 44.39 | 71.7 | 72.0 | 70.8 | 71.4 | 71.7 |
| | EDM | | 44.00 | 44.00 | — | — | 10.8 | 10.9 | — |
| | IPA | | — | — | 5.50 | 5.50 | — | — | 5.50 |
| | Water | | — | — | 5.50 | 5.50 | — | — | 5.50 |
| Solid content concentration [mass %] | | | 15 | 15 | 20 | 20 | 19 | 19 | 20 |
| Ratio in solid content [mass %] | Alkali-soluble resin (A) | | 58.0 | 53.6 | 44.9 | 45.0 | 44.7 | 44.7 | 45.2 |
| | Photopolymerization initiator (B) | | 9.8 | 9.8 | 9.6 | 9.6 | 9.6 | 9.6 | 9.7 |
| | Ink repellent agent (C) | | 0.4 | 0.4 | 0.5 | 0.4 | 0.5 | 0.5 | 0.0 |
| | Compound (D, Dx) | | 0.5 | 0.5 | 0.0 | 0.0 | 0.5 | 0.5 | 0.0 |
| | Crosslinking agent (E) | | 31.3 | 35.7 | 44.9 | 45.0 | 44.7 | 44.7 | 45.2 |
| Ratio of solvent (F) [mass %] | Solvent naphtha | | 4.5 | 4.1 | 4.9 | 4.9 | 4.6 | 4.6 | 4.8 |
| | PGMEA | | 0.0 | 0.0 | 0.0 | 0.0 | 0.0 | 0.0 | 0.0 |
| | PGME | | 47.8 | 48.2 | 82.5 | 82.5 | 82.8 | 82.8 | 82.7 |
| | EDM | | 47.7 | 47.7 | 0.0 | 0.0 | 12.6 | 12.6 | 0.0 |
| | IPA | | 0.0 | 0.0 | 6.3 | 6.3 | 0.0 | 0.0 | 6.3 |
| | Water | | 0.0 | 0.0 | 6.3 | 6.3 | 0.0 | 0.0 | 6.3 |
| Cured film-partition walls | Thickness of partition walls [μm] | | 2.0 | 2.0 | 2.0 | 2.0 | 2.0 | 2.0 | 2.0 |
| | Ink repellency (PGMEA contact angle [°]) | Partition walls: exposure amount 250 mJ/cm$^2$ | 48 | 47 | 48 | 48 | 45 | 44 | <10 |
| | | Cured film: exposure amount 40 mJ/cm$^2$ | 43 | 43 | 15 | <10 | 10 | 10 | <10 |
| | Wet-spreadability of ink | | ○ | ○ | X | X | ○ | ○ | ○ |
| | Resolution [μm] | | 2 | 2 | 15 | 11 | 7 | 11 | 30 |
| Negative photosensitive resin composition | Storage stability (20 days) | | ⊚ | ⊚ | ⊚ | ⊚ | ⊚ | ⊚ | ⊚ |

In Ex. 1 to 29 wherein a negative photosensitive resin composition of the present invention using the compound (D) was used, both the upper surface of cured film which was cured at a low exposure amount, and the upper surface of partition walls which was cured at a usual exposure amount, had excellent ink repellency, and wet-spreadability of ink was excellent. Further, the storage stability of the composition was also good.

On the other hand, in Ex. 31 and 32 wherein a negative photosensitive resin composition not using the compound (D) was used, although the upper surface of partition walls cured at a usual exposure amount had sufficient ink repellency, the wet-spreadability of ink was inadequate, and the ink repellency of the upper surface of cured film which was cured at a low exposure amount, was also inadequate.

Further, in Ex. 33 and 34 wherein a negative photosensitive resin composition using the compound (Dx) instead of the compound (D) was used, although the wet-spreadability of ink was excellent, and the upper surface of partition walls cured at a usual exposure amount had sufficient ink repellency, the ink repellency of the upper surface of cured film which was cured at a low exposure amount, was inadequate.

Further, in Ex. 35 wherein a negative photosensitive resin composition not using an ink repellent agent (C) and a compound (D), was used, although the wet-spreadability of ink was excellent, both the upper surface of cured film which was cured at a low exposure amount and the upper surface of partition walls which was cured at a usual exposure amount, had substantially no ink repellency.

From these results, it is evident that the negative photosensitive resin composition of the present invention can be cured sufficiently even at a low exposure amount and can impart good ink repellency to the upper surface of the cured resin film, particularly of the partition walls, and further, it makes it possible that in opening sections defined by the partition walls, the ink repellent agent is less likely to remain, and the ink uniformly wet-spreads without unevenness, even without UV/O$_3$ irradiation treatment.

Further, partition walls as a cured resin film obtained in each of Ex. 1 to Ex. 29 and Ex. 33, are excellent in ink repellency at the upper surface of the partition walls and at the same time have good adhesion to the substrate, and thus, they are regarded as a cured resin film in the first embodiment of the present invention which is excellent in resolution.

On the other hand, partition walls as a cured resin film obtained in each of Ex. 31, 32 and 34, are, although excellent in ink repellency at the upper surface of the partition walls, inadequate in adhesion to the substrate, whereby no adequate resolution is obtainable. Partition walls as a cured resin film obtained in Ex. 35 are inadequate in ink repellency at the upper surface of the partition walls, and further inadequate in adhesion to the substrate, whereby no adequate resolution is obtainable.

With respect to partition walls B prepared in the above Ex. 1 as an Example for a cured resin film in the first embodiment of the present invention and partition walls B prepared in Ex. 31 and Ex. 35 as Comparative Examples, an XPS analysis of the surface and an analysis in the thickness direction by TOF-SIMS were carried out as follows.

[Surface Analysis of Partition Walls B]

The surface of partition walls B prepared in each of Ex. 1, Ex. 31 and Ex. 35 was analyzed by XPS. The apparatus and conditions used for the analysis by XPS were as follows.

Apparatus: Quantera-SXM manufactured by Ulvac-Phi, Inc.
X-ray source: Al Kα
X-ray beam size: about 20 μm in diameter
Measurement area: about 20 μm in diameter
Detection angle: 45° from the sample surface
Measured peaks: F1s, C1s
Measurement time (as acquired time): within 5 minutes
Pass energy: 224 eV
Analytical software: MultiPak From the analytical results, the value [F/C$^-$] of the ratio of the fluorine atom concentration to the carbon atom concentration at the surface of partition walls B was calculated, and the result is shown in the following Table 7.

TABLE 7

|  | Ex. 1 | Ex. 31 | Ex. 35 |
|---|---|---|---|
| [F/C] | 0.43 | 0.39 | Less than detectable limit |

In the partition walls B of Example prepared in Ex. 1 (prepared at an exposure amount of 250 mJ/cm$^2$, hereinafter the same applies in Ex. 31 and Ex. 35), [F/C$^-$] was 0.43. On the other hand, in the partition walls B prepared in Ex. 31 by using a negative photosensitive resin composition of Comparative Example not containing a compound (D), [F/C$^-$] was 0.39. In the partition walls B prepared in Ex. 35, no fluorine atom was detected. The ink repellency was 48° in Ex. 1, 48° in Ex. 31 and at most 10° in Ex. 35, as evaluation of partition walls A equal to partition walls B. At most 10° in Ex. 35 is considered to be attributable to the fact that [F/C$^-$] was inadequate.

[Interior Analysis of Partition Walls]

Partition walls B prepared in Ex. 1 and Ex. 31 were analyzed in the thickness direction by TOF-SIMS. Here, in each case, the thickness of partition walls B measured by a laser microscope (manufactured by Keyence Corporation, apparatus name: VK-8500) was 2.0 μm. The apparatus and conditions used for the analysis by TOF-SIMS were as follows.

Figure 6:
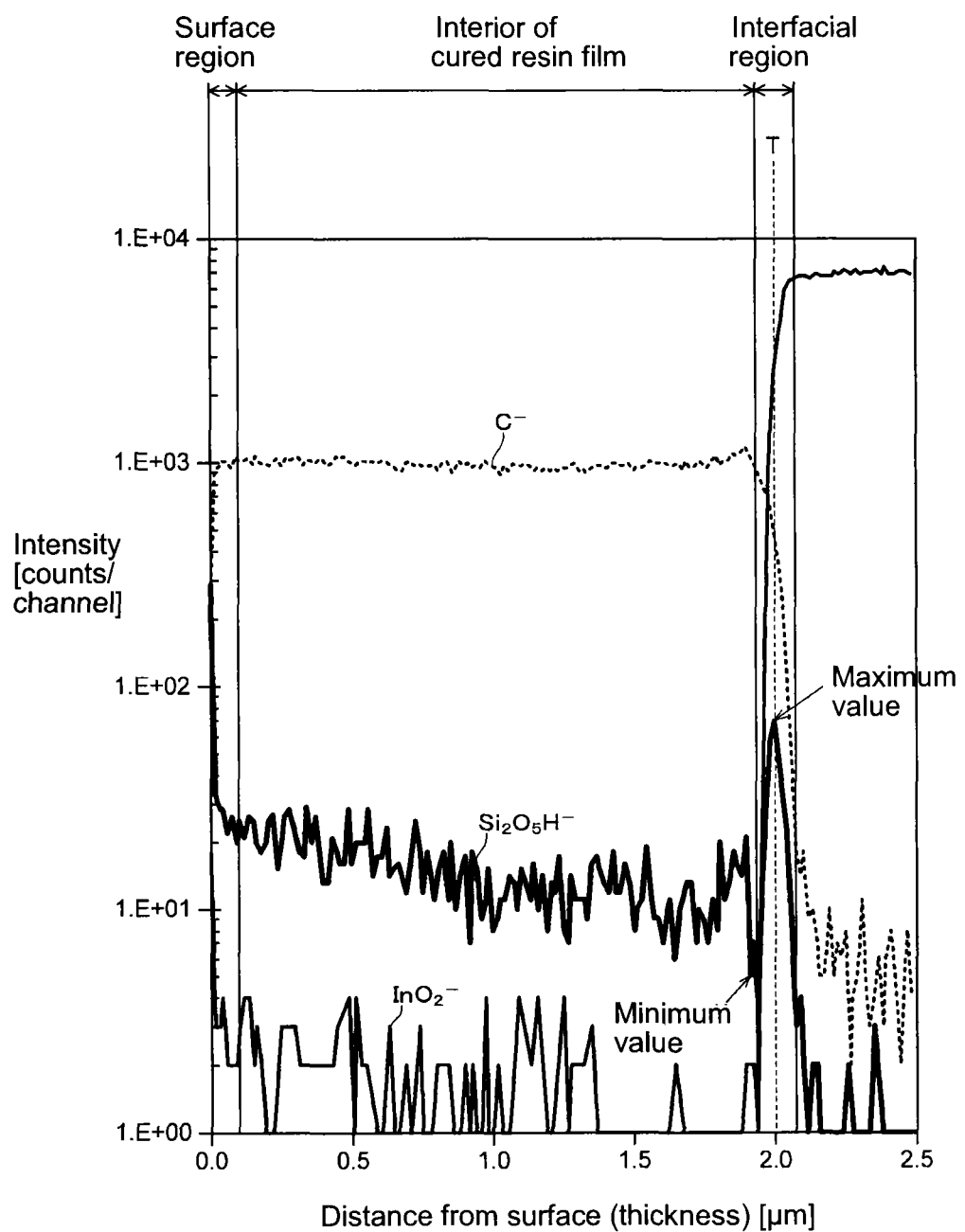
FIG. 6 is a chart showing the results of a mass analysis in the thickness direction by TOF-SIMS, of a cured resin film in a Comparative Example.
Figure 7:
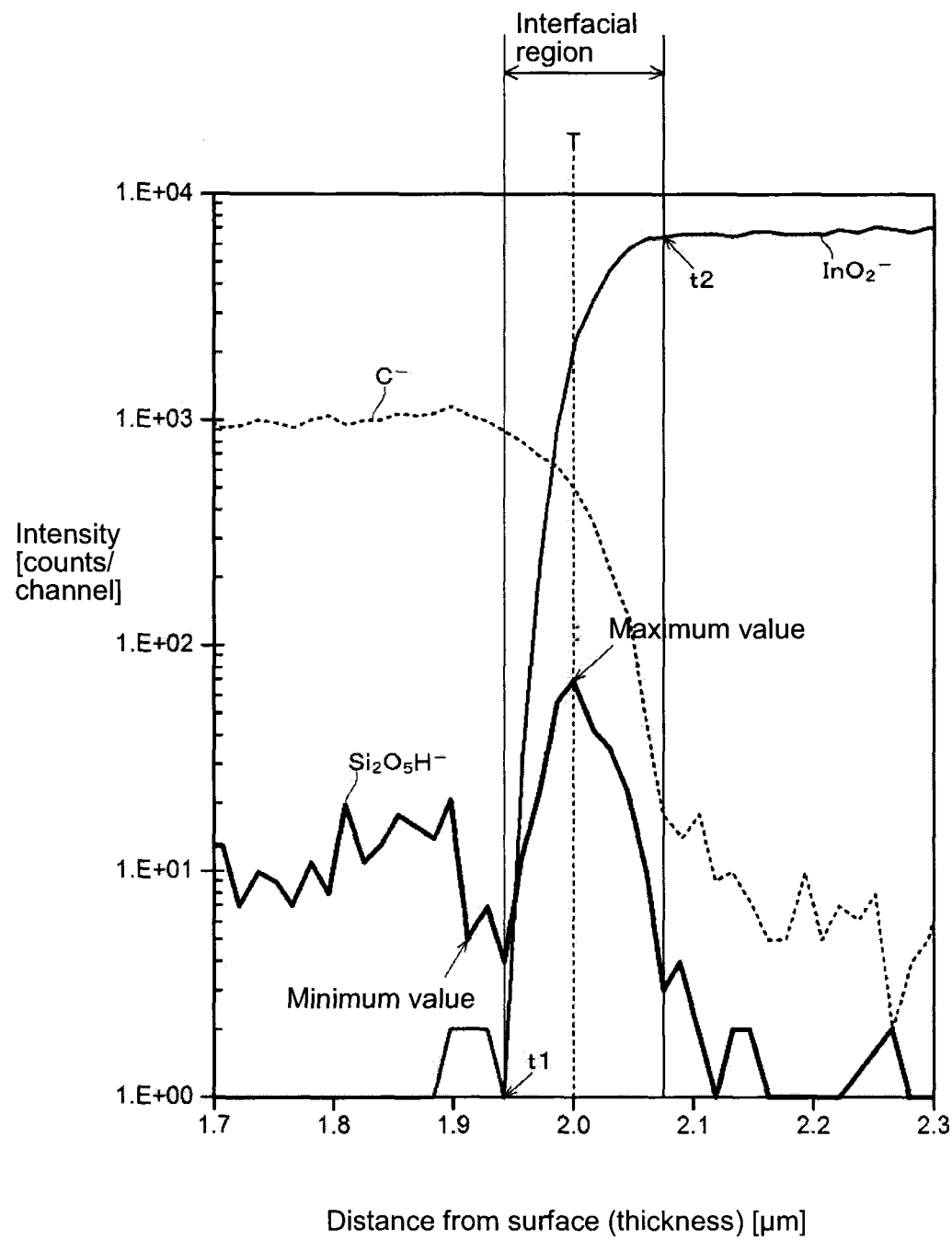
FIG. 7 is a chart showing, as enlarged, the vicinity of the interface between the cured resin film and the substrate in the analytical results in FIG. 6.

Apparatus: TOF. SIMS5 manufactured by ION-TOF
Primary ion species: Bi$_3^{++}$
Accelerating voltage for primary ions: 25 kV
Current value of primary ions: 0.2 pA (@10 kHz)
Raster size of primary ions: 150×150 μm$^2$
Bunching of primary ions: yes
Sputtering ion species: Ar cluster (about Ar$_{1500}$)
Accelerating voltage for sputtering ions: 10 kV
Current value of sputtering ions: 8.5 nA (@10 kHz)
Raster size of sputtering ions: 450×450 μm$^2$
Mass number of C$^-$ secondary ions: 12
Mass number of Si$_2$O$_5$H$^-$ secondary ions: 137
Mass number of InO$_2^-$ secondary ions: 147
Plot spacing of the profile in depth direction: Plotting at 8 or more points within the region of the interfacial region The analytical results by TOF-SIMS are shown in FIGS. 1 and 2 with respect to Ex. 1 and in FIGS. 6 and 7 with respect to Ex. 31. FIGS. 1 and 2 are as described above. FIG. 6 shows the results of a mass analysis in the entire thickness direction of partition walls B (cured resin film) in Ex. 31, and FIG. 7 is a chart showing, as enlarged, the vicinity of the interface to the substrate.

FIGS. 1 and 6 show the intensity profiles of the respective secondary ions as well as distinction of the surface region of the cured resin film (i.e. the region from the surface (0) to a thickness of 0.1 μm), the interfacial region to the substrate as defined in the above (2) and the interior of the cured resin film excluding the surface region and the interfacial region. FIGS. 2 and 7 show the intensity profiles of the respective secondary ions as well as the position of the interface (T) and the interfacial region, in detail.

Shown in Table 8 are the position of the interface, the interfacial region, the position (distance from the surface) at which the intensity profile of Si$_2$O$_5$H$^-$ shows the maximum value within the thickness range excluding the surface region of the cured resin film, the maximum value of Si$_2$O$_5$H$^-$, the minimum value of Si$_2$O$_5$H$^-$ in the interior of the cured resin film and its position (distance from the surface), and [maximum value of Si$_2$O$_5$H$^-$/minimum value of Si$_2$O$_5$H$^+$], in the partition walls B in Ex. 1 and Ex. 31, as obtainable from the above analytical results by TOF-SIMS. Further, the average value in intensity of C$^-$, the average value in intensity of Si$_2$O$_5$H$^-$ and [average value of Si$_2$O$_5$H$^-$/average value of C$^-$], in the interior of the cured resin film are shown in Table 8.

TABLE 8

|  |  | Ex. 1 | Ex. 31 |
|---|---|---|---|
| Position of interface (distance from surface) = Film thickness of cured film | [μm] | 2.00 | 2.00 |

TABLE 8-continued

|  |  | Ex. 1 | Ex. 31 |
|---|---|---|---|
| Interfacial region (distance range from surface) | [μm] | 1.90-2.06 | 1.94-2.07 |
| Maximum value of $Si_2O_5H^-$ in thickness range excluding surface region of cured resin film | Distance from surface [μm] | 1.99 | 2.00 |
|  | Value [counts/channel] | 103 | 70 |
| Minimum value of $Si_2O_5H^-$ in interior of cured resin film | Distance from surface [μm] | 1.89 | 1.91 |
|  | Value [counts/channel] | 32 | 5 |
| [Maximum value of $Si_2O_5H^-$/minimum value of $Si_2O_5H^-$] |  | 3.2 | 14.0 |
| Average value of $C^-$ in interior of cured resin film (counts/channel) |  | 967 | 976 |
| Average value of $Si_2O_5H^-$ in interior of cured resin film (counts/channel) |  | 53 | 15 |
| [Average value of $Si_2O_5H^-$/ average value of $C^-$] |  | 0.055 | 0.015 |

Further, as mentioned above, as evaluation of partition walls A equal to partition walls B, the resolution of partition walls in Ex. 1 was 5 μm, while the resolution of partition walls in Ex. 31 was 15 μm. The cause for the decrease in the resolution in Ex. 31 is considered to be such that [Maximum value of $Si_2O_5H^-$/minimum value of $Si_2O_5H^-$] of the partition walls in Ex. 31 is so large as exceeding 10, and the difference in abundance of the Si component is large between the interior of the cured resin film and the interfacial region to the substrate of the cured resin film. Namely, it is considered that the decrease in the resolution is caused by cohesion failure at the interfacial region to the substrate of the cured resin film.

INDUSTRIAL APPLICABILITY

The negative photosensitive resin of the present invention is useful as a composition for e.g. forming partition walls at the time of carrying out pattern printing by an IJ method for optical elements such as an organic EL element, a color filter for a liquid crystal element and an organic TFT array, etc.

The partition walls of the present invention are useful in an organic EL element as partition walls (banks) for pattern printing an organic layer such as a luminescent layer by an IJ method, or in a liquid crystal element as partition walls for pattern printing a color filter by an IJ method (such partition walls may serve also as a black matrix (BM)).

The partition walls of the present invention are further useful in an organic TFT array as partition walls for pattern printing a conductive pattern or a semiconductor pattern by an IJ method.

The partition walls of the present invention are useful, for example, as partition walls for pattern printing an organic semiconductor layer constituting a channel layer of TFT, a gate electrode, a source electrode, a drain electrode, a gate wiring and a source wiring by an IJ method.

This application is a continuation of PCT Application No. PCT/JP2013/079310 filed on Oct. 29, 2013, which is based upon and claims the benefit of priority from Japanese Patent Application No. 2012-239880 filed on Oct. 31, 2012. The contents of those applications are incorporated herein by reference in their entireties.

REFERENCE SYMBOLS

1: substrate, 21: coating film, 22: dried film, 23: exposed film, 23A: exposed portion, 23B: non-exposed portion, 4: partition wall, 4A: ink repellent layer, 5: opening section, 31: masking portion, 30: photomask, 9: ink jet head, 10: ink, 11: dot, 12: optical element

What is claimed is:

1. A cured resin film formed on a substrate and characterized in that
   in a composition analysis by an X-ray photoelectron spectroscopy (XPS), the ratio of the concentration of fluorine atoms to the concentration of carbon atoms at the surface of the cured resin film i.e. [F/C] is at least 0.1,
   in a mass analysis in the thickness direction of the cured resin film by a time-of-flight secondary ion mass spectrometry (TOF-SIMS) using Ar cluster as sputtering ions, the intensity profile of $Si_2O_5H^-$ has the maximum value in intensity in the interfacial region to the substrate as defined in the following (2) in the thickness range excluding the surface region of the cured resin film as defined in the following (1), and the ratio of the above maximum value in intensity to the minimum value in intensity in the thickness range excluding the above surface region and the above interfacial region i.e. [maximum value of $Si_2O_5H^-$/minimum value of $Si_2O_5H^-$] is more than 1 and at most 10, and
   in the above mass analysis, the ratio of the average value in intensity of $Si_2O_5H^-$ to the average value in intensity of $C^-$ in the thickness range excluding the surface region of the above cured resin film and the interfacial region to the above substrate i.e. [average value of $Si_2O_5H^-$/average value of $C^-$] is at least 0.001:
   (1) the surface region of the above cured resin film is a region beginning at the surface of the above cured resin film and extending to a 100 nm position towards the substrate side from said surface,
   (2) the interfacial region of the above cured resin film to the above substrate is a region beginning at the position from the above cured resin film surface, of the rising start point of intensity of secondary ions of the main component or a specific component of the above substrate and extending to the position from the above cured resin film surface, of the rising terminal point of intensity of secondary ions of the main component or a specific component of the above substrate, in the mass analysis in the thickness direction in TOF-SIMS.

2. Partition walls formed to partition a substrate surface into a plurality of compartments for forming dots and characterized by being made of the cured resin film as defined in claim 1.

3. An optical element having partition walls located between a plurality of dots and their adjacent dots on a substrate surface and characterized in that said partition walls are formed of the partition walls as defined in claim 2.

4. The optical element according to claim 3, wherein the dots are formed by an ink jet method.

5. A negative photosensitive resin composition characterized by comprising
(A) an alkali-soluble resin or alkali-soluble monomer, which has a photo-curability,
(B) a photopolymerization initiator,
(C) an ink repellent agent having fluorine atoms, and
(D) a compound which is a partially hydrolyzed condensate of a hydrolysable silane compound mixture (M1) containing a hydrolysable silane compound having a mercapto group and a hydrolysable group and/or a hydrolysable silane compound having a group with an ethylenic double bond and a hydrolysable group, and which contains no fluorine atom.

6. The negative photosensitive resin composition according to claim 5, wherein the content of fluorine atoms in the ink repellent agent (C) is from 1 to 40 mass %.

7. The negative photosensitive resin composition according to claim 5, wherein the ink repellent agent (C) is a partially hydrolyzed condensate of a hydrolysable silane compound mixture (M2) containing a hydrolysable silane compound having a fluoroalkylene group and/or a fluoroalkyl group and a hydrolysable group.

8. The negative photosensitive resin composition according to claim 7, wherein the hydrolysable silane compound mixture (M2) contains a hydrolysable silane compound having four hydrolysable groups bonded to silicon atoms.

9. The negative photosensitive resin composition according to claim 5, which further contains a cross-linking agent (E) having at least 2 ethylenic double bonds per molecule and having no acidic group.

10. The negative photosensitive resin composition according to claim 5, which further contains a solvent (F).

11. A cured resin film characterized in that it is formed by using the negative photosensitive resin composition as defined in claim 5.

12. The cured resin film according to claim 11 formed on a substrate and characterized in that in a composition analysis by an X-ray photoelectron spectroscopy (XPS), the ratio of the concentration of fluorine atoms to the concentration of carbon atoms at the surface of the cured resin film i.e. [F/C] is at least 0.1, in a mass analysis in the thickness direction of the cured resin film by a time-of-flight secondary ion mass spectrometry (TOF-SIMS) using Ar cluster as sputtering ions, the intensity profile of $Si_2O_5H^-$ has the maximum value in intensity in the interfacial region to the substrate as defined in the following (2) in the thickness range excluding the surface region of the cured resin film as defined in the following (1), and the ratio of the above maximum value in intensity to the minimum value in intensity in the thickness range excluding the above surface region and the above interfacial region i.e. [maximum value of $Si_2O_5H^-$/minimum value of $Si_2O_5H^-$] is more than 1 and at most 10, and in the above mass analysis, the ratio of the average value in intensity of $Si_2O_5H^-$ to the average value in intensity of $C^-$ in the thickness range excluding the surface region of the above cured resin film and the interfacial region to the above substrate i.e. [average value of $Si_2O_5H^-$/average value of $C^-$] is at least 0.001:

(1) the surface region of the above cured resin film is a region beginning at the surface of the above cured resin film and extending to a 100 nm position towards the substrate side from said surface, (2) the interfacial region of the above cured resin film to the above substrate is a region beginning at the position from the above cured resin film surface, of the rising start point of intensity of secondary ions of the main component or a specific component of the above substrate and extending to the position from the above cured resin film surface, of the rising terminal point of intensity of secondary ions of the main component or a specific component of the above substrate, in the mass analysis in the thickness direction in TOF-SIMS.

* * * * *